(12) United States Patent
Mitsui et al.

(10) Patent No.: US 9,012,762 B2
(45) Date of Patent: Apr. 21, 2015

(54) PHOTOELECTRIC CONVERSION ELEMENT AND IMAGING DEVICE

(71) Applicant: FUJIFILM Corporation, Minato-Ku, Tokyo (JP)

(72) Inventors: Tetsuro Mitsui, Kanagawa (JP); Kimiatsu Nomura, Kanagawa (JP); Mitsumasa Hamano, Kanagawa (JP); Katsuyuki Yofu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 166 days.

(21) Appl. No.: 13/674,989

(22) Filed: Nov. 13, 2012

(65) Prior Publication Data

US 2013/0069047 A1    Mar. 21, 2013

Related U.S. Application Data

(62) Division of application No. 12/399,417, filed on Mar. 6, 2009, now Pat. No. 8,338,691.

(30) Foreign Application Priority Data

Mar. 7, 2008 (JP) ................. 2008-058406
Sep. 29, 2008 (JP) ................. 2008-251878
Feb. 23, 2009 (JP) ................. 2009-039376

(51) Int. Cl.
| H01L 31/00 | (2006.01) |
|---|---|
| H01L 31/042 | (2014.01) |
| H01L 51/00 | (2006.01) |
| B82Y 10/00 | (2011.01) |
| H01L 27/30 | (2006.01) |
| H01L 51/42 | (2006.01) |

(52) U.S. Cl.
CPC .......... *H01L 51/0032* (2013.01); *B82Y 10/00* (2013.01); *H01L 27/307* (2013.01); *H01L 51/0046* (2013.01); *H01L 51/0047* (2013.01); *H01L 51/0059* (2013.01); *H01L 51/0072* (2013.01); *H01L 51/424* (2013.01); *H01L 51/4253* (2013.01)

(58) Field of Classification Search
CPC ..... H01L 51/0026; H01L 31/00; H01L 35/24; B82Y 10/00
USPC .......... 313/512, 504, 506; 257/291; 428/690, 428/704, 917; 136/243, 244, 249, 263
See application file for complete search history.

(56) References Cited

U.S. PATENT DOCUMENTS

| 5,965,875 A | 10/1999 | Merrill | |
|---|---|---|---|
| 2004/0150333 A1* | 8/2004 | Tsutsui | 313/512 |
| 2006/0054987 A1 | 3/2006 | Nii | |
| 2006/0071253 A1* | 4/2006 | Nii | 257/291 |

FOREIGN PATENT DOCUMENTS

| JP | 2002-76391 A | 3/2002 |
|---|---|---|
| JP | 2003-332551 A | 11/2003 |
| JP | 2006-100508 A | 4/2006 |
| JP | 2006-100766 A | 4/2006 |
| JP | 2007-123707 A | 5/2007 |

OTHER PUBLICATIONS

I. Kaulach, Magnetic field influence on photovoltaic effect of PMMA doped with dimethylaminobenzylidene 1,3-indandione and fullerene C60 derivative, 2005, Solid State Physics, 5, 3-11.*
Kaulach, I. et., al. "Magnetic field influence on photovoltaic effect of PMMA doped with dimethylaminobenzylidene 1,3-indandione and fullerene C60 derivative", Latvian Journal of Physics and Technical Science, 2005, No. 5, pp. 3-11.
Office Action dated May 10, 2011 in Japanese Application No. JP 2009-039376.
Office Action dated Jun. 14, 2011 in Japanese Application No. JP 2010-291379.
Office Action dated Nov. 1, 2011 in Japanese Application No. JP 2010-291379.
Office Action dated Nov. 8, 2011 in Japanese Application No. JP 2009-039376.
Office Action dated Nov. 2, 2010 in Japanese Application No. JP 2009-039376.

* cited by examiner

*Primary Examiner* — Monique Peets
(74) *Attorney, Agent, or Firm* — Sughrue Mion, PLLC

(57) ABSTRACT

A photoelectric conversion element is provided and includes: an electrically conductive thin layer; an organic photoelectric conversion layer; and a transparent electrically conductive thin layer. The organic photoelectric conversion layer contains: a compound represented by formula (I); and a fullerene or a fullerene derivative.

Formula (I):

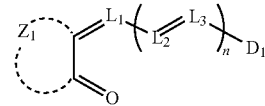

In the formula, $Z_1$ represents an atomic group necessary for forming a 5- or 6-membered ring, $L_1$, $L_2$ and $L_3$ each independently represents an unsubstituted methine group or a substituted methine group, $D_1$ represents an atomic group, and n represents an integer of 0 or more.

3 Claims, 14 Drawing Sheets

PHOTOELECTRIC CONVERSION ELEMENT AND IMAGING DEVICE

This is a Divisional application of U.S. application Ser. No. 12/399,417 filed Mar. 6, 2009, which claims priority under 35 U.S.C. §119, from Japanese Patent Application Nos. 2008-058406, 2008-251878, and 2009-039376, filed Mar. 7, 2008, Sep. 29, 2008, and Feb. 23, 2009, respectively, the entire disclosures of which are herein incorporated by reference.

BACKGROUND OF THE INVENTION

1. Field of the Invention

The present invention relates to a photoelectric conversion element and provides a photoelectric conversion element with high S/N and high response speed by specifying the materials and structures.

2. Description of Related Art

Conventional visible light sensors in general are a device fabricated by forming a photoelectric conversion site through, for example, formation of PN junction in a semiconductor such as Si. As for the solid-state imaging device, there is widely used a flat light-receiving device where photoelectric conversion sites are two-dimensionally arrayed in a semiconductor to form pixels and a signal generated by photoelectric conversion in each pixel is charge-transferred and read out according to a CCD or CMOS format. The method for realizing a color solid-state imaging device is generally fabrication of a structure where on the light incident surface side of the flat image-receiving device, a color filter transmitting only light at a specific wavelength is disposed for color separation. In particular, a single-plate sensor in which color filters transmitting blue light, green light and red light, respectively, are regularly disposed on each of two-dimensionally arrayed pixels is well known as a system widely used at present in a digital camera and the like.

In this system, since the color filter transmits only light at a limited wavelength, untransmitted light is not utilized and the light utilization efficiency is bad. Also, in recent years, amid the advance in fabrication of a multipixel device, the pixel size and in turn, the area of a photodiode part become small and this brings about problems of reduction in the aperture ratio and reduction in the light collection efficiency.

In order to solve these problems, there may be considered a system where photoelectric conversion parts capable of detecting light at different wavelengths are stacked in a longitudinal direction. As regards such a system, for example, U.S. Pat. No. 5,965,875 discloses a sensor utilizing wavelength dependency of the absorption coefficient of Si, where a vertical stacked structure is formed and the colors are separated by the difference in the depth, and JP-A-2003-332551 discloses a sensor by a stacked structure using an organic photoelectric conversion layer. However, the system by the difference in the depth direction of Si is originally disadvantageous in that the color separation is poor, because the absorption range is overlapped among respective portions and the spectroscopic property is bad. As for other methods to solve the problems, a structure where a photoelectric conversion layer by amorphous silicon or an organic photoelectric conversion layer is formed on a signal reading substrate is known as a technique for raising the aperture ratio.

Heretofore, several examples have been known for a photoelectric conversion element, an imaging device, a photosensor and a solar cell each using an organic photoelectric conversion layer. A high photoelectric conversion efficiency and a low dark current are a problem in particular, and as to the improvement method in this respect, there are disclosed, for example, introduction of a pn-junction or introduction of a bulk-heterostructure for the former and introduction of a blocking layer for the latter.

In an attempt to raise the photoelectric conversion efficiency by the introduction of pn-junction or bulk-heterostructure, an increase in the dark current often becomes a problem. Also, the degree of improvement in the photoelectric conversion efficiency differs depending on the combination of materials and in some cases, the ratio of light-signal amount/dark time noise does not increase from before introduction of the structure above. In the case of employing the method above, what materials are combined is important and in particular, when reduction in the dark time noise is intended, this is difficult to achieve by already reported combinations of materials.

Furthermore, the kind of the material used and the layer structure are not only one of main factors for the photoelectric conversion efficiency (exciton dissociation efficiency, charge transport property) and dark current (e.g., amount of dark time carrier) but also a governing factor for the signal responsivity, though this is scarcely mentioned in past reports. In use as a solid-state imaging device, all of high photoelectric conversion efficiency, low dark current and high response speed need to be satisfied, but there has not been specifically disclosed what an organic photoelectric conversion material or a device structure satisfies this requirement.

A photoelectric conversion layer containing fullerenes is described in JP-A-2007-123707, but only by fullerenes, it is impossible to satisfy all of the above-described high photoelectric conversion efficiency, low dark current and high response speed. Also, JP-A-2002-076391 describes a solar cell using a bulk-heterostructure layer including a plurality of organic semiconductors, with at least one organic semiconductor being a crystal grain, where, however, disclosure on dark current and high-speed response is not found and application or the like to a photoelectric conversion element for imaging devices is neither described nor suggested.

SUMMARY OF THE INVENTION

An object of the present invention is to provide an organic photoelectric conversion layer exhibiting high photoelectric conversion efficiency, low dark current and high-speed responsivity, and a photoelectric conversion element and a solid-state imaging device each using the layer.

In an organic photoelectric conversion element, for realizing high photoelectric conversion efficiency, low dark current and high-speed responsivity, the organic photoelectric conversion layer used preferably satisfies the following requirements.

1. In terms of high efficiency and high-speed response, the signal charge after dissociation of an exciton needs to be swiftly transmitted to both electrodes without loss. High mobility and high charge transport ability with a small number of carrier trapping sites are necessary.

2. In terms of high photoelectric conversion efficiency, it is preferred that the exciton stabilizing energy is small and the exciton can be swiftly dissociated by the effect of an externally applied electric field or an electric field generated in the inside by pn-junction or the like (high exciton dissociation efficiency).

3. In order to reduce as much a carrier generated in the inside at dark time as possible, it is preferred to select the intermediate level in the inside and select a layer structure and a material that allow the presence of less impurities working out to one of causes thereof.

4. In the case of stacking a plurality of layers, an energy level matching with the adjacent layer is required and if an energetic barrier is formed, this inhibits charge transport.

In the case of forming the organic photoelectric conversion layer by a vapor deposition method, the decomposition temperature is preferably higher than the temperature allowing for vapor deposition, because the thermal decomposition during vapor deposition can be suppressed. The coating method is advantageous in that the layer can be formed without subjecting to limitation by the decomposition above and a low cost can be realized, but layer formation by a vapor deposition method is preferred because uniform layer formation is easy and possible mixing of impurities can be reduced.

The present inventors have made intensive studies, as a result, the following selection and combination of materials have been found as techniques ensuring that the requirements above are satisfied and high photoelectric conversion efficiency, low dark current and high responsivity can be realized.

The above-described object can be attained by the following means.

(1) A photoelectric conversion element comprising:
an electrically conductive thin layer;
an organic photoelectric conversion layer; and
a transparent electrically conductive thin layer,
wherein the organic photoelectric conversion layer contains: a compound represented by formula (I); and a fullerene or a fullerene derivative:

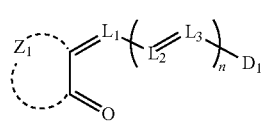

Formula (I)

wherein $Z_1$ represents an atomic group necessary for forming a 5- or 6-membered ring, $L_1$, $L_2$ and $L_3$ each independently represents an unsubstituted methine group or a substituted methine group, $D_1$ represents an atomic group, and n represents an integer of 0 or more.

(2) The photoelectric conversion element as described in (1), wherein the electrically conductive thin layer, the organic photoelectric conversion layer, and the transparent electrically conductive thin layer are stacked in this order.

(3) The photoelectric conversion element as described in (1) or (2), wherein $D_1$ is represented by formula (II):

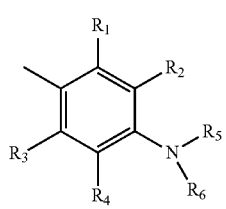

Formula (II)

wherein $R_1$ to $R_6$ each independently represents a hydrogen atom or a substituent, provided that $R_1$ and $R_2$, $R_3$ and $R_4$, $R_5$ and $R_6$, $R_2$ and $R_5$, or $R_4$ and $R_6$ may combine together to form a ring.

(4) The photoelectric conversion element as described in (1), (2), or (3), wherein $D_1$ is represented by formula (III):

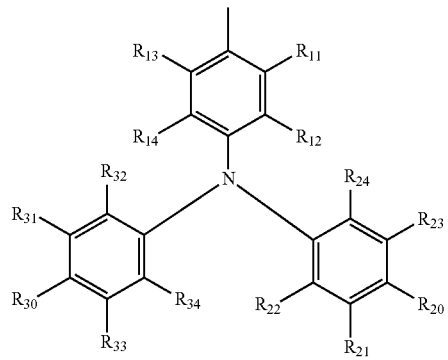

Formula (III)

wherein $R_{11}$ to $R_{14}$, $R_{20}$ to $R_{24}$ and $R_{30}$ to $R_{34}$ each independently represents a hydrogen atom or a substituent, and $R_{11}$ to $R_{14}$, $R_{20}$ to $R_{24}$ or $R_{30}$ to $R_{34}$ may combine together to form a ring.

(5) The photoelectric conversion element as described in (1), (2), or (3), wherein $D_1$ is represented by formula (VII):

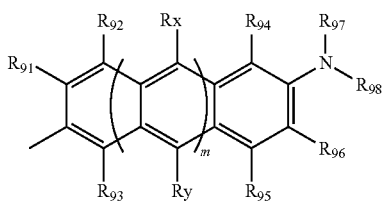

Formula (VII)

wherein $R_{91}$ to $R_{98}$ each independently represents a hydrogen atom or a substituent; m represents an integer of 0 or more; Rx and Ry each independently represents a hydrogen atom or a substituent and when m is an integer of 2 or more, Rx's or Ry's bonded to respective 6-membered rings may be different substituents; $R_{91}$ and $R_{92}$, $R_{92}$ and Rx, Rx and $R_{94}$, $R_{94}$ and $R_{97}$, $R_{93}$ and Ry, Ry and $R_{95}$, $R_{95}$ and $R_{96}$, or $R_{97}$ and $R_{98}$ may independently combine together to form a ring; and the bonding part to $L_3$ (when n is 0, to $L_1$) may be at the position of $R_{91}$, $R_{92}$ or $R_{93}$ and in this case, the substituent or hydrogen atom corresponding to $R_{91}$, $R_{92}$ or $R_{93}$ may be bonded to the site denoted as the bonding part to $L_3$ in formula (VII) and adjacent R's may combine together to form a ring.

(6) The photoelectric conversion element as described in (1), (2), (3), or (5), wherein $R_{97}$ and $R_{98}$ each independently represents a phenyl group which may be substituted.

(7) The photoelectric conversion element as described in any one of (1) to (6), wherein the ring formed by $Z_1$ is represented by formula (IV):

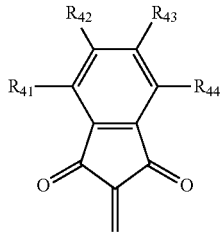

Formula (IV)

wherein $R_{41}$ to $R_{44}$ each independently represents a hydrogen atom or a substituent.

(8) The photoelectric conversion element as described in any one of (1) to (7), wherein the ring formed by $Z_1$ is represented by formula (V):

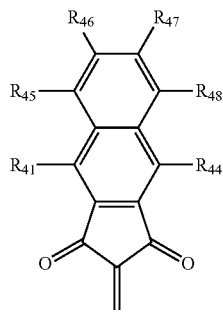

Formula (V)

wherein $R_{41}$, $R_{44}$ and $R_{45}$ to $R_{48}$ each independently represents a hydrogen atom or a substituent.

(9) The photoelectric conversion element as described in any one of (1) to (6), wherein the ring formed by $Z_1$ is represented by formula (VI):

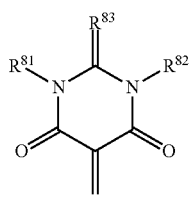

Formula (VI)

wherein $R_{81}$ and $R_{82}$ each independently represents a hydrogen atom or a substituent, and $R_{83}$ represents an oxygen atom, a sulfur atom or a substituent.

(10) The photoelectric conversion element as described in (9), wherein $R_{81}$ and $R_{82}$ each independently represents an alkyl group.

(11) The photoelectric conversion element as described in (9) or (10), wherein $R_{83}$ represents an oxygen atom or a sulfur atom.

(12) The photoelectric conversion element as described in any one of (1) to (11), wherein $L_1$, $L_2$ and $L_3$ each is an unsubstituted methine group.

(13) The photoelectric conversion element as described in any one of (1) to (12), wherein n in formula (I) is 0.

(14) A photoelectric conversion element comprising:
an electrically conductive thin layer;
an organic photoelectric conversion layer; and
a transparent electrically conductive thin layer, in this order,
wherein the organic photoelectric conversion layer contains a compound having a nonplanar structure and a fullerene or a fullerene derivative.

(15) The photoelectric conversion element as described in (14), wherein the compound having a nonplanar structure is the compound represented by formula (I) in (1) to (13).

(16) The photoelectric conversion element as described in any one of (1) to (15), wherein the fullerene is $C_{60}$.

(17) A photoelectric conversion element containing a film having a bulk-heterostructure formed in a state of the compound in any one of (1) to (16) and a fullerene or fullerene derivative being mixed (bulk-heterostructure).

(18) The photoelectric conversion element as described in (17), wherein the ratio of the fullerene or fullerene derivative to the compound is 50% (by mol) or more.

(19) The photoelectric conversion element as described in (17) or (18), wherein the ratio of the fullerene or fullerene derivative to the compound is 100% (by mol) or more.

(20) The photoelectric conversion element as described in any one of (17) to (19), wherein the ratio of the fullerene or fullerene derivative to the compound is 300% (by mol) or more.

(21) The photoelectric conversion element as described in any one of (1) to (20), wherein the organic photoelectric conversion layer is formed by a vacuum vapor deposition method.

(22) The photoelectric conversion element as described in any one of (1) to (21), wherein the transparent electrically conductive thin layer is a second electrode layer and light is incident into the organic photoelectric conversion layer from above the second electrode layer.

(23) The photoelectric conversion element as described in (22), wherein the transparent electrically conductive thin layer includes a transparent electrically conductive oxide.

(24) The photoelectric conversion element as described in any one of (1) to (23), wherein the transparent electrically conductive thin layer is formed directly on the organic photoelectric conversion layer.

(25) The photoelectric conversion element as described in any one of (1) to (24), wherein an electric field of $10^{-4}$ V/cm to $1 \times 10^7$ V/cm is applied between electrodes of the photoelectric conversion element.

(26) An imaging device containing a photoelectric conversion element described in any one of (1) to (25).

BRIEF DESCRIPTION OF THE DRAWINGS

The features of the invention will appear more fully upon consideration of the exemplary embodiments of the inventions, which are schematically set forth in the drawings, in which.

Figure 1:
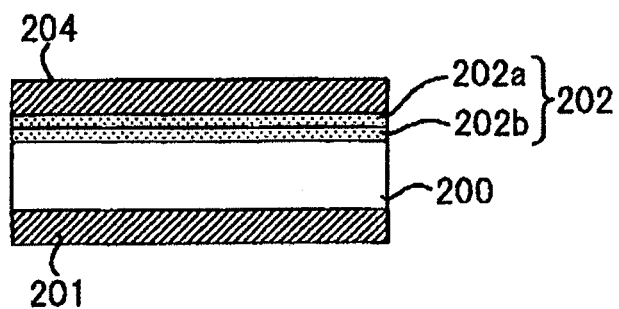
FIG. 1 is a schematic cross-sectional view showing one example of a photoelectric conversion element having a charge-blocking layer according to one exemplary embodiment.

200 Photoelectric conversion layer
204 Electrode
180 Transparent substrate
190 Pixel electrode
192 (192a to 192c) Electron-blocking layers having a three-layer structure
203 (203a to 203c) Hole-blocking layers having a three-layer structure
300 Counter electrode
11 Lower electrode
12 Photoelectric conversion layer
13 Upper electrode

DETAILED DESCRIPTION OF THE
EXEMPLARY EMBODIMENTS

According to an exemplary embodiment of the present invention, an organic photoelectric conversion element ensuring high photoelectric conversion efficiency, low dark current and high-speed responsivity, and an imaging device containing the photoelectric conversion element, can be obtained.

An exemplary embodiment of the present invention is a photoelectric conversion element having stacked therein, in order, an electrically conductive thin layer, an organic photoelectric conversion layer comprising at least one material, and a transparent electrically conductive thin layer, wherein the organic photoelectric conversion layer contains a compound represented by formula (I) and a fullerene or a fullerene derivative.

Substituents W used in the present invention are described below.

Examples of the substituent W include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may also be called a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($-B(OH)_2$), a phosphato group ($-OPO(OH)_2$), a sulfato group ($-OSO_3H$) and other known substituents.

More specifically, W represents, for example, the following (1) to (48):

(1) a halogen atom,
   such as fluorine atom, chlorine atom, bromine atom and iodine atom,
(2) an alkyl group,
   specifically a linear, branched or cyclic, substituted or unsubstituted alkyl group, the alkyl group including, for example, (2-a) to (2-e):
(2-a) an alkyl group,
   preferably an alkyl group having a carbon number of 1 to 30 (e.g., methyl, ethyl, n-propyl, isopropyl, tert-butyl, n-octyl, eicosyl, 2-chloroethyl, 2-cyanoethyl, 2-ethylhexyl),
(2-b) a cycloalkyl group,
   preferably a substituted or unsubstituted cycloalkyl group having a carbon number of 3 to 30 (e.g., cyclohexyl, cyclopentyl, 4-n-dodecylcyclohexyl),
(2-c) a bicycloalkyl group,
   preferably a substituted or unsubstituted bicycloalkyl group having a carbon number of 5 to 30 (e.g., bicyclo[1,2,2]heptan-2-yl, bicyclo[2,2,2]octan-3-yl),
(2-d) a tricycloalkyl group,
   preferably a substituted or unsubstituted tricycloalkyl group having a carbon number of 7 to 30 (e.g., 1-adamantyl), and
(2-e) a polycyclic cycloalkyl group having many ring structures,
   here, the alkyl group in the substituent described below (for example, the alkyl group in an alkylthio group) means an alkyl group having such a concept but also includes an alkenyl group and an alkynyl group,
(3) an alkenyl group,
   specifically a linear, branched or cyclic, substituted or unsubstituted alkenyl group, the alkenyl group including (3-a) to (3-c):
(3-a) an alkenyl group,
   preferably a substituted or unsubstituted alkenyl group having a carbon number of 2 to 30 (e.g., vinyl, allyl, prenyl, geranyl, oleyl),
(3-b) a cycloalkenyl group,
   preferably a substituted or unsubstituted cycloalkenyl group having a carbon number of 3 to 30 (e.g., 2-cyclopenten-1-yl, 2-cyclohexen-1-yl), and
(3-c) a bicycloalkenyl group,
   specifically a substituted or unsubstituted bicycloalkenyl group, preferably a substituted or unsubstituted bicycloalkenyl group having a carbon number of 5 to 30 (e.g., bicyclo[2,2,1]hept-2-en-1-yl, bicyclo[2,2,2]oct-2-en-4-yl)], (4) an alkynyl group,
preferably a substituted or unsubstituted alkynyl group having a carbon number of 2 to 30 (e.g., ethynyl, propargyl, trimethylsilylethynyl), (5) an aryl group,
preferably a substituted or unsubstituted aryl group having a carbon number of 6 to 30 (e.g., phenyl, p-tolyl, naphthyl, m-chlorophenyl, o-hexadecanoylaminophenyl, ferrocenyl), (6) a heterocyclic group,
preferably a monovalent group obtained by removing one hydrogen atom from a 5- or 6-membered substituted or unsubstituted, aromatic or non-aromatic heterocyclic compound, more preferably a 5- or 6-membered aromatic heterocyclic group having a carbon number of 2 to 50 (e.g., 2-furyl, 2-thienyl, 2-pyrimidinyl, 2-benzothiazolyl; the heterocyclic group may also be a cationic heterocyclic group such as 1-methyl-2-pyridinio and 1-methyl-2-quinolinio), (7) a cyano group, (8) a hydroxy group, (9) a nitro group,

(10) a carboxyl group,

(11) an alkoxy group,
preferably a substituted or unsubstituted alkoxy group having a carbon number of 1 to 30 (e.g., methoxy, ethoxy, isopropoxy, tert-butoxy, n-octyloxy, 2-methoxyethoxy),

(12) an aryloxy group,
preferably a substituted or unsubstituted aryloxy group having a carbon number of 6 to 30 (e.g., phenoxy, 2-methylphenoxy, 4-tert-butylphenoxy, 3-nitrophenoxy, 2-tetradecanoylaminophenoxy),

(13) a silyloxy group,
preferably a silyloxy group having a carbon number of 3 to 20 (e.g., trimethylsilyloxy, tert-butyldimethylsilyloxy),

(14) a heterocyclic oxy group,
preferably a substituted or unsubstituted heterocyclic oxy group having a carbon number of 2 to 30 (e.g., 1-phenyltetrazol-5-oxy, 2-tetrahydropyranyloxy),

(15) an acyloxy group,
preferably a formyloxy group, a substituted or unsubstituted alkylcarbonyloxy group having a carbon number of 2 to 30, or a substituted or unsubstituted arylcarbonyloxy group having a carbon number of 6 to 30 (e.g., formyloxy, acetyloxy, pivaloyloxy, stearoyloxy, benzoyloxy, p-methoxyphenylcarbonyloxy),

(16) a carbamoyloxy group,
preferably a substituted or unsubstituted carbamoyloxy group having a carbon number of 1 to 30 (e.g., N,N-dimethylcarbamoyloxy, N,N-diethylcarbamoyloxy, morpholinocarbonyloxy, N, N-di-n-octylaminocarbonyloxy, N-n-octylcarbamoyloxy),

(17) an alkoxycarbonyloxy group,
preferably a substituted or unsubstituted alkoxycarbonyloxy group having a carbon number of 2 to 30 (e.g., methoxycarbonyloxy, ethoxycarbonyloxy, tert-butoxycarbonyloxy, n-octylcarbonyloxy),

(18) an aryloxycarbonyloxy group,
preferably a substituted or unsubstituted aryloxycarbonyloxy group having a carbon number of 7 to 30 (e.g., phenoxycarbonyloxy, p-methoxyphenoxycarbonyloxy, p-n-hexadecyloxyphenoxycarbonyloxy),

(19) an amino group,
preferably an amino group, a substituted or unsubstituted alkylamino group having a carbon number of 1 to 30, a substituted or unsubstituted anilino group having a carbon number of 6 to 30 (e.g., amino, methylamino, dimethylamino, anilino, N-methyl-anilino, diphenylamino)

(20) an ammonio group,
preferably an ammonio group or an ammonio group substituted by a substituted or unsubstituted alkyl, aryl or heterocyclic group having a carbon number of 1 to 30 (e.g., trimethylammonio, triethylammonio, diphenylmethylammonio),

(21) an acylamino group,
preferably a formylamino group, a substituted or unsubstituted alkylcarbonylamino group having a carbon number of 1 to 30, or a substituted or unsubstituted arylcarbonylamino group having a carbon number of 6 to 30 (e.g., formylamino, acetylamino, pivaloylamino, lauroylamino, benzoylamino, 3,4,5-tri-n-octyloxyphenylcarbonylamino),

(22) an aminocarbonylamino group,
preferably a substituted or unsubstituted aminocarbonylamino group having a carbon number of 1 to 30 (e.g., carbamoylamino, N,N-dimethylaminocarbonylamino, N, N-diethylaminocarbonylamino, morpholinocarbonylamino),

(23) an alkoxycarbonylamino group,
preferably a substituted or unsubstituted alkoxycarbonylamino group having a carbon number of 2 to 30 (e.g., methoxycarbonylamino, ethoxycarbonylamino, tert-butoxycarbonylamino, n-octadecyloxycarbonylamino, N-methylmethoxycarbonylamino),

(24) an aryloxycarbonylamino group,
preferably a substituted or unsubstituted aryloxycarbonylamino group having a carbon number of 7 to 30 (e.g., phenoxycarbonylamino, p-chlorophenoxycarbonylamino, m-n-octyloxyphenoxycarbonylamino),

(25) a sulfamoylamino group,
preferably a substituted or unsubstituted sulfamoylamino group having a carbon number of 0 to 30 (e.g., sulfamoylamino, N,N-dimethylaminosulfonylamino, N-n-octylaminosulfonylamino),

(26) an alkyl- or aryl-sulfonylamino group,
preferably a substituted or unsubstituted alkylsulfonylamino group having a carbon number of 1 to 30, or a substituted or unsubstituted arylsulfonylamino group having a carbon number of 6 to (e.g., methylsulfonylamino, butylsulfonylamino, phenylsulfonylamino, 2,3,5-trichlorophenylsulfonylamino, p-methylphenylsulfonylamino),

(27) a mercapto group,

(28) an alkylthio group,
preferably a substituted or unsubstituted alkylthio group having a carbon number of 1 to 30 (e.g., methylthio, ethylthio, n-hexadecylthio),

(29) an arylthio group,
preferably a substituted or unsubstituted arylthio group having a carbon number of 6 to 30 (e.g., phenylthio, p-chlorophenylthio, m-methoxyphenylthio),

(30) a heterocyclic thio group,
preferably a substituted or unsubstituted heterocyclic thio group having a carbon number of 2 to 30 (e.g., 2-benzothiazolylthio, 1-phenyltetrazol-5-ylthio),

(31) a sulfamoyl group,
preferably a substituted or unsubstituted sulfamoyl group having a carbon number of 0 to 30 (e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl),

(32) a sulfo group,

(33) an alkyl- or aryl-sulfinyl group,
preferably a substituted or unsubstituted alkylsulfinyl group having a carbon number of 1 to 30, or a substituted or unsubstituted arylsulfinyl group having a carbon number of 6 to 30 (e.g., methylsulfinyl, ethylsulfinyl, phenylsulfinyl, p-methylphenylsulfinyl),

(34) an alkyl- or aryl-sulfonyl group, preferably a substituted or unsubstituted alkylsulfonyl group having a carbon number of 1 to 30, or a substituted or unsubstituted arylsulfonyl group having a carbon number of 6 to 30 (e.g., methylsulfonyl, ethylsulfonyl, phenylsulfonyl, p-methylphenylsulfonyl),

(35) an acyl group, preferably a formyl group, a substituted or unsubstituted alkylcarbonyl group having a carbon number of 2 to 30, a substituted or unsubstituted arylcarbonyl group having a carbon number of 7 to 30, or a substituted or unsubstituted heterocyclic carbonyl group having a carbon number of 4 to 30 and being bonded to a carbonyl group through a carbon atom (e.g., acetyl, pivaloyl, 2-chloroacetyl, stearoyl, benzoyl, p-n-octyloxyphenylcarbonyl, 2-pyridylcarbonyl, 2-furylcarbonyl),

(36) an aryloxycarbonyl group, preferably a substituted or unsubstituted aryloxycarbonyl group having a carbon number of 7 to 30 (e.g., phenoxycarbonyl, o-chlorophenoxycarbonyl, m-nitrophenoxycarbonyl, p-tert-butylphenoxycarbonyl),

(37) an alkoxycarbonyl group, preferably a substituted or unsubstituted alkoxycarbonyl group having a carbon number of 2 to 30 (e.g., methoxycarbonyl, ethoxycarbonyl, tert-butoxycarbonyl, n-octadecyloxycarbonyl),

(38) a carbamoyl group, preferably a substituted or unsubstituted carbamoyl group having a carbon number of 1 to 30 (e.g., carbamoyl, N-methylcarbamoyl, N,N-dimethylcarbamoyl, N,N-di-n-octylcarbamoyl, N-(methylsulfonyl)carbamoyl),

(39) an aryl or heterocyclic azo group, preferably a substituted or unsubstituted arylazo group having a carbon number of 6 to 30, or a substituted or unsubstituted heterocyclic azo group having a carbon number of 3 to 30 (e.g., phenylazo, p-chlorophenylazo, 5-ethylthio-1,3,4-thiadiazol-2-ylazo),

(40) an imido group, preferably N-succinimido or N-phthalimido,

(41) a phosphino group, preferably a substituted or unsubstituted phosphino group having a carbon number of 2 to 30 (e.g., dimethylphosphino, diphenylphosphino, methylphenoxyphosphino), (42) a phosphinyl group, preferably a substituted or unsubstituted phosphinyl group having a carbon number of 2 to 30 (e.g., phosphinyl, dioctyloxyphosphinyl, diethoxyphosphinyl),

(43) a phosphinyloxy group, preferably a substituted or unsubstituted phosphinyloxy group having a carbon number of 2 to 30 (e.g., diphenoxyphosphinyloxy, dioctyloxyphosphinyloxy),

(44) a phosphinylamino group, preferably a substituted or unsubstituted phosphinylamino group having a carbon number of 2 to 30 (e.g., dimethoxyphosphinylamino, dimethylaminophosphinylamino),

(45) a phospho group,

(46) a silyl group, preferably a substituted or unsubstituted silyl group having a carbon number of 3 to 30 (e.g., trimethylsilyl, triethylsilyl, triisopropylsilyl, tert-butyldimethylsilyl, phenyldimethylsilyl),

(47) a hydrazino group, preferably a substituted or unsubstituted hydrazino group having a carbon number of 0 to 30 (e.g., trimethylhydrazino), or

(48) a ureido group, preferably a substituted or unsubstituted ureido group having a carbon number of 0 to 30 (e.g., N,N-dimethylureido).

Also, two W's may form a ring in cooperation. The ring formed includes an aromatic or non-aromatic hydrocarbon, a heterocyclic ring, and a polycyclic condensed ring formed by the combination of these rings. Examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

Among these substituents W, those having a hydrogen atom may be deprived of the hydrogen atom and further substituted by the above-described group. Examples of such a substituent include a —$CONHSO_2$— group (sulfonylcarbamoyl group or carbonylsulfamoyl group), a —CONHCO— group (carbonylcarbamoyl group) and an —$SO_2NHSO_2$— group (sulfonylsulfamoyl group). Specific examples thereof include an alkylcarbonylaminosulfonyl group (e.g., acetylaminosulfonyl), an arylcarbonylaminosulfonyl group (e.g., benzoylaminosulfonyl), an alkylsulfonylaminocarbonyl group (e.g., methylsulfonylaminocarbonyl) and an arylsulfonylaminocarbonyl group (e.g., p-methylphenylsulfonylaminocarbonyl).

A compound represented by formula (I) for use in the present invention is described in detail below.

In formula (I), $Z_1$ represents an atomic group necessary for forming a 5- or 6-membered ring, $L_1$, $L_2$ and $L_3$ each represents an unsubstituted methine group or a substituted methine group, $D_1$ represents an atomic group, and n represents an integer of 0 or more.

$Z_1$ represents an atomic group necessary for forming a 5- or 6-membered ring. The ring formed is preferably a ring which is usually used as an acidic nucleus in a merocyanine dye, and specific examples thereof include the followings:

(a) a 1,3-dicarbonyl nucleus, such as 1,3-indanedione nucleus, 1,3-cyclohexanedione, 5,5-dimethyl-1,3-cyclohexanedione and 1,3-dioxane-4,6-dione, (b) a pyrazolinone nucleus, such as 1-phenyl-2-pyrazolin-5-one, 3-methyl-1-phenyl-2-pyrazolin-5-one and 1-(2-benzothiazoyl)-3-methyl-2-pyrazolin-5-one, (c) an isoxazolinone nucleus, such as 3-phenyl-2-isoxazolin-5-one and 3-methyl-2-isoxazolin-5-one, (d) an oxyindole nucleus, such as 1-alkyl-2,3-dihydro-2-oxyindole, (e) a 2,4,6-triketohexahydropyrimidine nucleus, such as barbituric acid, 2-thiobarbituric acid and a derivative thereof; examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocyclic substitution form such as 1,3-di(2-pyridyl), (f) a 2-thio-2,4-thiazolidinedione nucleus, such as rhodanine and a derivative thereof; examples of the derivative include a 3-alkylrhodanine such as 3-methylrhodanine, 3-ethylrhodanine and 3-allylrhodanine, a 3-arylrhodanine such as 3-phenylrhodanine, and a 3-heterocyclic ring-substituted rhodanine such as 3-(2-pyridyl)rhodanine, (g) a 2-thio-2,4-oxazolidinedione (2-thio-2,4-(3H,5H)-oxazoledione) nucleus, such as 3-ethyl-2-thio-2,4-oxazolidinedione, (h) a thianaphthenone nucleus, such as 3(2H)-thianaphthenone-1,1-dioxide, (i) a 2-thio-2,5-thiazolidinedione nucleus, such as 3-ethyl-2-thio-2,5-thiazolidinedione, (j) a 2,4-thiazolidinedione nucleus, such as 2,4-thiazolidinedione, 3-ethyl-2,4-thiazolidinedione and 3-phenyl-2,4-thiazolidinedione, (k) a thiazolin-4-one nucleus, such as 4-thiazolinone and 2-ethyl-4-thiazolinone, (l) a 2,4-imidazolidinedione (hydantoin) nucleus, such as 2,4-imidazolidinedione and 3-ethyl-2,4-imidazolidinedione, (m) a 2-thio-2,4-imidazolidinedione (2-thiohydantoin) nucleus, such as 2-thio-2,4-imidazolidinedione and 3-ethyl-2-thio-2,4-imidazolidinedione, (n) an imidazolin-5-one nucleus, such as 2-propylmercapto-2-imidazolin-5-one, (o) a 3,5-pyrazolidinedione nucleus, such as 1,2-diphenyl-3,5-pyrazolidinedione and 1,2-dimethyl-3,5-pyrazolidinedione, (p) a benzothiophen-3-one nucleus, such as benzothiophen-3-one, oxobenzothiophen-3-one and dioxobenzothiophen-3-one, and (q) an indanone nucleus, such as 1-indanone, 3-phenyl-1-indanone, 3-methyl-1-indanone, 3,3-diphenyl-1-indanone and 3,3-dimethyl-1-indanone.

The ring formed by $Z_1$ is preferably a 1,3-dicarbonyl nucleus, a pyrazolinone nucleus, a 2,4,6-triketohexahydropyrimidine nucleus (including a thioketone form, e.g., barbituric acid nucleus, 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone form, e.g., barbituric acid nucleus, 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone form, e.g., barbituric acid nucleus, 2-thiobarbituric acid nucleus), yet still more preferably a 1,3-indanedione nucleus, a barbituric acid nucleus, a 2-thiobarbituric acid nucleus or a derivative thereof.

A preferred ring formed by $Z_1$ is represented by the following formula:

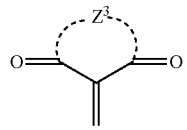

$Z^3$ represents an atomic group necessary for forming a 5- or 6-membered ring. $Z^3$ may be selected from the above-described rings formed by $Z_1$ and is preferably a 1,3-dicarbonyl nucleus or a 2,4,6-triketohexahydropyrimidine nucleus (including a thioketone form), more preferably a 1,3-indanedione nucleus, a barbituric acid nucleus, a 2-thiobarbituric acid nucleus or a derivative thereof.

It has been found that by controlling the interaction between acceptor parts, high hole transporting property can be brought out when forming a co-vapor deposition film with $C_{60}$. The interaction can be controlled by the structure of the acceptor part and introduction of a substituent working out to a steric hindrance. In the barbituric acid nucleus and 2-thiobarbituric acid nucleus, both two hydrogens at two N-positions are preferably substituted by a substituent, whereby the intermolecular interaction can be controlled. Examples of the substituent include the substituent W above, but the substituent is preferably an alkyl group, more preferably a methyl group, an ethyl group, a propyl group or a butyl group.

In the case where the ring formed by $Z_1$ is a 1,3-indanedione nucleus, $Z_1$ is preferably a group represented by formula (IV) or a group represented by formula (V).

In the case of a group represented by formula (IV), $R_{41}$ to $R_{44}$ each independently represents a hydrogen atom or a substituent. As to the substituent, for example, those described as the substituent W may be applied. Adjacent members of $R_{41}$ to $R_{44}$ may combine to form a ring, and it is preferred that $R_{42}$ and $R_{43}$ combine together to form a ring (for example, a benzene ring, a pyridine ring or a pyrazine ring). A case where $R_{41}$ to $R_{44}$ all are a hydrogen atom is preferred.

The group represented by formula (IV) is preferably a group represented by formula (V).

In the case of a group represented by formula (V), $R_{41}$, $R_{44}$ and $R_{45}$ to $R_{48}$ each independently represents a hydrogen atom or a substituent. As to the substituent, for example, those described as the substituent W may be applied. It is preferred that $R_{41}$, $R_{44}$ and $R_{45}$ to $R_{48}$ all are a hydrogen atom.

In the case where the ring formed by $Z_1$ is a 2,4,6-triketohexahydropyrimidine nucleus (including a thioketone form), $Z_1$ is preferably a group represented by formula (VI).

In the case of a group represented by formula (VI), $R_{81}$ and $R_{82}$ each independently represents a hydrogen atom or a substituent. As to the substituent, for example, those described as the substituent W may be applied. $R_{81}$ and $R_{82}$ each is independently, preferably an alkyl group, an aryl group or a heterocyclic group (e.g., 2-pyridyl), more preferably an alkyl group having a carbon number of 1 to 6 (e.g., methyl, ethyl, n-propyl, tert-butyl).

$R_{83}$ represents an oxygen atom, a sulfur atom or a substituent, but $R_{83}$ preferably represents an oxygen atom or a sulfur atom. The substituent is preferably a substituent with the bonding part being a nitrogen atom or a carbon atom. In the case of a nitrogen atom, the substituent is preferably an alkyl group (having a carbon number of 1 to 12) or an aryl group (having a carbon number of 6 to 12), and specific examples thereof include a methylamino group, an ethylamino group, a butylamino group, a hexylamino group, a phenylamino group and a naphthylamino group. In the case of a carbon atom, it may be sufficient if at least one electron-withdrawing group is further substituted. The electron-withdrawing group includes a carbonyl group, a cyano group, a sulfoxide group, a sulfonyl group and a phosphoryl group, and preferably further has a substituent. As this substituent, the substituent W can be exemplified. $R_{83}$ is preferably a substituent that forms a 5- or 6-membered ring containing the carbon atom, and specific examples thereof include those having the following structures.

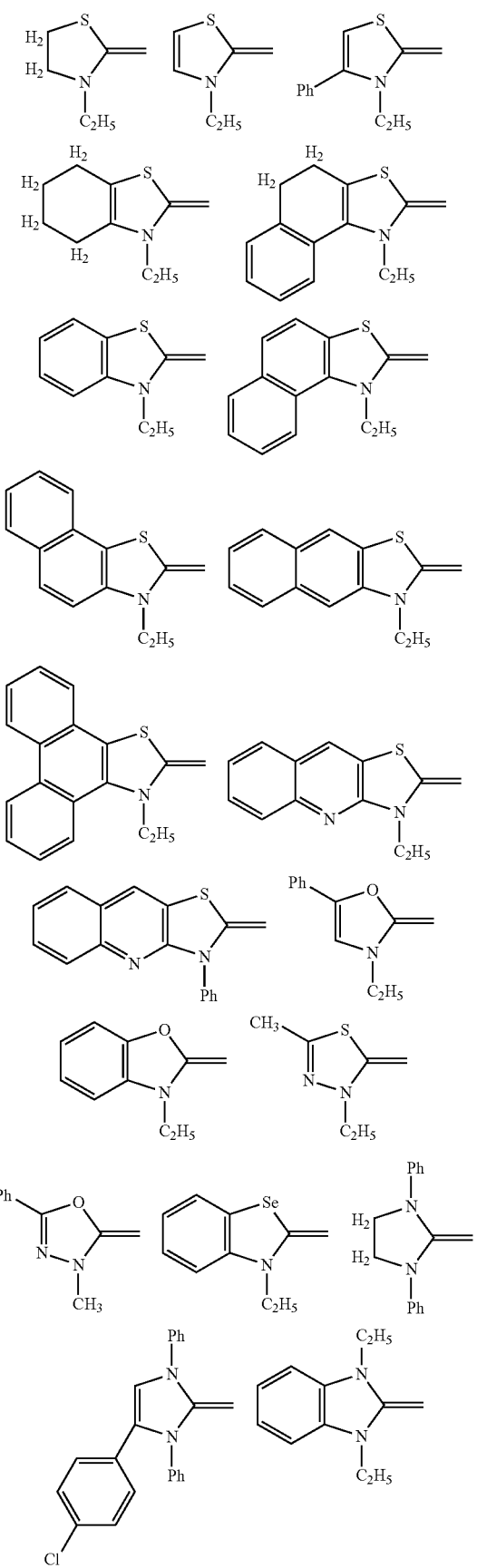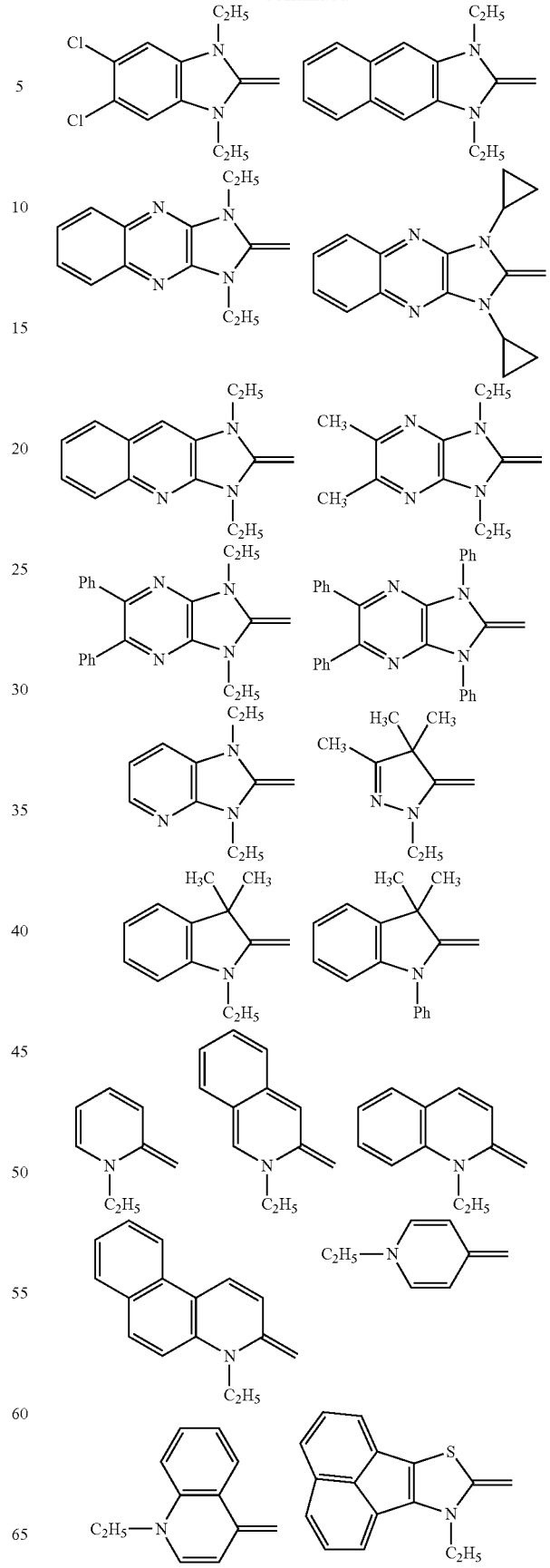

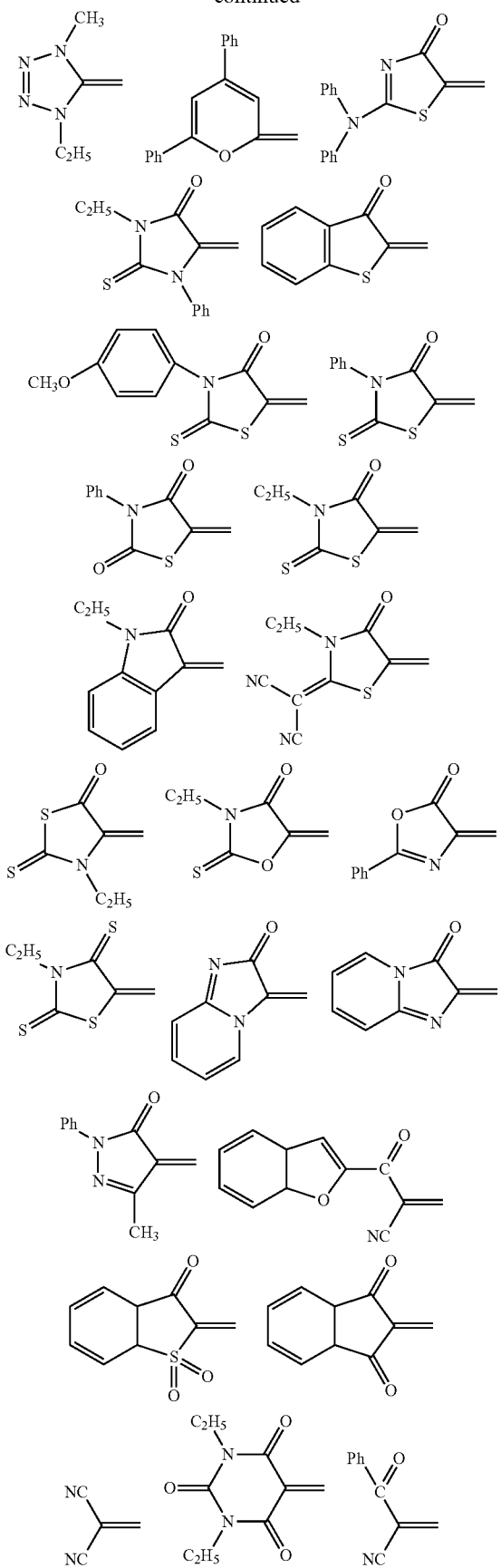

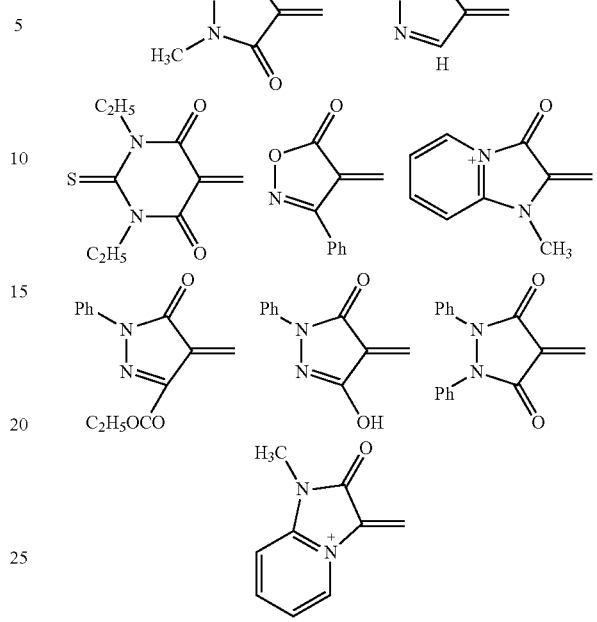

In the groups above, Ph indicates a phenyl group.

$L_1$, $L_2$ and $L_3$ each independently represents an unsubstituted methine group or a substituted methine group. Substituted methine groups may combine together to form a ring (for example, a 6-membered ring such as benzene ring). Examples of the substituent of the substituted methine group include the substituent W, and it is preferred that $L_1$, $L_2$ and $L_3$ all are an unsubstituted methine group.

n represents an integer of 0 or more, preferably represents an integer of 0 to 3, and is more preferably 0. When n becomes large, the absorption wavelength region is allowed to reside on a long wavelength side, but the thermal decomposition temperature becomes low. From the standpoint of having appropriate absorption in the visible region and suppressing thermal decomposition at the film formation by vapor deposition, n is preferably 0.

$D_1$ represents an atomic group. $D_1$ is preferably a group containing —$NR^a(R^b)$, and it is more preferred that $D_1$ represents a —$NR^a(R^b)$-substituted aryl group (preferably a phenyl or naphthyl group which may be substituted). $R^a$ and $R^b$ each independently represents a hydrogen atom or a substituent, and examples of the substituent represented by $R^a$ and $R^b$ include the above-described substituent W, but the substituent is preferably an aliphatic hydrocarbon group (preferably an alkyl or alkenyl group which may be substituted), an aryl group (preferably a phenyl group which may be substituted) or a heterocyclic group.

The heterocyclic group is preferably a 5-membered ring such as furan, thiophene, pyrrole or oxadiazole.

In the case where $R^a$ and $R^b$ each is a substituent (preferably an alkyl group or an alkenyl group), the substituent may form a ring (preferably a 6-membered ring) by combining with a hydrogen atom or a substituent in the aromatic ring (preferably a benzene ring) skeleton of the aryl group to which —$NR^a(R^b)$ is substituted. In this case, formulae (VIII), (IX) or (X) as described below are preferred.

The substituents $R^a$ and $R^b$ may combine together to form a ring (preferably a 5- or 6-membered ring, more preferably a 6-membered ring), or $R^a$ and $R^b$ each may combine with a substituent in L (that is, any one of $L_1$, $L_2$ and $L_3$) to form a ring (preferably a 5- or 6-membered ring, more preferably a 6-membered ring).

$D_1$ is preferably an aryl group (preferably a phenyl group) bonded by an amino group at the para-position. In this case, $D_1$ is preferably represented by formula (II). The amino group may be substituted. Examples of the substituent of the amino group include the above-described substituent W, and an aliphatic hydrocarbon group (preferably an alkyl group which may be substituted), an aryl group (preferably a phenyl group which may be substituted) and a heterocyclic group are preferred. The amino group is preferably an amino group substituted by two aryl groups, so-called a diaryl group-substituted amino group. In this case, $D_1$ is preferably represented by formula (III). The substituent (preferably an alkyl or alkenyl group which may be substituted) of the amino group may combine with a hydrogen atom or a substituent in the aromatic ring (preferably a benzene ring) skeleton of the aryl group to form a ring (preferably a 6-membered ring).

In the case where $R^a$ and $R^b$ each is an aliphatic hydrocarbon group, an aryl group or a heterocyclic group, the substituent is preferably an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group or an aromatic heterocyclic group, more preferably an alkyl group, an alkenyl group, an aryl group, an alkoxy group, an aryloxy group, a silyl group or an aromatic heterocyclic group, still more preferably an alkyl group, an aryl group, an alkoxy group, an aryloxy group, a silyl group or an aromatic heterocyclic group. As for specific examples, those described above for the substituent W may be applied.

$R^a$ and $R^b$ each is preferably an alkyl group, an aryl group or an aromatic heterocyclic group. $R^a$ and $R^b$ each is more preferably an alkyl group, an alkylene group forming a ring by combining with L, or an aryl group, more preferably an alkyl group having a carbon number of 1 to 8, an alkylene group forming a 5- or 6-membered ring by combining with L, or a substituted or unsubstituted phenyl group, still more preferably an alkyl group having a carbon number of 1 to 8, or a substituted or unsubstituted phenyl group.

It is also preferred that $D_1$ is represented by the following formula (VII):

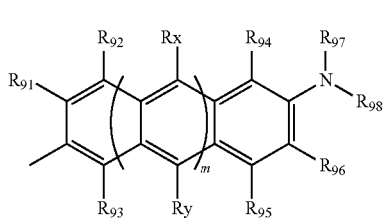

Formula (VII)

wherein $R_{91}$ to $R_{98}$ each independently represents a hydrogen atom or a substituent; m represents an integer of 0 or more, preferably 0 or 1, and m is preferably 0; Rx and Ry each independently represents a hydrogen atom or a substituent and when m is an integer of 2 or more, Rx's or Ry's bonded to respective 6-membered rings may be different substituents; $R_{91}$ and $R_{92}$, $R_{92}$ and Rx, Rx and $R_{94}$, $R_{94}$ and $R_{97}$, $R_{93}$ and Ry, Ry and $R_{95}$, $R_{95}$ and $R_{96}$, or $R_{97}$ and $R_{98}$ may independently combine together to form a ring; and the bonding part to $L_3$ (when n is 0, to $L_1$) may be at the position of $R_{91}$, $R_{92}$ or $R_{93}$ and in this case, the substituent or hydrogen atom corresponding to $R_{91}$, $R_{92}$ or $R_{93}$ may be bonded to the site denoted as the bonding part to $L_3$ in formula (VII) and adjacent R's may combine together to form a ring. The expression "adjacent R's may combine together to form a ring" as used herein indicates that, for example, in the case where $R_{91}$ becomes the bonding part to $L_3$ (when n is 0, to $L_1$), assuming that $R_{90}$ is bonded to the bonding part in formula (VII), $R_{90}$ and $R_{93}$ may combine to form a ring; in the case where $R_{92}$ becomes the bonding part to $L_3$ (when n is 0, to $L_1$), assuming that $R_{90}$ is bonded to the bonding part in formula (VII), $R_{90}$ and $R_{91}$, or $R_{90}$ and $R_{93}$ may combine together to form a ring; and in the case where $R_{93}$ becomes the bonding part to $L_3$ (when n is 0, to $L_1$), assuming that $R_{90}$ is bonded to the bonding part in formula (VII), $R_{90}$ and $R_{91}$, or $R_{91}$ and $R_{92}$ may combine together to form a ring.

The ring above is preferably a benzene ring.

Examples of the substituent of $R_{91}$ to $R_{98}$, Rx and Ry include the substituent W.

$R_{91}$ to $R_{96}$ all are preferably a hydrogen atom, and Rx and Ry both are preferably a hydrogen atom. It is preferred that $R_{91}$ to $R_{96}$ each is a hydrogen atom and at the same time, Rx and Ry each is a hydrogen atom.

$R_{97}$ and $R_{98}$ each independently, preferably represents a phenyl group which may be substituted. Examples of the substituent include the substituent W, with an unsubstituted phenyl group being preferred.

m represents an integer of 0 or more and is preferably 0 or 1.

It is also preferred that $D_1$ is a group represented by formula (VIII), (IX) or (X).

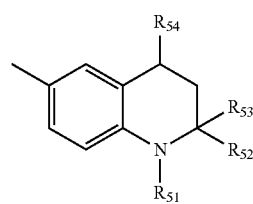

Formula (VIII)

wherein $R_{51}$ to $R_{54}$ each independently represents hydrogen or a substituent. Examples of the substituent include the substituent W. $R_{52}$ and $R_{53}$, or $R_{51}$ and $R_{52}$ may combine together to form a ring.

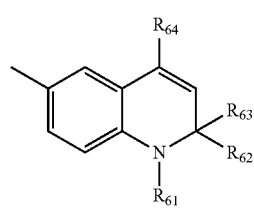

Formula (IX)

wherein $R_{61}$ to $R_{64}$ each independently represents hydrogen or a substituent. Examples of the substituent include the substituent W. $R_{62}$ and $R_{63}$, or $R_{61}$ and $R_{62}$ may combine together to form a ring.

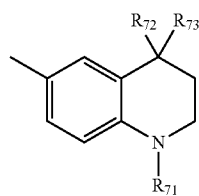

Formula (X)

wherein $R_{71}$ to $R_{73}$ each independently represents a hydrogen atom or a substituent. Examples of the substituent include the substituent W. $R_{72}$ and $R_{73}$ may combine together to form a ring.

$D_1$ is more preferably a group represented by formula (II) or (III).

In formula (II), $R_1$ to $R_6$ each independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Examples of the substituent in $R_1$ to $R_4$ include the substituent W. It is preferred that $R_1$ to $R_4$ are a hydrogen atom or $R_2$ and $R_5$, or $R_4$ and $R_6$ form a 5-membered ring, and it is more preferred that $R_1$ to $R_4$ all are a hydrogen atom.

Examples of the substituent in $R_5$ and $R_6$ include the substituent W. Among the substituents, a substituted or unsubstituted aryl group is preferred. The substituent of the substituted aryl is preferably an alkyl group (e.g., methyl, ethyl) or an aryl group (e.g., phenyl, naphthylene, phenanthryl, anthryl). $R_5$ and $R_6$ each is preferably a phenyl group, an alkyl-substituted phenyl group, a phenyl-substituted phenyl group, a naphthyl group, a phenanthryl group, an anthryl group or fluorenyl group (preferably, 9,9'-dimethyl-2-fluorenyl group).

In formula (III), $R_{11}$ to $R_{14}$, $R_{20}$ to $R_{24}$ and $R_{30}$ to $R_{34}$ each independently represents a hydrogen atom or a substituent. Also, $R_{11}$ to $R_{14}$, $R_{20}$ to $R_{24}$ and $R_{30}$ to $R_{34}$ may combine together to form a ring. Examples of the ring includes a benzene ring formed by combining $R_{11}$ and $R_{12}$, or $R_{13}$ and $R_{14}$, a benzene ring formed by combining adjacent two to $R_{20}$ to $R_{24}$ ($R_{24}$ and $R_{23}$, $R_{23}$ and $R_{20}$, $R_{20}$ and $R_{21}$, or $R_{21}$ and $R_{22}$); a benzene ring formed by combining adjacent two of $R_{30}$ to $R_{34}$ ($R_{34}$ and $R_{33}$, $R_{33}$ and $R_{30}$, $R_{30}$ and $R_{31}$, or $R_{31}$ and $R_{32}$); and 5-membered ring formed by combining $R_{22}$ and $R_{34}$ together with the nitrogen atom.

Examples of the substituent represented by $R_{11}$ to $R_{14}$, $R_{20}$ to $R_{24}$ and $R_{30}$ to $R_{34}$ include the substituent W, but the substituent is preferably an alkyl group (e.g., methyl, ethyl) or an aryl group (e.g., phenyl, naphthyl), which may be substituted with the substituent W (preferably, an aryl group). Above all, it is preferred that $R_{20}$ and $R_{30}$ are the substituent above, and it is more preferred that at the same time, the others $R_{11}$ to $R_{14}$, $R_{21}$ to $R_{24}$ and $R_{31}$ to $R_{34}$ are a hydrogen atom.

The compound represented by formula (I) is a compound described in JP-A-2000-297068. If a compound is represented by formula (I) but is not described in JP-A-2000-297068, the compound can be manufactured according to the synthesis method described in JP-A-2000-297068.

Specific examples of the compound represented by formula (I) are set forth below, but the present invention is not limited thereto.

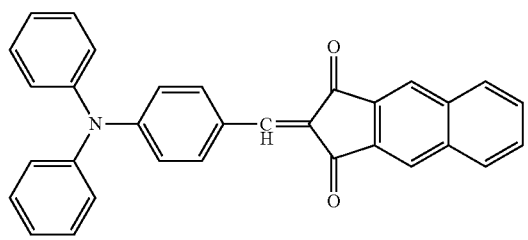
(1)

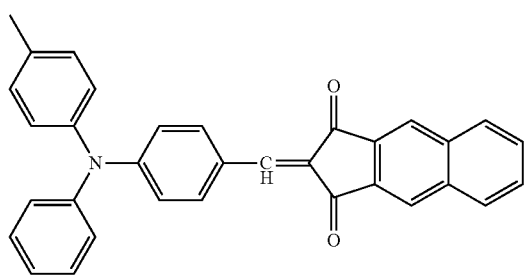
(2)

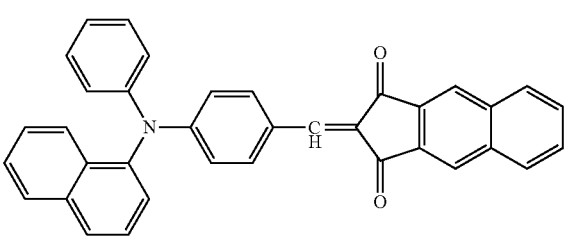
(3)

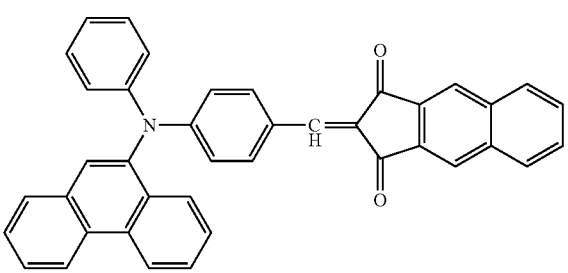
(4)

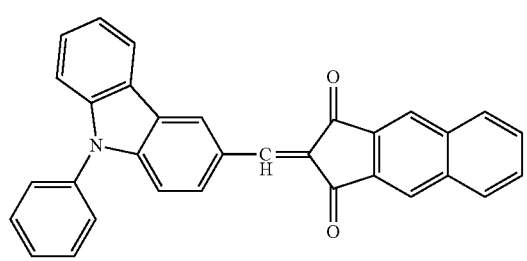
(5)

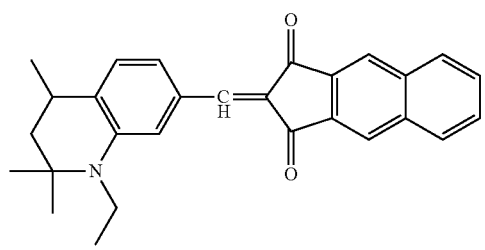
(6)

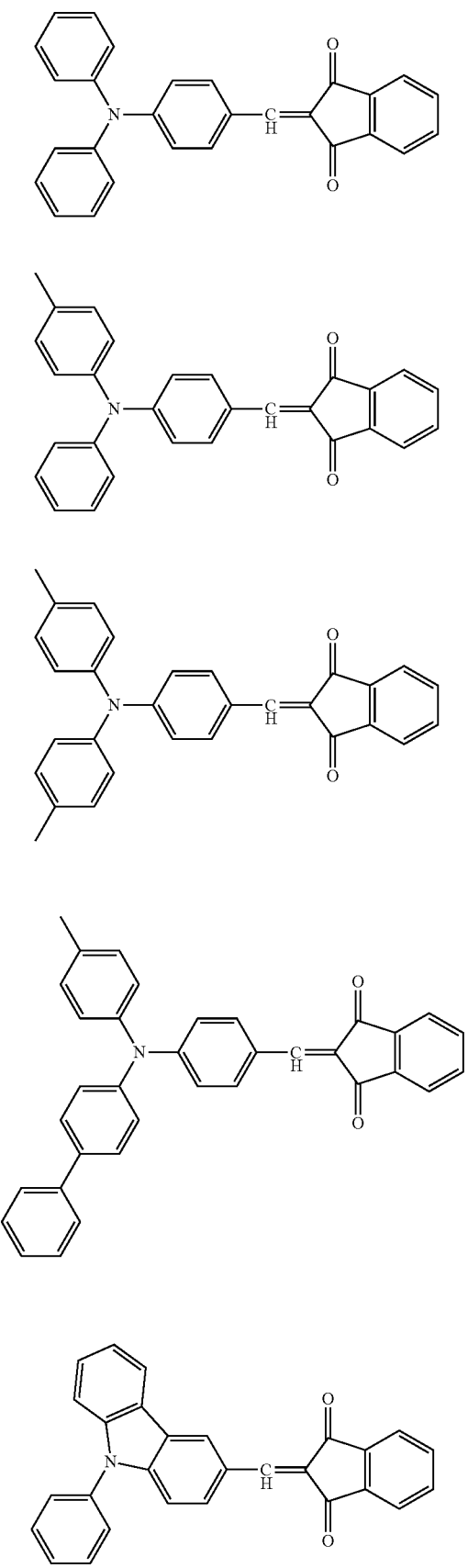
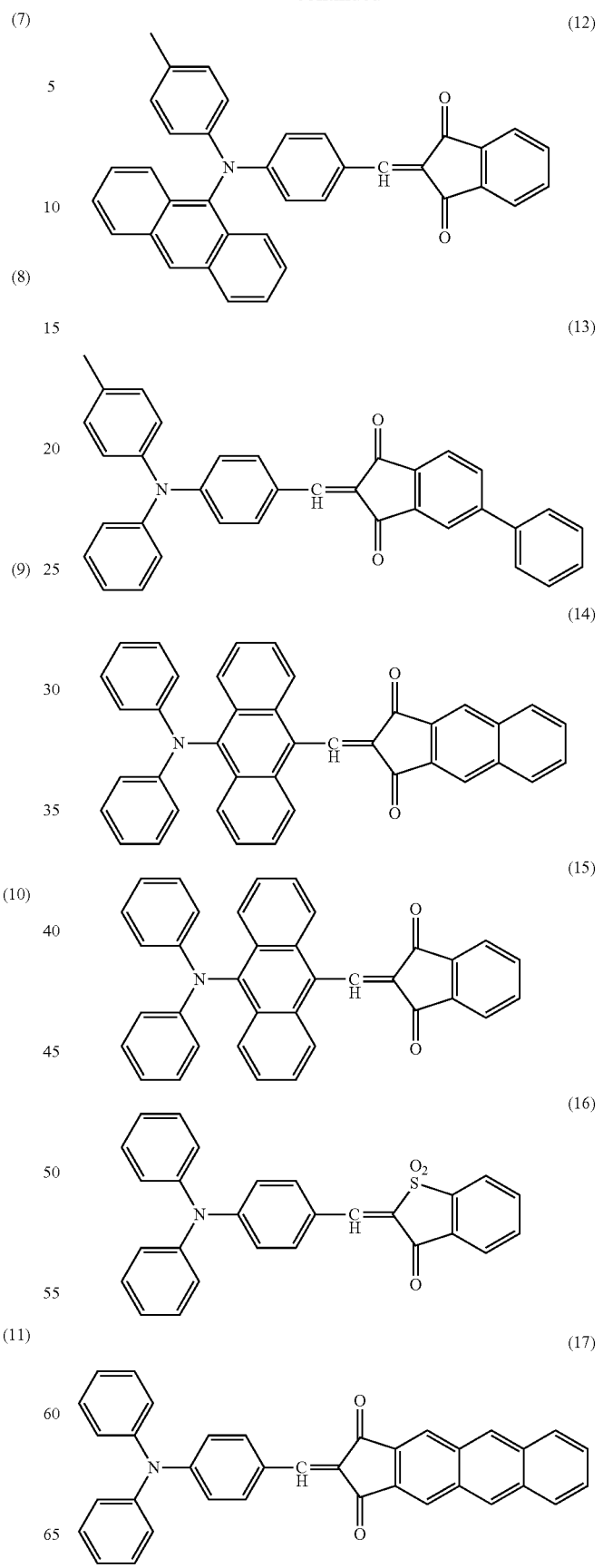

-continued
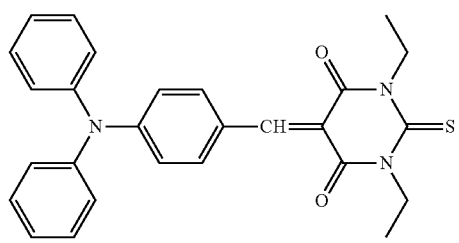
(18)
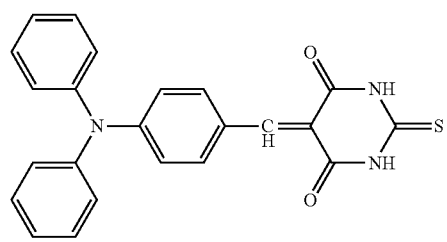
(19)
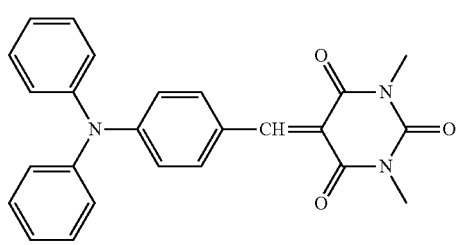
(20)
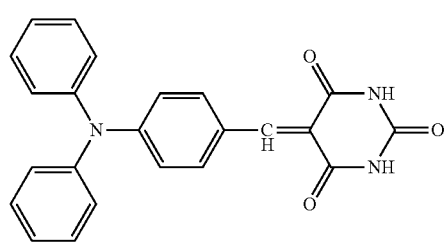
(21)
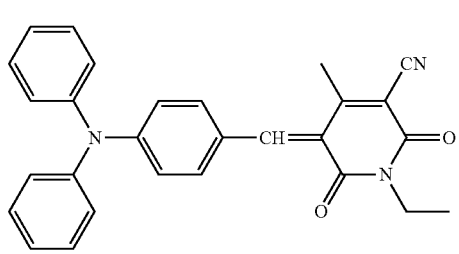
(22)
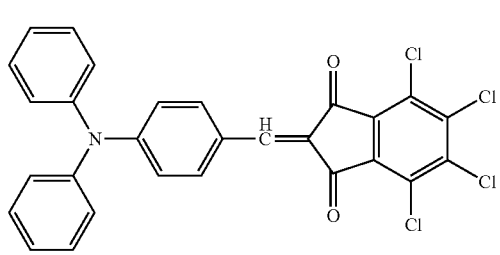
(23)
-continued
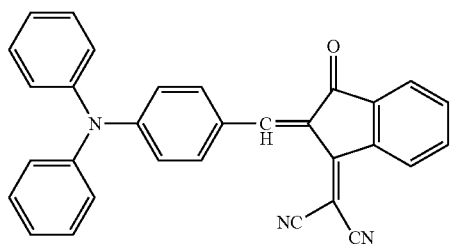
(24)
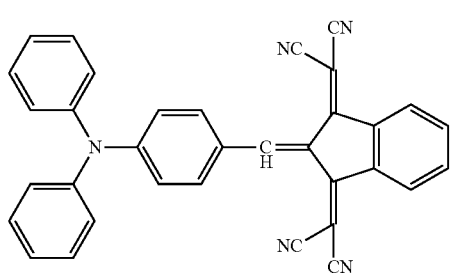
(25)
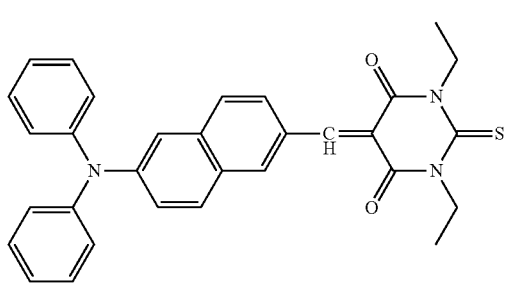
(26)
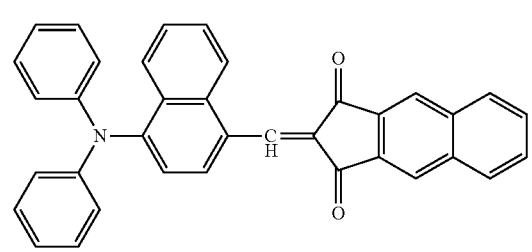
(27)
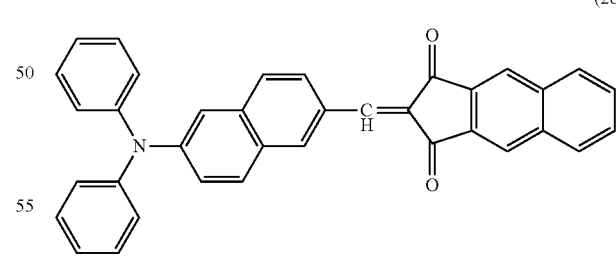
(28)
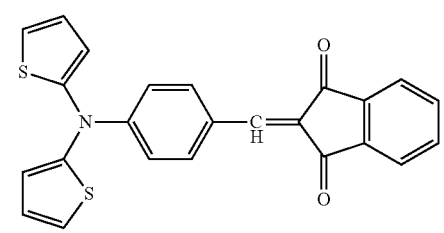
(29)

(30)
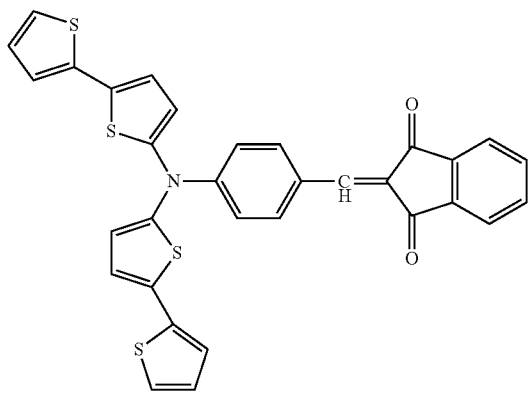
(31)
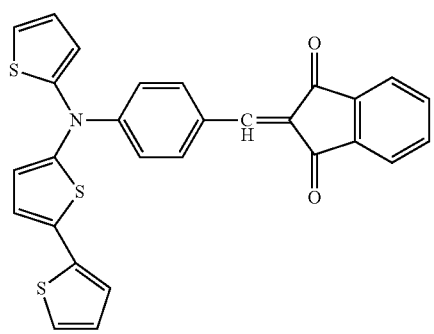
(32)
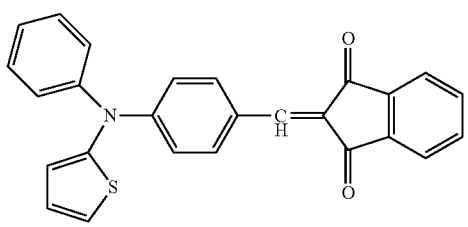
(33)
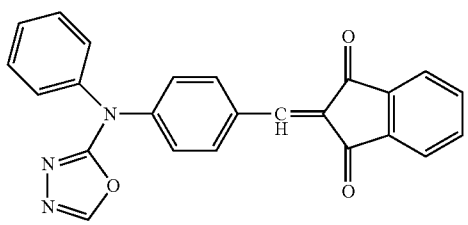
(34)
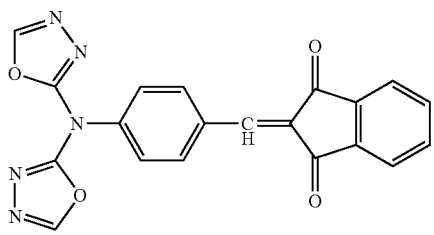
(35)
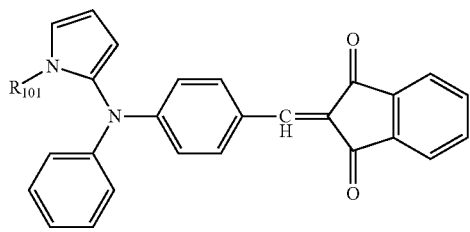
(36)
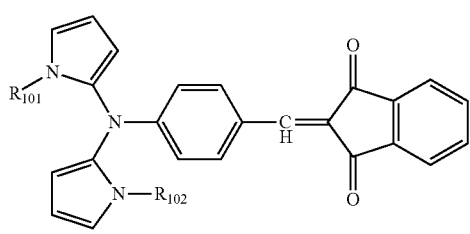
(37)
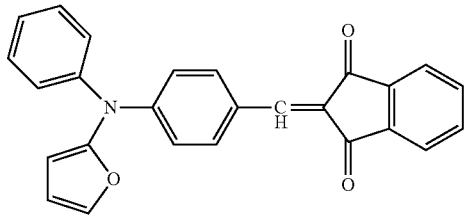
(38)
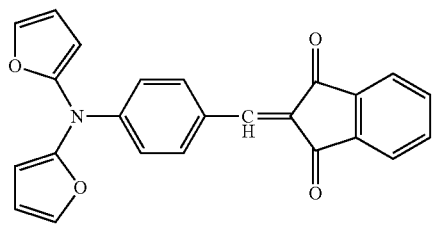
(39)
(40)
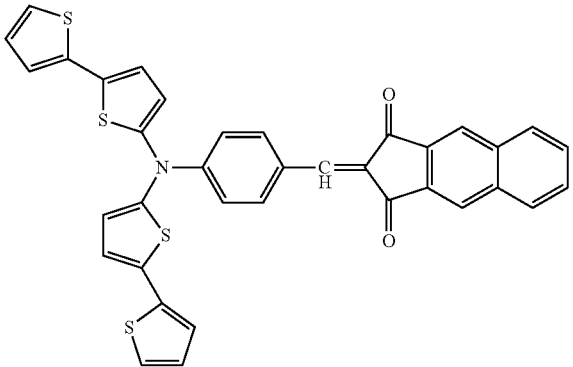

-continued
(41)
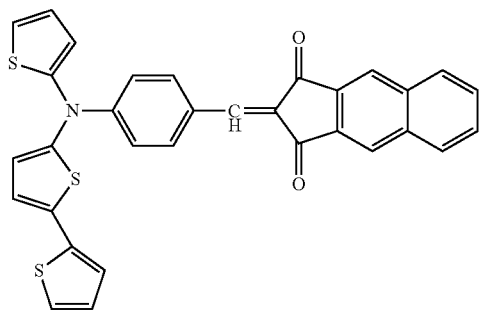
(42)
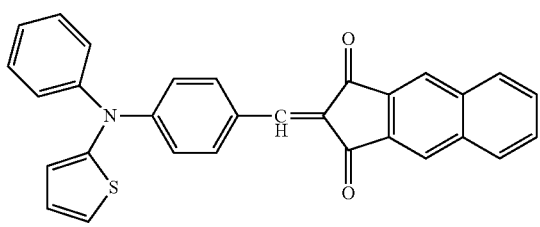
(43)
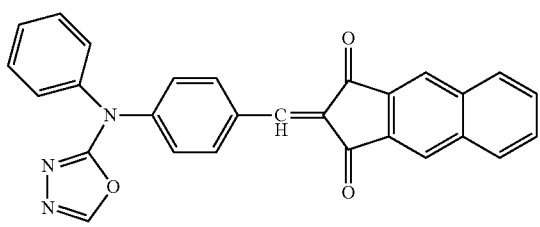
(44)
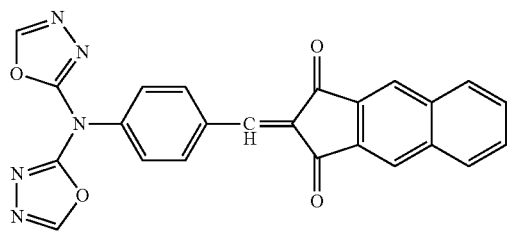
(45)
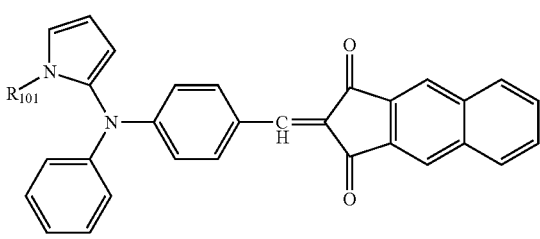
(46)
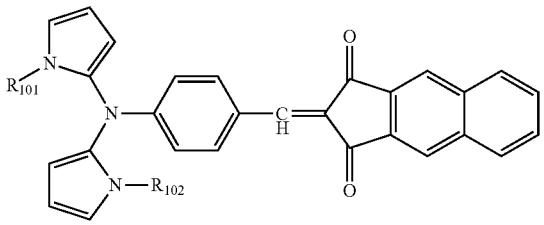
-continued
(47)
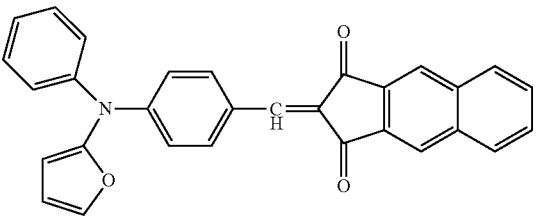
(48)
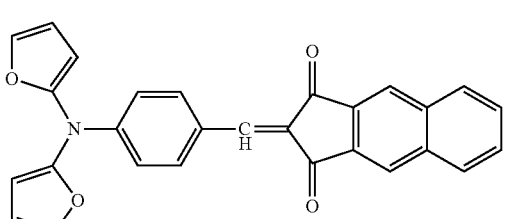
(49)
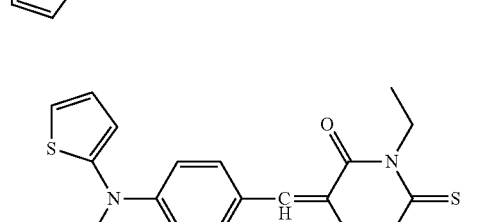
(50)
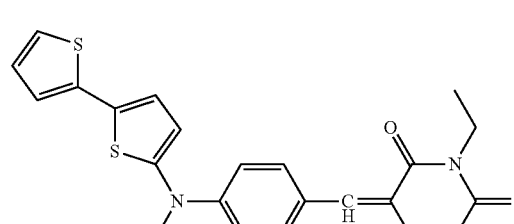
(51)
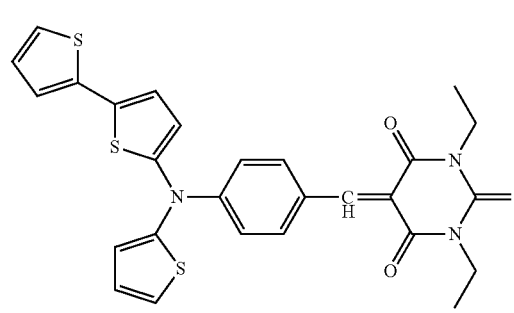

31
-continued
(52)
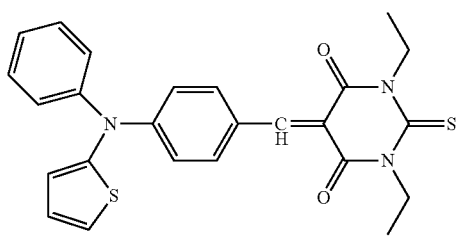
(53)
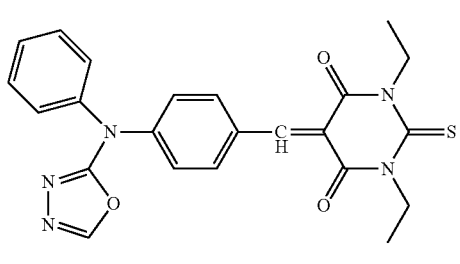
(54)
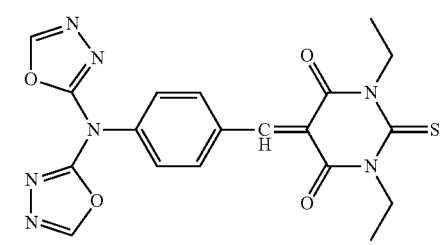
(55)
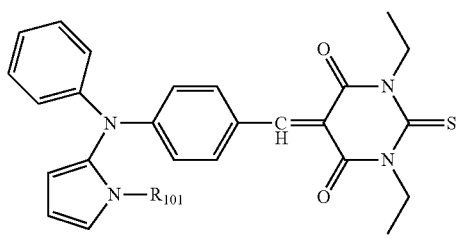
(56)
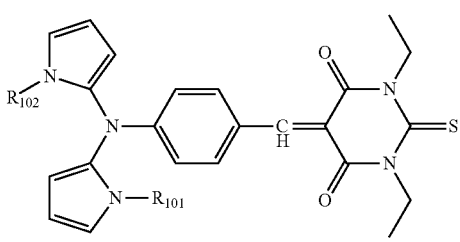
(57)
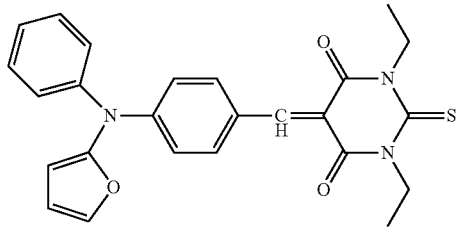
32
-continued
(58)
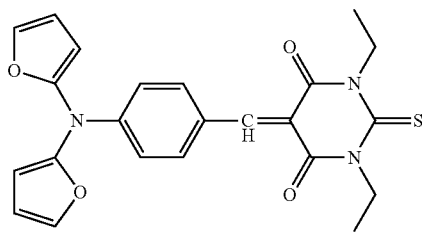
(59)
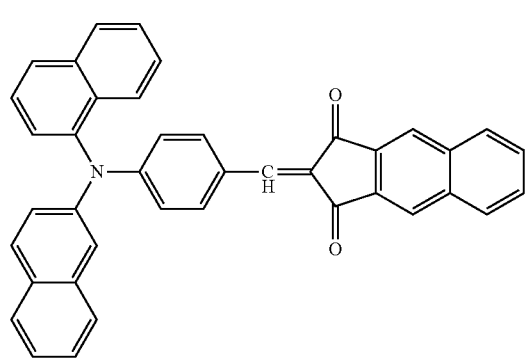
(60)
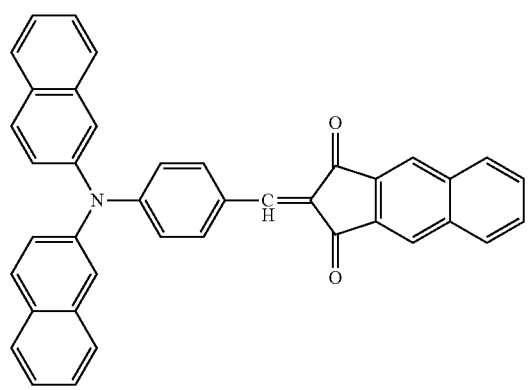
(61)
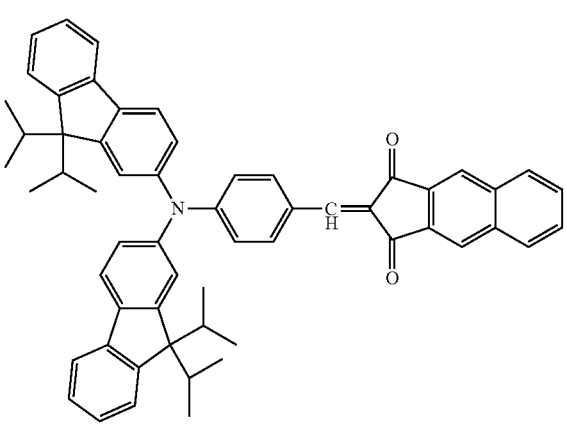

-continued
(62)
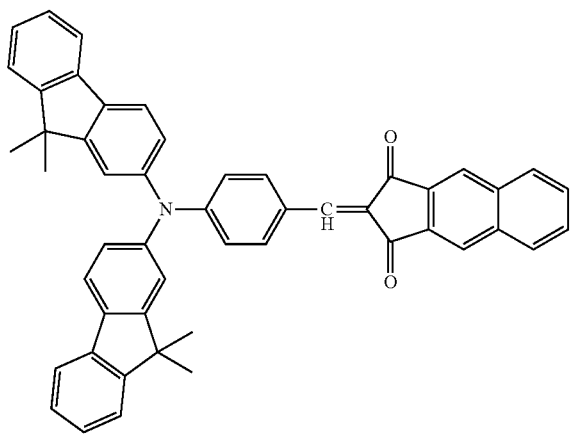
(63)
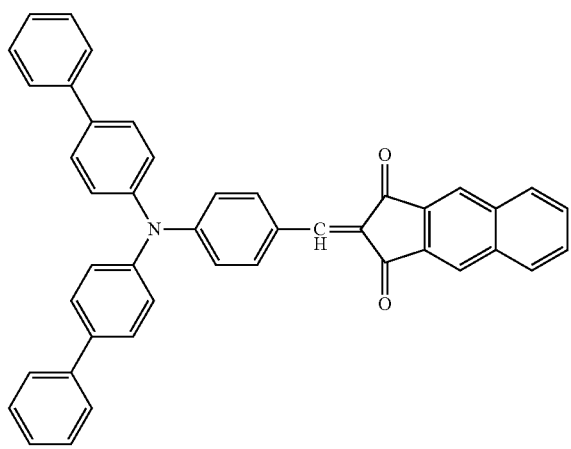
(64)
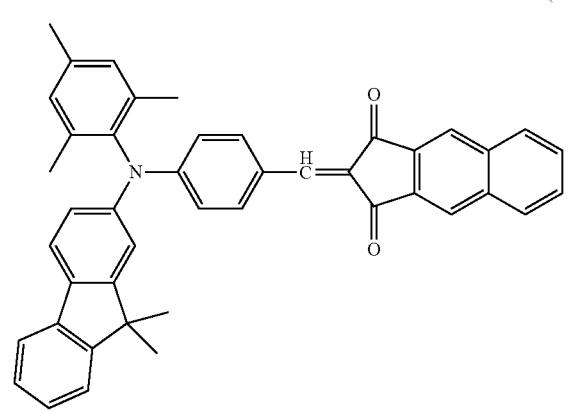
-continued
(65)
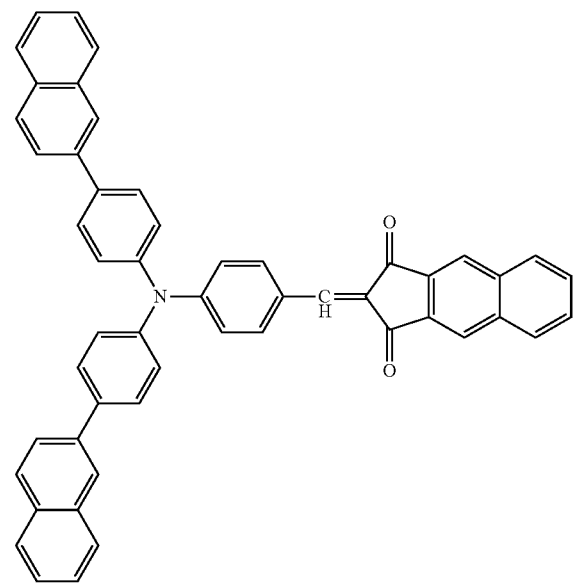
(66)
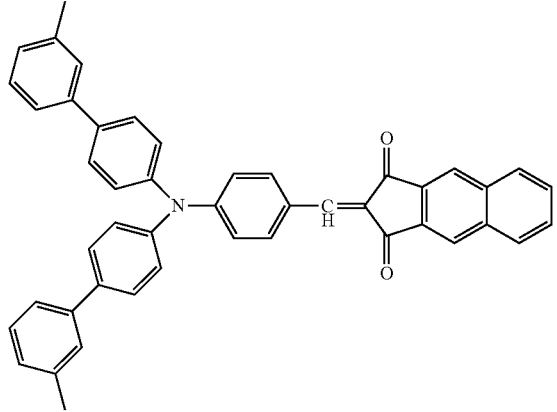
(67)
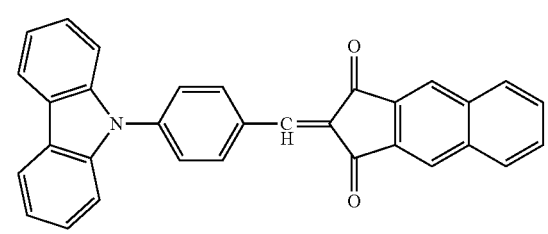

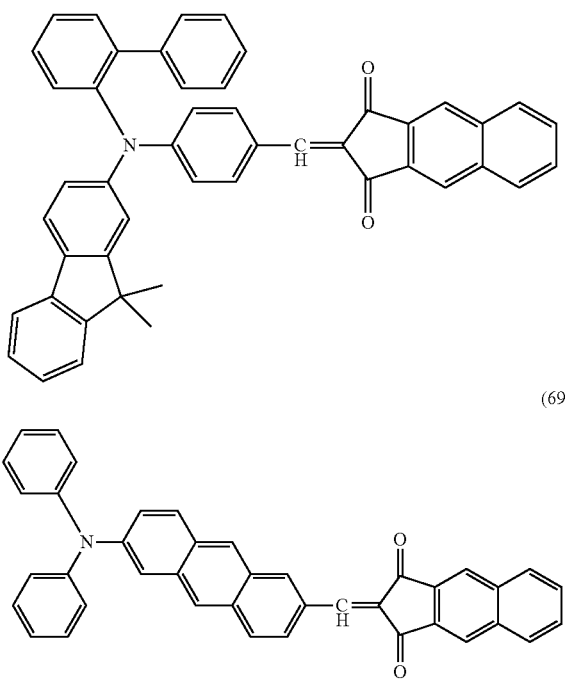

In formulae above, $R_{101}$ and $R_{102}$ each independently represents a hydrogen atom or a substituent. Examples of the substituent include the substituent W, but the substituent is preferably an alkyl group or an aryl group.

The fullerene or fullerene derivative is described in detail below.

In the present invention, a photoelectric conversion element containing a fullerene or fullerene derivative in the photoelectric conversion layer is used. The compound above may be used as any one of an organic p-type semiconductor, an organic n-type semiconductor, and an electron or hole blocking material stacked between such an organic semiconductor and an electrode, but is preferably used as an organic n-type semiconductor.

The fullerene as referred to in the present invention indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene or fullerene nanotube, and the fullerene derivative indicates a compound resulting from addition of a substituent to the fullerene above.

In the present invention, when a specific moiety is referred to as "a group", this means that the moiety itself may not be substituted or may be substituted by one or more (to a possible maximum number) substituents. For example, "an alkyl group" means a substituted or unsubstituted alkyl group. Examples of the substituent above include the substituent W.

The fullerene derivative for use in the present invention is preferably a fullerene derivative represented by the following formula (1).

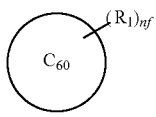

Formula (1)

In formula (1), $R^1$ represents a substituent. As for the substituent, the above-described substituent W may be used. The substituent is preferably an alkyl group, an aryl group or a heterocyclic group, and preferred ranges and preferred specific examples thereof include those described for the substituent W. The alkyl group is more preferably an alkyl group having a carbon number of 1 to 12, and the rings of the aryl group and heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring or a phenazine ring, more preferably a benzene ring, a naphthalene ring, an anthracene ring, a phenanthrene ring, a pyridine ring, an imidazole ring, an oxazole ring or a thiazole ring, still more preferably a benzene ring, a naphthalene ring or a pyridine ring. These each may further have a substituent, and, if possible, the substituents may combine to form a ring. Incidentally, when nf is 2 or more, the plurality of $R^1$'s may be the same or different. Also, if possible, the plurality of $R^1$'s may combine to form a ring.

nf represents an integer of 1 to 60 and is preferably an integer of 1 to 6.

Examples of the fullerene derivative which is preferably used in the present invention are set forth below, but the present invention is not limited thereto.

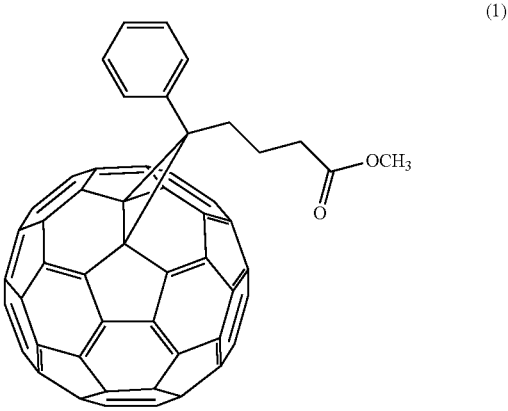

(1)

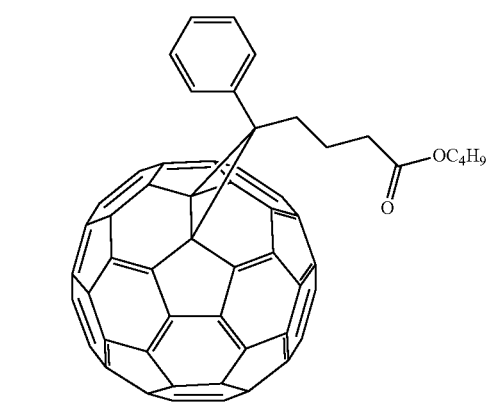
(2)
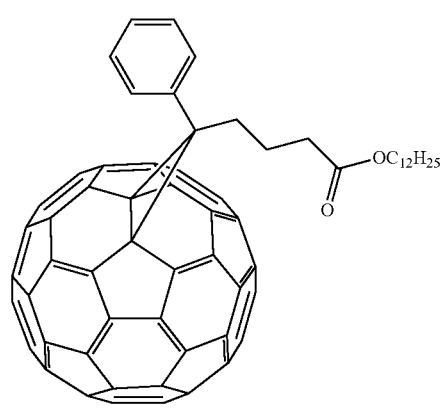
(3)
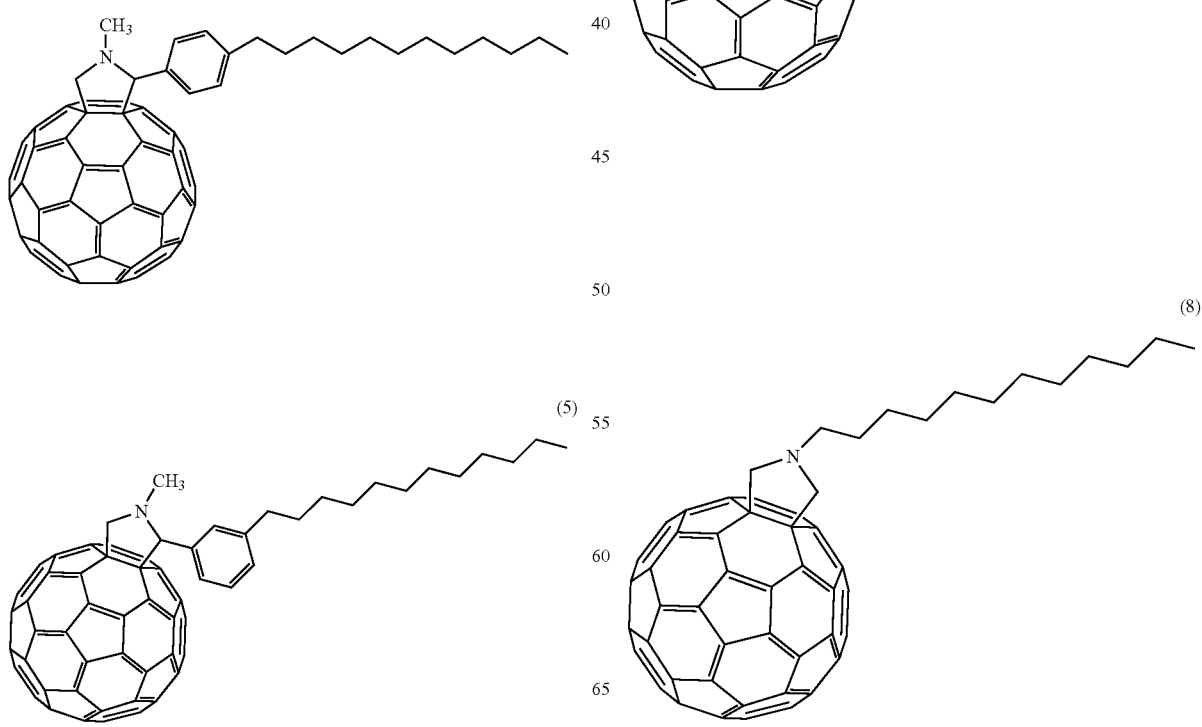

(9)

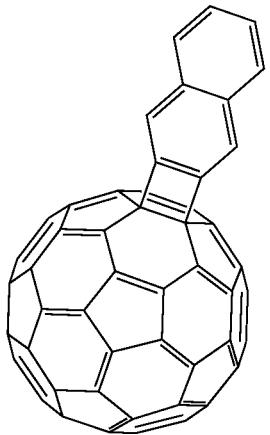

(10)

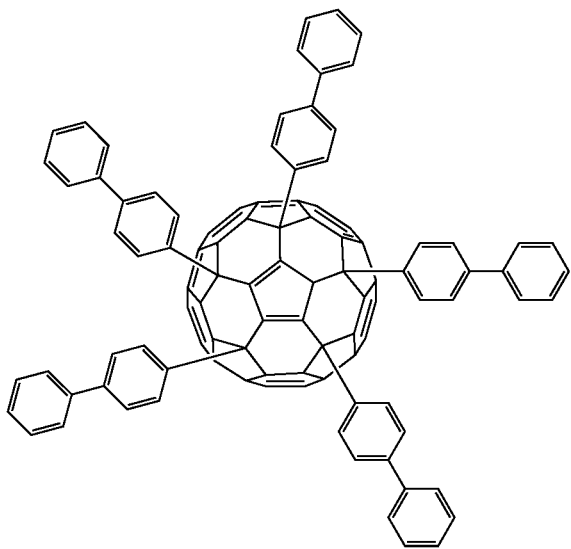

As for the fullerene and fullerene derivative for use in the present invention, the compounds described, for example, in *Kikan Kagaku Sosetsu* (*Scientific Review Quarterly*), No. 43, edited by The Chemical Society of Japan (1999), JP-A-10-167994, JP-A-11-255508, JP-A-11-255509, JP-A-2002-241323 and JP-A-2003-196881 may also be used. The fullerene and fullerene derivative for use in the present invention can be produced by the method or in accordance with the method described, for example, in *Kikan Kagaku Sosetsu* (*Scientific Review Quarterly*), No. 43, edited by The Chemical Society of Japan (1999), JP-A-10-167994, JP-A-11-255508, JP-A-11-255509, JP-A-2002-241323 and JP-A-2003-196881.

It is known to increase the exciton dissociation efficiency and bring out high photoelectric conversion efficiency by joining a fullerene or fullerene derivative with another material (generally called a p-type semiconductor) and thereby introducing a donor-acceptor interface, but the photoelectric conversion efficiency is not expected to be greatly increased with all materials. By using a compound represented by formulae (I) for use in the present invention, a great increase in the photoelectric conversion efficiency becomes possible.

For introducing a sufficiently large amount of the interface, layer formation is preferably performed in a state of the compound and the fullerene or fullerene derivative for use in the present invention (the combination of materials of the present invention) being mixed. This may be preferably realized by co-deposition in the case of a vapor deposition method or by preparing a mixed solution and coating the solution in the case of a coating method.

By virtue of using the combination of materials of the present invention, upwelling of an internal carrier, which is one of main causes of the dark current, is reduced.

For achieving high-speed responsivity, it is required that a carrier trap is not present inside of the organic photoelectric conversion layer and both an electron and a hole are smoothly transmitted. In general, the electron transport property of a normal material is poor and therefore, high-speed response is difficult to realize for many materials. In the construction using the combination of materials of the present invention, the fullerene or fullerene derivative is excellent in the electron transport property and by fabricating a structure where an electron generated upon exciton separation effects the charge transport through a fullerene or fullerene derivative, high-speed responsivity can be preferably realized. However, for this purpose, a structure of allowing a fullerene or fullerene derivative to connect in the longitudinal direction (direction toward both electrodes) of the layer is preferred. If this route is broken midway, charge transport from the fullerene (or fullerene derivative) to another material mixed (stacked) is necessary and the barrier in view of energy or physical junction here works as a trap and deteriorates the responsivity. In order to achieve high-speed responsivity, a fullerene or fullerene derivative needs to be introduced in more than a certain amount and, in terms of the amount when formed as a single layer layer, the amount of the fullerene or fullerene derivative is preferably 50% or more (by mol), more preferably 100% or more, still more preferably 200% or more, based on the amount of another material forming the mixed layer.

For imparting high-speed responsivity, the material (the compound represented by formulae (I)) mixed with the fullerene or fullerene derivative is of course preferably a material having a high electron or hole transport property as the material alone. However, the electron transport ability is compensated for by the fullerene or fullerene derivative and therefore, a material having at least a high hole transport ability is preferred.

Usually, when an upper transparent electrode is layer-formed directly on a photoelectric conversion material layer composed of a single material, this may cause deterioration due to damage of the underlying layer, reduction in the photoelectric conversion efficiency due to bad contactability between the upper electrode and the material layer, or reduction in the response speed. For this reason and also for suppressing an injection current from the electrode, a hole-blocking layer (buffer layer) is provided between the upper electrode and the photoelectric conversion layer of the present invention. However, the photoelectric conversion layer of the present invention brings about strengthening of layer resistance due to introduction of a fullerene, introduction of a large energy barrier for hole injection from fullerene and electrode, and good contactability with electrode, which is considered to be attributable to the spherical shape of the fullerene, and therefore, even when the hole-blocking layer (buffer layer) is not provided, the performance in terms of photoelectric conversion efficiency, dark current, response speed and the like is not deteriorated. Accordingly, deterioration of the response speed, which is sometimes caused due to introduction of the hole-blocking layer (buffer layer), can be structurally eliminated.

In the material specified in the present invention, the structure is preferably a nonplanar molecule. The nonplanar molecule specified in the present invention indicates a molecule having a portion defined by two or more planar structures, where the planar structures are bonded to form an SP2 orbital by making an angle except for 175 to 185°.

The thus-produced structure can be determined by generally known molecular orbital calculation method or the like.

The embodiments of the present invention are described below by referring to the drawings.

The combination of materials of the present invention is preferably contained in the following photoelectric conversion layer, and preferred embodiments are described below with respect to the material other than the combination of materials of the present invention, which is used in the photoelectric conversion layer containing the photoelectric conversion layer, the constituent element such as other layer for use in the photoelectric conversion element containing the photoelectric conversion layer, and the imaging device containing the photoelectric conversion element.

Embodiments capable of providing a photoelectric conversion element where injection of an electric charge (electron, hole) into the photoelectric conversion layer from the electrode is suppressed and dark current can be thereby effectively reduced (first to sixth embodiments) are described below.

According to these embodiments, in a photoelectric conversion element containing a pair of electrodes and a photoelectric conversion layer disposed between the pair of electrodes, when a first charge-blocking layer for suppressing the injection of an electric charge into the photoelectric conversion layer from one of the paired electrodes is provided between one of the paired electrodes and the photoelectric conversion layer and the first charge-blocking layer is formed to have a multiple layer structure, dark current can be suppressed more successfully than in the case of forming the first charge-blocking layer to have a single-layer structure. Also in the construction where a second charge-blocking layer for suppressing the injection of an electric charge into the photoelectric conversion layer from the other of the paired electrodes is provided between the other of the paired electrodes and the photoelectric conversion layer, when the second charge-blocking layer is formed to have a multiple layer structure, dark current can be suppressed more successfully than in the case of forming the second charge-blocking layer to have a single-layer structure. Furthermore, in the case where at least two layers out of a plurality of layers constituting each of the first charge-blocking layer and the second charge-blocking layer are composed of different materials, the effect of suppressing dark current can be more enhanced. In addition, in the case where at least two layers out of a plurality of layers are a layer composed of an inorganic material and a layer composed of an organic material, respectively, the effect of suppressing dark current can be more enhanced. Specific constructions of the charge-blocking layer are described in the following first to sixth embodiments.

(First Embodiment)

FIG. 1 is a schematic cross-sectional view showing one example of the construction of the photoelectric conversion element having a charge-blocking layer according to this embodiment.

In FIG. 1, reference numeral 200 is a photoelectric conversion layer, reference numeral 202 is a charge-blocking layer having a two-layer structure, reference numerals 202a and 202b are layers constituting the charge-blocking layer 202, and reference numerals 201 and 204 are electrodes.

For example, when the electrode 204 is provided as an electrode on the light incident side, since light needs to be incident into the photoelectric conversion layer 200, the electrode 204 is preferably composed of a material having high transparency. As for the electrode having high transparency, a transparent electrically conductive oxide (TCO) may be used. Similarly, the electrode 201 is preferably composed of a material having high transparency, because as seen in the construction of an imaging device described later, light needs to be transmitted beneath the electrode. Also in the case where the electrode 201 is provided as an electrode on the light incident side, the electrode 204 and the electrode 201 are preferably composed of a material having high transparency.

The charge-blocking layer 202 is a layer for restraining the movement of an electric charge from the electrode 204 to the photoelectric conversion layer 200 when a voltage is applied to the electrode 201 and the electrode 204. In the case where the charge-blocking layer 202 has a single-layer structure, an intermediate level (e.g., impurity level) is present in the material itself constituting the charge-blocking layer 202, and an electric charge (electron, hole) is allowed to move through this intermediate level to cause an increase in the dark current. For preventing such movement, in this embodiment, the charge-blocking layer 202 is formed to have a two-layer structure but not a single-layer structure.

It is considered that when an interface is produced between the layers 202a and 202b constituting the charge-blocking layer 202, discontinuity is generated in the intermediate level present in each of the layers 202a and 202b and movement of the carrier through the intermediate level or the like becomes difficult, as a result, dark current can be suppressed. However, if the layers 202a and 202b are formed of the same material, the intermediate levels present in the layers 202a and 202b may become thoroughly the same. Accordingly, for more enhancing the effect of suppressing the dark current, the materials constituting respective layers 202a and 202b are preferably different.

Figure 2A:
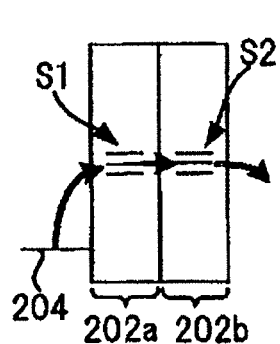
FIGS. 2A and 2B are energy diagrams showing the state of intermediate levels in the charge-blocking layer having a two-layer structure shown in FIG. 1.
Figure 2B:
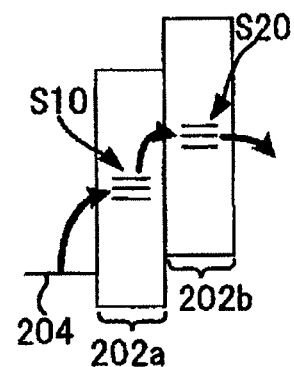

FIGS. 2A and 2B are energy diagrams showing the state of the intermediate level in the charge-blocking layer having a two-layer structure shown in FIG. 1; FIG. 2A shows a case where the layers 202a and 202b are formed of the same material, and FIG. 2B shows a case where respective layers 202a and 202b are formed of different materials.

In the case where the layers 202a and 202b are formed of the same material, as described above, an interface is produced and therefore, dark current can be suppressed as compared with a single-layer structure. However, if the intermediate levels (S1, S2) of respective layers 202a and 202b are present at energy positions of the same level as shown in FIG. 2A, movement of an electric charge via the intermediate levels (shown by arrows in the Figure) of respective layers 202a and 202b is allowed to occur.

Here, when the layers 202a and 202b are formed of different materials, as shown in FIG. 2B, for example, the intermediate level (S20) of the layer 202b is located at a higher energy position than the intermediate level (S10) of the layer 202a and the difference in the energy level works as a barrier, so that the movement of an electric charge can be accordingly suppressed. In this way, positions of intermediate levels in respective layers can be unfailingly dispersed by forming two layers constituting the charge-blocking layer 202 from different materials, as a result, the effect of suppressing the carrier movement via an intermediate level can be enhanced.

In FIG. 1, an example where the photoelectric conversion element has one charge-blocking layer is shown, but even in the case where in FIG. 1, a charge-blocking layer for restraining movement of an electric charge from the electrode 201 to the photoelectric conversion layer 200 when applying a voltage to the electrodes 201 and 204 is provided between the electrode 201 and the photoelectric conversion layer 200, dark current can be suppressed by forming the charge-blocking layer to have a two-layer structure and furthermore, the dark current can be more successfully suppressed by forming these two layers from different materials.

Figure 3A:
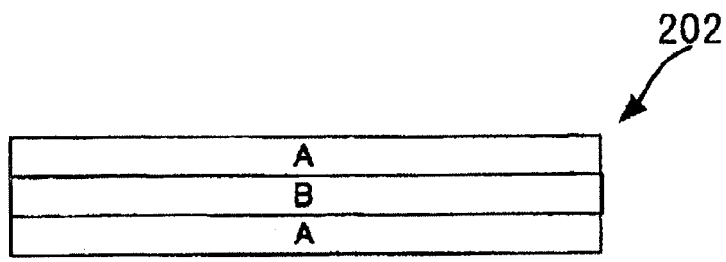
FIGS. 3A-3D are views for explaining the combination of materials for respective layers when the charge-blocking layer shown in FIG. 1 has a three-layer structure.
Figure 3B:
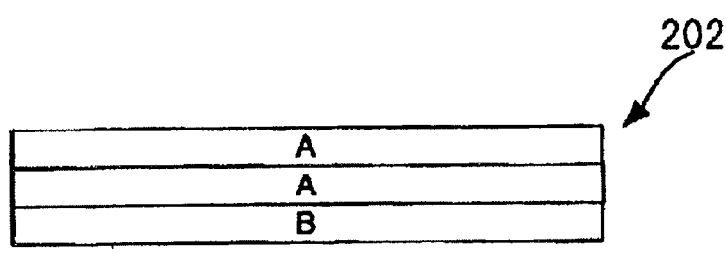
Figure 3C:
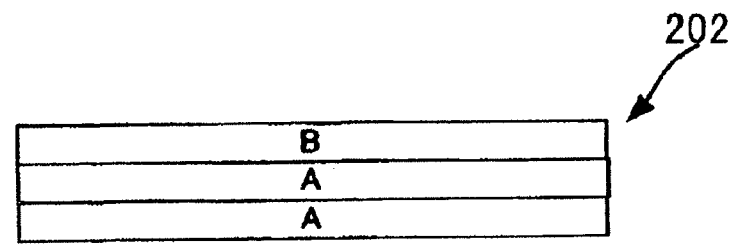
Figure 3D:
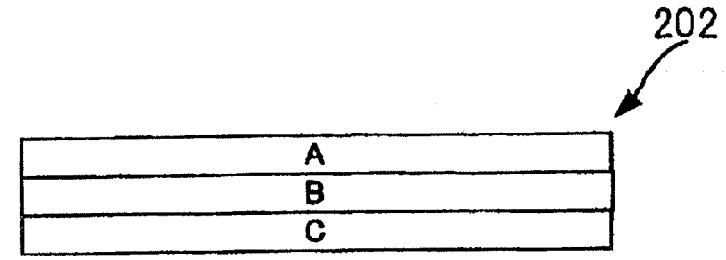

In the above, an example where the charge-blocking layer 202 has a two-layer structure is described, but the charge-blocking layer may have a structure including three or more layers. In this case, as described above, when at least two layers out of the layers constituting the charge-blocking layer are formed of different materials, a step height between intermediate levels can be unfailingly formed inside of the charge-blocking layer. For example, in the case of a charge-blocking layer having a three-layer structure, a step height may be created, as shown in FIG. 3A, by forming the lowermost layer and the uppermost layer from a material A and forming the in-between intermediate layer from a material B that is different from the material A; as shown in FIG. 3B, by forming the lowermost layer from the material B and forming the intermediate and uppermost layers from the material A; as shown in FIG. 3C, by forming the lowermost and intermediate layers from the material A and forming the uppermost layer form the material B; or, as shown in FIG. 3D, by forming the lowermost layer from a material C that is different from materials A and B, forming the intermediate layer from the material B, and forming the uppermost layer from the material A.

Figure 4:
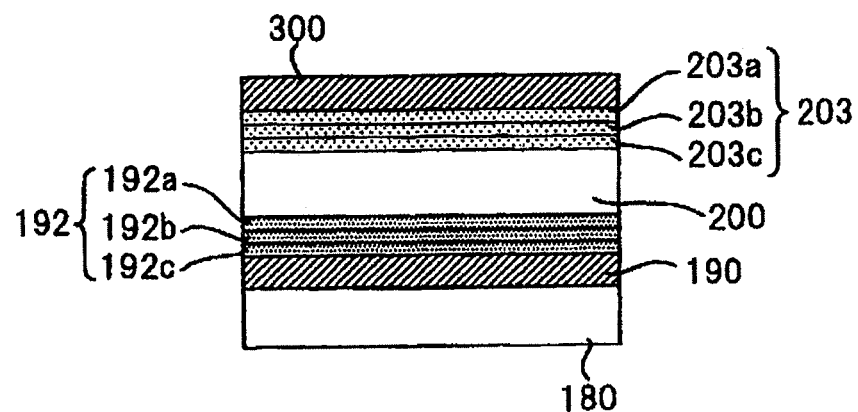
FIG. 4 is a schematic cross-sectional view of a photoelectric conversion layer having an electron-blocking layer of a three-layer structure and a hole-blocking layer of a three-layer structure.
Figure 5:
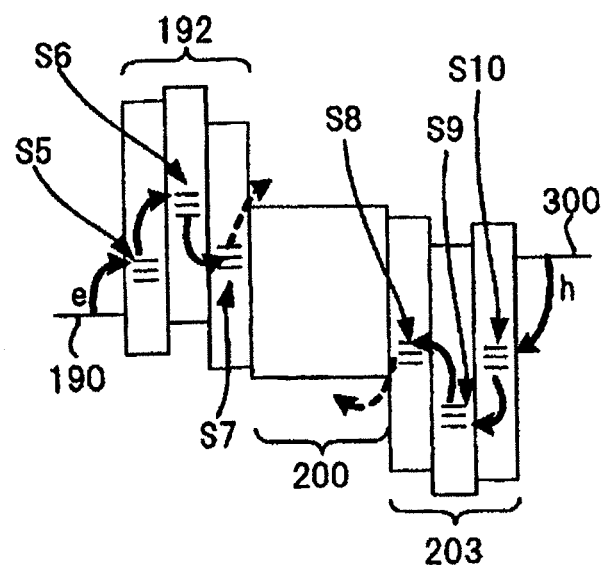
FIG. 5 is an energy diagram for explaining how the carrier moves through intermediate levels in the charge-blocking layer when a voltage is applied to the photoelectric conversion element of FIG. 4.

FIG. 4 is a schematic cross-sectional view showing another example of the photoelectric conversion element according to this embodiment (a photoelectric conversion element having an electron-blocking layer with a three-layer structure and a hole-blocking layer with a three-layer structure). FIG. 5 is an energy diagram for explaining the state of charge movement via intermediate levels in the electron-blocking layer and the hole-blocking layer when a voltage is applied to the photoelectric conversion element shown in FIG. 4.

The photoelectric conversion element shown in FIG. 4 has a structure where a pixel electrode (transparent electrode) 190 is provided on a transparent substrate 180, an electron-blocking layer 192 with a three-layer structure (with a structure where layers 192a to 192c are stacked), a photoelectric conversion layer 200 and a hole-blocking layer 203 (with a structure where layers 203a to 203c are stacked) are stacked in this order on the transparent electrode 190, and a counter electrode 300 is further provided thereon. Out of the layers 192a to 192c, at least two layers are formed of different materials. Here, materials of the layers 192a to 192c are set to be different from each other. Similarly, out of the layers 203a to 203c, at least two layers are formed of different materials. Here, materials of the layers 203a to 203c are set to be different from each other.

By virtue of such a construction, as shown in FIG. 5, the intermediate levels (S5, S6 and S7) of respective layers in the electron-blocking layer 192 differ in the energy level at the application of a voltage, and a step height therebetween works as an energy barrier, as a result, an electron becomes difficult to move. Similarly, the intermediate levels (S8, S9 and S10) of respective layers in the hole-blocking layer 203 differ in the energy level, and a step height therebetween works as an energy barrier, as a result, a hole becomes difficult to move.

With respect to stacking of a plurality of layers for the blocking layer, the effects except for the contents regarding the intermediate level are described below.

The above-described technique of shifting intermediate levels present in respective layers by stacking layers enables suppressing the dark current by "inhibiting transport of the injected charge", but formation of a plurality of layers for the blocking layer also has an effect of reducing the dark current by "suppressing injection of an electric charge from an electrode".

For suppressing the injection of an electric charge from an electrode, it is important "to make large the energy barrier between the electrode and a layer adjacent thereto" and "to homogenize the blocking layer and prevent the electrode from coming into proximity to a layer below the blocking layer (a photoelectric conversion layer)".

The former is an approach of creating an energetic injection barrier, and the latter is an approach of, in view of a physical structure, preventing an electrode material from intruding into a fine defect of the layer to allow proximity between the photoelectric conversion layer and the electrode and form a leak site.

When a structure composed of a plurality of layers is formed for the blocking layer, a layer adjoining an electrode out of the plurality of layers can be set to have an energy barrier difference between the layer and the electrode, and a layer not adjoining the electrode can be set as a uniform layer having charge transport property to prevent creation of a leak site. In this way, the functions can be divided and allocated to respective layers.

By using an inorganic material layer composed of an inorganic material as a blocking layer adjoining an electrode and using an organic material layer composed of an organic material as an underlying blocking layer (between the inorganic material layer and the photoelectric conversion layer), the dark current can be more markedly suppressed and at the same time, reading out of a signal charge cannot be inhibited.

More specifically, in FIG. 1, the layer 202a is formed as an inorganic material layer and the layer 202b is formed as an organic material layer; in FIGS. 3B and 3D, A is formed as an inorganic material layer and B is formed as an organic material layer; in FIG. 3C, B is formed as an inorganic material layer and A is formed as an organic material layer; or in FIG. 4, layers 192c and 203a are formed as inorganic material layers and layers 192a, 192b, 203b and 203c are formed as organic material layers, whereby the dark current is more significantly suppressed and at the same time, reading out of a signal charge can be prevented from being inhibited.

As for the inorganic material constituting the inorganic material layer, it is preferred to use any of Si, Mo, Ce, Li, Hf, Ta, Al, Ti, Zn, W and Zr. Also, an oxide is preferably used as the inorganic material. As for the oxide, use of SiO is particularly preferred.

The inorganic material layer needs to have such an ionization energy Ip as to generate an energy barrier to the work function of an adjacent electrode so as to prevent injection of an electric charge from the electrode, and greater Ip is preferred. However, when the charge-blocking layer is composed of this inorganic material layer alone, if the layer thickness is small, a leak site is produced between the electrode and the photoelectric conversion layer and an effect of preventing injection is not sufficiently obtained, whereas if the layer thickness is large, charge transport property is decreased and a signal charge can be hardly read out.

Therefore, it is important to additionally provide an organic material layer as an underlying layer of the inorganic material layer. The organic material layer is a uniform layer having charge transport property high enough to transport a signal charge generated in the photoelectric conversion layer and is preferably formed of a material with less carriers giving rise to a dark current produced from the material.

By employing such a construction, a uniform and thick blocking layer can be obtained without increasing the dark current derived from the blocking layer and decreasing the photoelectric conversion efficiency, and the dark current can be suppressed by the combinational effect with the inorganic material layer.

The candidate for the organic material constituting the hole-blocking layer and electron-blocking layer is described below.

(Hole Blocking Layer)

For the hole-blocking layer, an electron-accepting organic material can be used.

Examples of the electron-accepting material which can be used include an oxadiazole derivative such as 1,3-bis(4-tert-butylphenyl-1,3,4-oxadiazolyl)phenylene (OXD-7); an anthraquinodimethane derivative; a diphenylquinone derivative; a bathocuproine, a bathophenanthroline and a derivative thereof; a triazole compound; a tris(8-hydroxyquinolinato) aluminum complex; a bis(4-methyl-8-quinolinato)aluminum complex; a distyrylarylene derivative; and a silole compound. Also, a material having sufficient electron transport property may be used even if it is not an electron-accepting organic material. That is, a porphyrin-based compound, a styryl-based compound such as DCM (4-dicyanomethylene-2-methyl-6-(4-(dimethylaminostyryl))-4H pyran), and a 4H pyran-based compound can be used.

The thickness of the hole-blocking layer is preferably from 10 to 200 nm, more preferably from 30 to 150 nm, still more preferably from 50 to 100 nm, because if this thickness is too small, the effect of suppressing a dark current is decreased, whereas if it is excessively large, the photoelectric conversion efficiency is reduced.

Specific examples of the candidate for the hole-blocking material include the materials indicated by HB-1 to HB-5 and BCP below. In the following, Ea stands for the electron affinity of the material, and Ip stands for the ionization potential of the material.

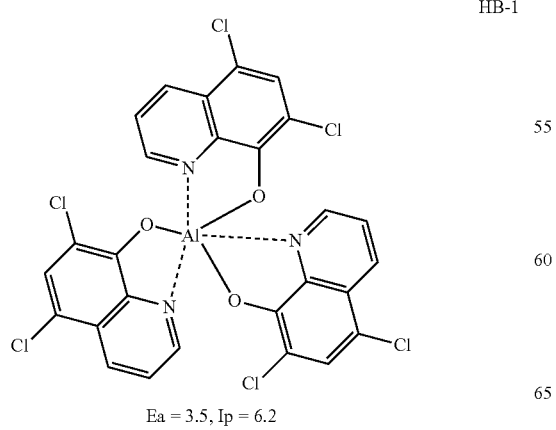

HB-1

Ea = 3.5, Ip = 6.2

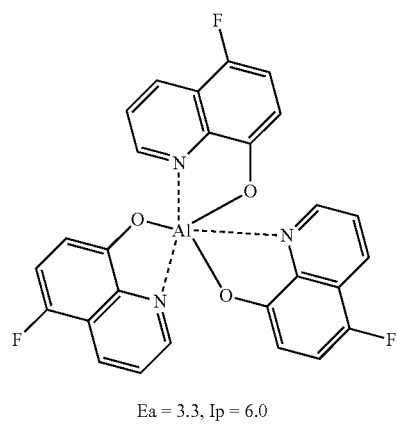

HB-2

Ea = 3.3, Ip = 6.0

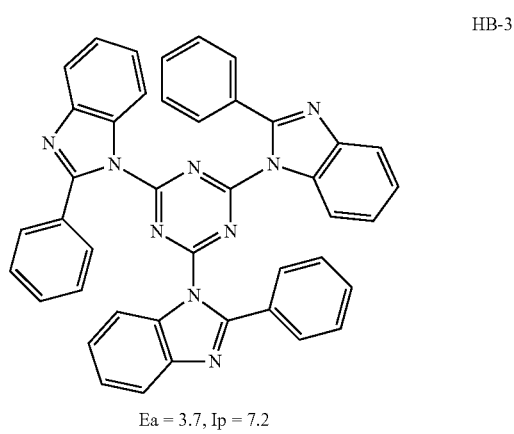

HB-3

Ea = 3.7, Ip = 7.2

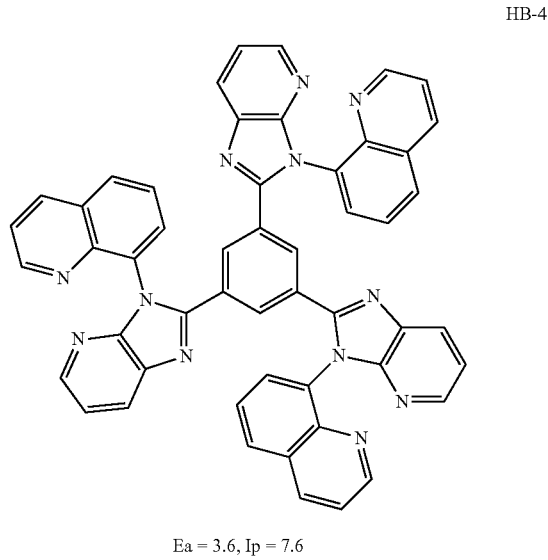

HB-4

Ea = 3.6, Ip = 7.6

HB-5

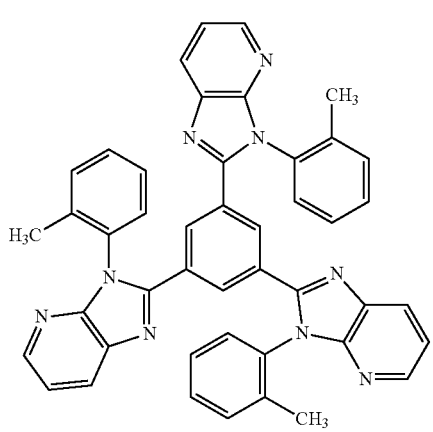

Ea = 3.6, Ip = 7.6

BCP

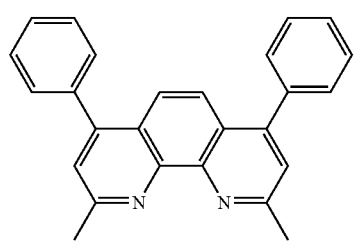

Ea = 3.2, Ip = 6.7

The latitude in selection of the material practically used for the hole-blocking layer is defined by the material of the adjacent electrode and the material of the adjacent photoelectric conversion layer. Those having an ionization potential (Ip) 1.3 eV or more greater than the work function (Wf) of the material of the adjacent electrode and having an electron affinity (Ea) equal to or greater than Ea of the material of the adjacent photoelectric conversion layer are preferred.

(Electron Blocking Layer)

For the electron-blocking layer, an electron-donating organic material can be used. Specifically, examples of the low molecular material which can be used include an aromatic diamine compound such as N,N-bis(3-methylphenyl)-(1,1'-biphenyl)-4,4'-diamine (TPD) and 4,4'-bis[N-(naphthyl)-N-phenylamino]biphenyl (α-NPD), oxazole, oxadiazole, triazole, imidazole, imidazolone, a stilbene derivative, a pyrazolone derivative, tetrahydroimidazole, a polyarylalkane, 4,4',4''-tris(N-(3-methylphenyl)N-phenylamino)triphenylamine (m-MTDATA), a porphyrin compound such as porphin, copper tetraphenylporphin, phthalocyanine, copper phthalocyanine and titanium phthalocyanine oxide, a triazole derivative, an oxadiazole derivative, an imidazole derivative, a polyarylalkane derivative, a pyrazoline derivative, a pyrazolone derivative, a phenylenediamine derivative, an anilamine derivative, an amino-substituted chalcone derivative, an oxazole derivative, a styrylanthracene derivative, a fluorenone derivative, a hydrazone derivative, and a silazane derivative. As for the polymer material, a polymer such as phenylenevinylene, fluorene, carbazole, indole, pyrene, pyrrole, picolin, thiophene, acetylene and diacetylene, or a derivative thereof may be used. A compound having a sufficient hole transport property may be used even if it is not an electron-donating compound.

The thickness of the electron-blocking layer is preferably from 10 to 200 nm, more preferably from 30 to 150 nm, still more preferably from 50 to 100 nm, because if this thickness is too small, the effect of suppressing a dark current is decreased, whereas if it is excessively large, the photoelectric conversion efficiency is reduced.

Specific examples of the candidate for the electron-blocking material include the materials indicated by EB-1 to EB-5, TPD and m-MTDATA below.

EB-1

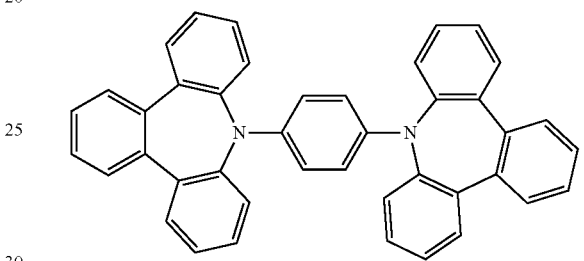

Ea = 1.9, Ip = 4.9

EB-2

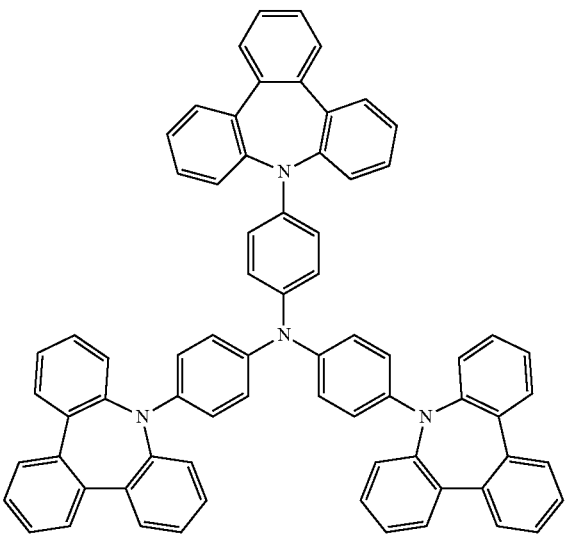

Ea = 1.7, Ip = 4.7

EB-3

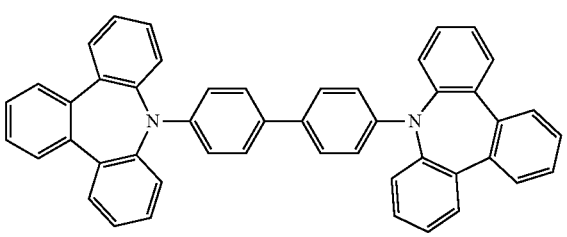

Ea = 1.9, Ip = 5.2

EB-4

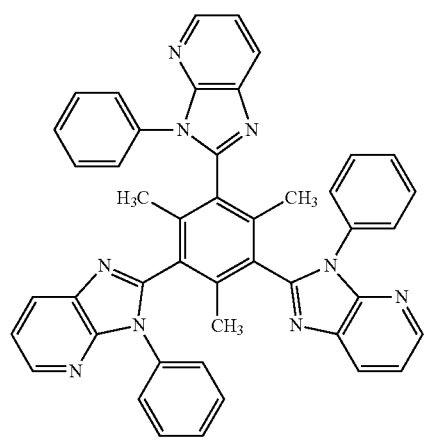

Ea = 2.1, Ip 5.4

EB-5

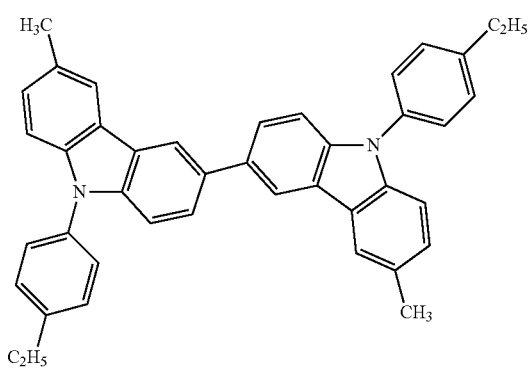

Ea = 2.1, Ip = 5.8

TPD

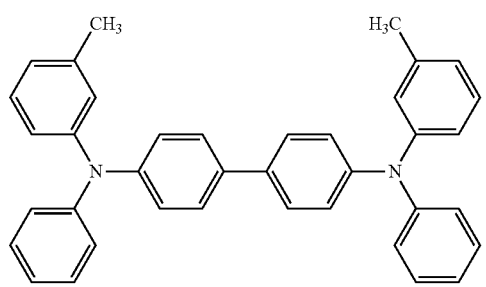

Ea = 2.3, Ip = 5.5 m-MTDATA

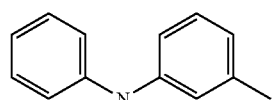

Ea = 1.9, Ip = 5.1

The latitude in selection of the material practically used in the electron-blocking layer is defined by the material of the adjacent electrode and the material of the adjacent photoelectric conversion layer. Those having an electron affinity (Ea) 1.3 eV or more greater than the work function (Wf) of the material of the adjacent electrode and having an ionization potential (Ip) equal to or smaller than Ip of the material of the adjacent photoelectric conversion layer are preferred.

According to this embodiment, the charge-blocking layer is formed to have a multiple layer structure without forming a conventionally employed single-layer charge-blocking layer, whereby injection of a carrier into the photoelectric conversion layer from the electrode when applying an external voltage can be suppressed and the photocurrent/dark current ratio of the photoelectric conversion element can be greatly enhanced.

(Second Embodiment)

In the second embodiment, a photoelectric conversion element having a charge-blocking layer with a multiple layer structure is specifically described by referring to FIGS. 6 to 11.

The charge-blocking layer includes "a hole-blocking layer" working as a high barrier to the injection of a hole from the adjacent electrode and exhibiting a high transport ability for an electron that is a photocurrent carrier, and "an electron-blocking layer" working as a high barrier to the injection of an electron from the adjacent electrode and exhibiting a high transport ability for a hole that is a photocurrent carrier. In an organic light-emitting element and the like, as described in JP-A-11-339966 and JP-A-2002-329582, a blocking layer using an organic material is already employed for preventing a carrier from penetrating through a light-emitting layer, but by inserting such an organic blocking layer between an electrode and a photoelectric conversion layer in a photoelectric conversion part, the photoelectric conversion efficiency or response speed can be enhanced without incurring reduction in the S/N ratio when an external voltage is applied.

As for the material used in the hole-blocking layer, those having an ionization potential not less than the work function of the material of the adjacent electrode and having an electron affinity not less than the electron affinity of the material of the adjacent photoelectric conversion layer are used. As for the material used in the electron-blocking layer, those having an electron affinity not less than the work function of the material of the adjacent electrode and having an ionization potential not less than the ionization potential of the material of the adjacent photoelectric conversion layer are used. Specific examples thereof are the same as those described in the first embodiment.

The structure of the photoelectric conversion element having a photoelectric conversion part containing such a charge-blocking layer is specifically described below.

First, the structure having a hole-blocking layer is described.

Figure 6:
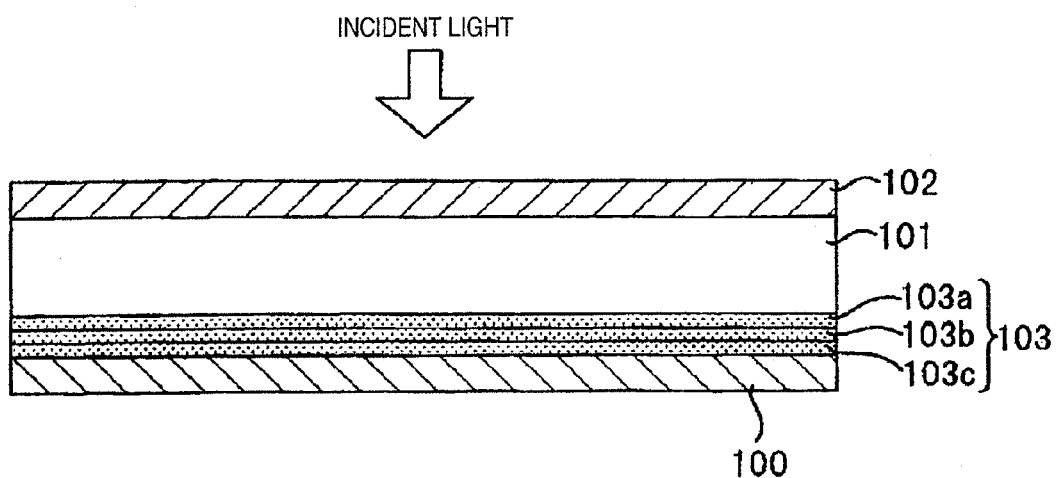
FIG. 6 is a schematic cross-sectional view showing a rough construction of a photoelectric conversion element according to an exemplary embodiment.

FIG. 6 is a schematic cross-sectional view showing a rough construction of the photoelectric conversion element of this embodiment.

The photoelectric conversion element shown in FIG. 6 is configured to contain a pair of opposing electrodes 100 and 102, and a photoelectric conversion part including a photoelectric conversion layer 101 composed of an organic material and formed between the electrode 100 and the electrode 102 and a hole-blocking layer 103 formed between the photoelectric conversion layer 101 and the electrode 100.

As shown in the Figure, the hole-blocking layer 103 has a three-layer structure in which material layers 103a to 103c are stacked. As described above, at least two layers out of the material layers 103a to 103c are preferably formed from different materials. The hole-blocking layer 103 is sufficient if it has a multiple layer structure.

In the photoelectric conversion element shown in FIG. 6, light becomes incident from above the electrode 102 and therefore, the electrode 102 serves as the electrode on the light incident side. Also, in the photoelectric conversion element shown in FIG. 6, a voltage is applied to the electrodes 100 and 102 so that out of electric charges (hole and electron) generated in the photoelectric conversion layer 101, a hole can be moved to the electrode 102 and an electron can be moved to the electrode 100 (that is, the electrode 100 is used as the electrode for electron extraction).

As for the material of the hole-blocking layer 103, those having an ionization potential not less than the work function of the material of the adjacent electrode 100 and having an electron affinity not less than the electron affinity of the material of the adjacent photoelectric conversion layer 101 are used. By providing this hole-blocking layer 103 between the electrode 100 and the photoelectric conversion layer 101, not only an electron generated in the photoelectric conversion layer 101 when applying a voltage to the electrodes 100 and 102 can be moved to the electrode 100, but also injection of a hole into the photoelectric conversion layer 101 from the electrode 100 can be suppressed. In addition, by virtue of the three-layer structure of the hole-blocking layer 103, the effect of suppressing the injection of a hole from the electrode 100 into the photoelectric conversion layer 101 via an intermediate level is enhanced.

The thickness of the entire hole-blocking layer 103 is most preferably from 10 to 200 nm, because an electron generated in the photoelectric conversion layer 101 needs to be moved to the electrode 100 and if the thickness above is excessively large, the external quantum efficiency decreases, though the blocking property may be enhanced.

Also, the value obtained by dividing the voltage externally applied to the electrodes 100 and 102 by the sum total of the thickness of the hole-blocking layer 103 and the thickness of the photoelectric conversion layer 101 (corresponding to the distance between the electrode 100 and the electrode 102) is preferably from $1.0 \times 10^5$ to $1.0 \times 10^7$ V/cm.

Furthermore, in the photoelectric conversion element shown in FIG. 6, light needs to be made incident into the photoelectric conversion layer 101 and therefore, the electrode 102 is preferably a transparent electrode. The term "transparent" as used herein means to transmit 80% or more of visible light at a wavelength of about 420 to about 660 nm.

In the photoelectric conversion element shown in FIG. 6, as described later, light needs to be transmitted to below the electrode 100 in some cases. Therefore, the electrode 100 is also preferably a transparent electrode and the hole-blocking layer 103 is also preferably transparent.

Figure 7:
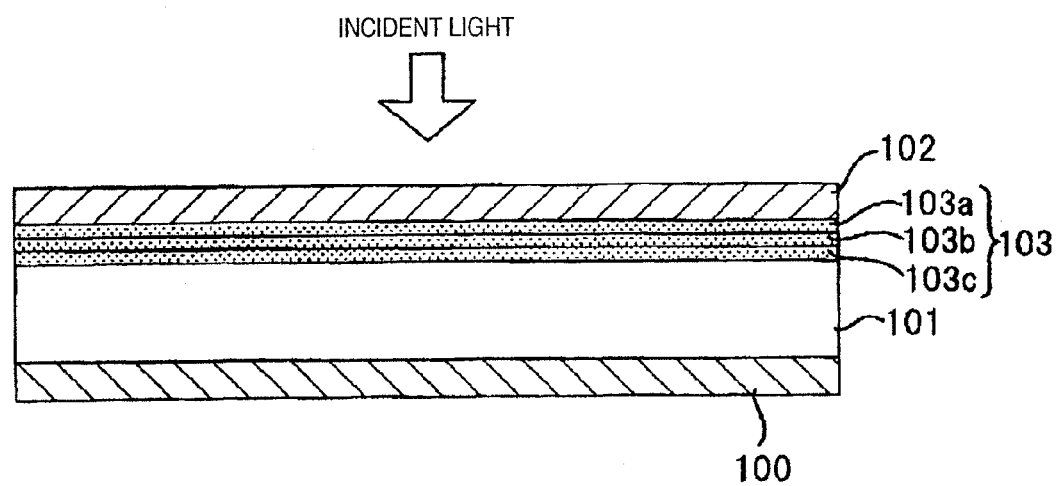
FIG. 7 is a schematic cross-sectional view showing a modified example of the photoelectric conversion element in a structure shown in FIG. 6.

FIG. 7 is a schematic cross-sectional view showing a modified example of the photoelectric conversion element shown in FIG. 6. In the photoelectric conversion element as shown in FIG. 6, in the case of applying a voltage to the electrodes 100 and 102 so that out of electric charges (hole and electron) generated in the photoelectric conversion layer 101, an electron can be moved to the electrode 102 and a hole can be moved to the electrode 100 (that is, when the electrode 102 is used as the electrode for electron extraction), there may take a construction where as shown in FIG. 7, a hole-blocking layer 103 (having a three-layer structure in which material layers 103a to 103c are stacked) is provided between the electrode 102 and the photoelectric conversion layer 101. In this case, the hole-blocking layer 103 needs to be transparent. By such a construction, a dark current can be suppressed.

Incidentally, by taking a construction where an inorganic material layer is disposed on the electrode interface and an organic material layer is disposed between the inorganic material layer and the photoelectric conversion layer, for example, a construction where in FIG. 6, the material layer 103c is a layer composed of an inorganic material and the material layers 103a and 103b are a layer composed of an organic material or where in FIG. 7, the material layer 103a is a layer composed of an inorganic material and the material layers 103b and 103c are a layer composed of an organic material, as described above, the dark current can be more significantly suppressed and at the same time, reading out of a signal charge can be prevented from being inhibited.

Next, the construction having an electron-blocking layer is described.

Figure 8:
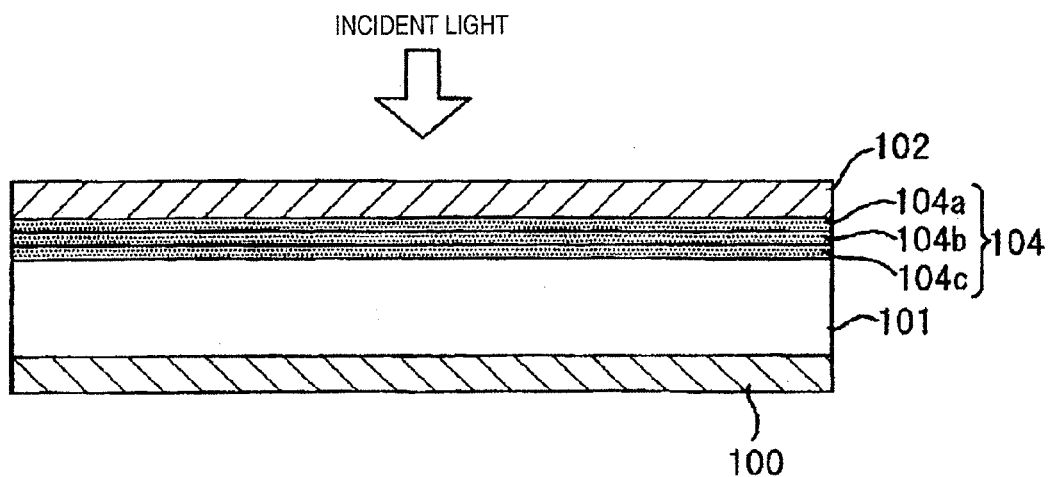
FIG. 8 is a schematic cross-sectional view showing a rough construction of another example of a photoelectric conversion element according to an exemplary embodiment.

FIG. 8 is a schematic cross-sectional view showing a rough construction of another example (an example having an electron-blocking layer) of the photoelectric conversion element of this embodiment. In FIG. 8, the same structures as in FIG. 6 are indicated by the same numerals of reference.

The photoelectric conversion element shown in FIG. 8 is configured to contain a pair of opposing electrodes 100 and 102, and a photoelectric conversion part including a photoelectric conversion layer 101 formed between the electrode 100 and the electrode 102 and an electron-blocking layer 104 (having a three-layer structure in which material layers 104a to 104c are stacked) formed between the photoelectric conversion layer 101 and the electrode 102. As described above, at least two layers out of the material layers 104a to 104c are preferably composed of different materials. The electron-blocking layer 104 is sufficient if it has a multiple layer structure.

In the photoelectric conversion element shown in FIG. 8, light becomes incident from above the electrode 102 and therefore, the electrode 102 serves as the electrode on the light incident side. Also, in the photoelectric conversion element shown in FIG. 8, a voltage is applied to the electrodes 100 and 102 so that out of electric charges (hole and electron) generated in the photoelectric conversion layer 101, a hole can be moved to the electrode 102 and an electron can be moved to the electrode 100 (that is, the electrode 100 is used as the electrode for electron extraction).

As for the material of the electron-blocking layer 104, those having an electron affinity not more than the work function of the material of the adjacent electrode 102 and having an ionization potential not more than the ionization potential of the material of the adjacent photoelectric conversion layer 101 are used. By providing this electron-blocking layer 104 between the electrode 102 and the photoelectric conversion layer 101, not only a hole generated in the photoelectric conversion layer 101 when applying a voltage to the electrodes 100 and 102 can be moved to the electrode 102, but also injection of an electron into the photoelectric conversion layer 101 from the electrode 102 can be prevented.

The thickness of the electron-blocking layer 104 is most preferably from 10 to 200 µm, because a hole generated in the photoelectric conversion layer 101 needs to be moved to the electrode 102 and if the thickness above is excessively large, the external quantum efficiency decreases, though the blocking property may be enhanced.

Also, the value obtained by dividing the voltage externally applied to the electrodes 100 and 102 by the sum total of the thickness of the electron-blocking layer 104 and the thickness of the photoelectric conversion layer 101 (corresponding to the distance between the electrode 100 and the electrode 102) is preferably from $1.0 \times 10^5$ to $1.0 \times 10^7$ V/cm.

Furthermore, in the photoelectric conversion element shown in FIG. 8, light needs to be made incident into the photoelectric conversion layer 101 and therefore, the electrode 102 and the electron-blocking layer 104 are preferably transparent.

In the photoelectric conversion element shown in FIG. 8, as described later, light needs to be transmitted to below the electrode 100 in some cases. Therefore, the electrode 100 is also preferably a transparent electrode.

Figure 9:
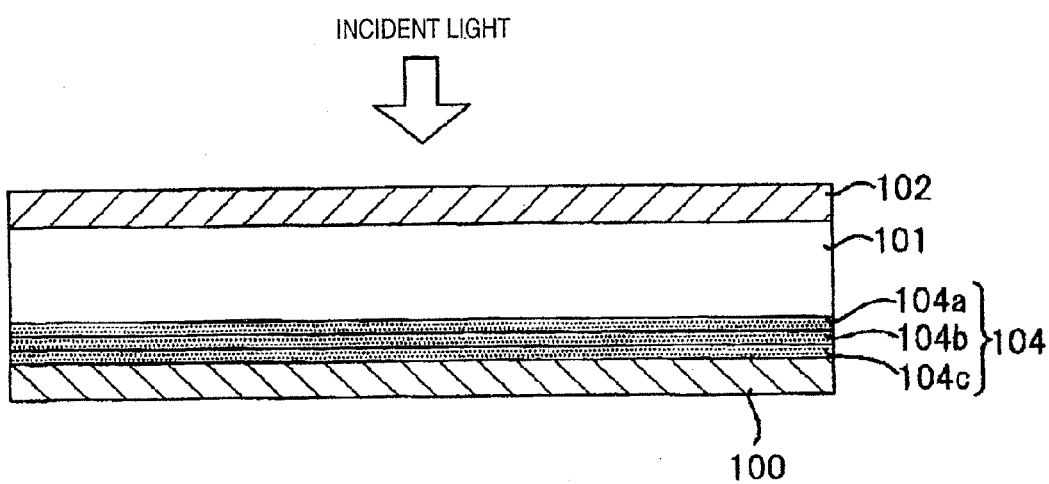
FIG. 9 is a schematic cross-sectional view showing a modified example of the photoelectric conversion element shown in FIG. 8.

FIG. 9 is a schematic cross-sectional view showing a modified example of the photoelectric conversion element shown in FIG. 8. In the photoelectric conversion element as shown in FIG. 8, in the case of applying a voltage to the electrodes 100 and 102 so that out of electric charges (hole and electron) generated in the photoelectric conversion layer 101, an electron can be moved to the electrode 102 and a hole can be moved to the electrode 100 (that is, when the electrode 102 is used as the electrode for electron extraction), there may take a construction where as shown in FIG. 9, an electron-blocking layer 104 is provided between the electrode 100 and the photoelectric conversion layer 101. By such a construction, the dark current can be suppressed.

Incidentally, by taking a construction where an inorganic material layer is disposed on the electrode interface and an organic material layer is disposed between the inorganic material layer and the photoelectric conversion layer, for example, a construction where in FIG. 8, the material layer 104a is a layer composed of an inorganic material and the material layers 104b and 104c are a layer composed of an organic material or where in FIG. 9, the material layer 104c is a layer composed of an inorganic material and the material layers 104a and 104b are a layer composed of an organic material, as described above, the dark current can be more significantly suppressed and at the same time, reading out of a signal charge can be prevented from being inhibited.

The construction having an electron-blocking layer and a hole-blocking layer is described below.

Figure 10:
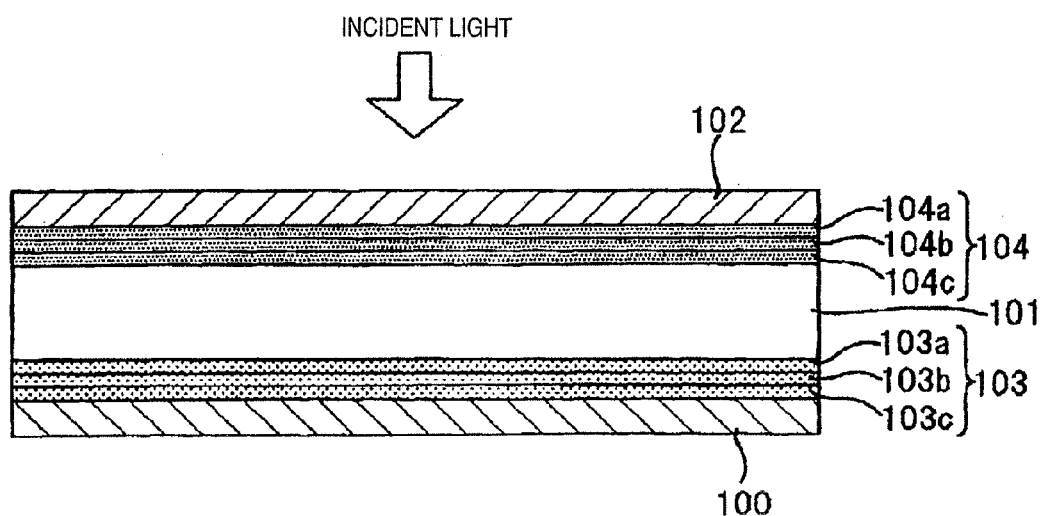
FIG. 10 is a schematic cross-sectional view showing a rough construction of another example of a photoelectric conversion element according to an exemplary embodiment.

FIG. 10 is a schematic cross-sectional view showing a rough construction of another example of the photoelectric conversion element (an example having a photoelectric conversion part containing both an electron-blocking layer and a hole-blocking layer) of this embodiment. In FIG. 10, the same structures as in FIGS. 6 and 8 are indicated by the same numerals of reference.

The photoelectric conversion element shown in FIG. 10 is configured to contain a pair of opposing electrodes 100 and 102, and a photoelectric conversion part including a photoelectric conversion layer 101 formed between the electrode 100 and the electrode 102, a hole-blocking layer 103 (103a to 103c) formed between the photoelectric conversion layer 101 and the electrode 100, and an electron-blocking layer 104 (104a to 104c) formed between the photoelectric conversion layer 101 and the electrode 102.

In the photoelectric conversion element shown in FIG. 10, light becomes incident from above the electrode 102 and therefore, the electrode 102 serves as the electrode on the light incident side. Also, in the photoelectric conversion element shown in FIG. 10, a voltage is applied to the electrodes 100 and 102 so that out of electric charges (hole and electron) generated in the photoelectric conversion layer 101, a hole can be moved to the electrode 102 and an electron can be moved to the electrode 100 (that is, the electrode 100 is used as the electrode for electron extraction).

Furthermore, the value obtained by dividing the voltage externally applied to the electrodes 100 and 102 by the sum total of the thickness of the hole-blocking layer 103, the thickness of the electron-blocking layer 104 and the thickness of the photoelectric conversion layer 101 (corresponding to the distance between the electrode 100 and the electrode 102) is preferably from $1.0 \times 10^5$ to $1.0 \times 10^7$ V/cm.

According to such a construction, injection of an electric charge from both the electrodes 100 and 102 can be restrained, and the dark current can be effectively suppressed.

Figure 11:
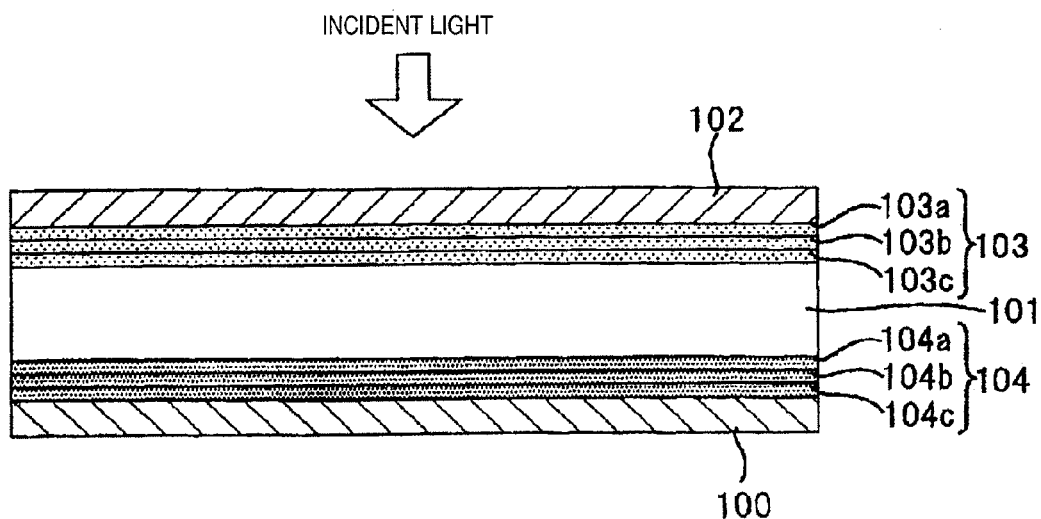
FIG. 11 is a schematic cross-sectional view showing a modified example of the photoelectric conversion element shown in FIG. 10.

FIG. 11 is a schematic cross-sectional view showing a modified example of the photoelectric conversion element shown in FIG. 10.

In the photoelectric conversion element as shown in FIG. 10, in the case of applying a voltage to the electrodes 100 and 102 so that out of electric charges (hole and electron) generated in the photoelectric conversion layer 101, an electron can be moved to the electrode 102 and a hole can be moved to the electrode 100 (that is, when the electrode 102 is used as the electrode for electron extraction), there may take a construction where as shown in FIG. 11, an electron-blocking layer 104 is provided between the electrode 100 and the photoelectric conversion layer 101 and a hole-blocking layer 103 is provided between the electrode 102 and the photoelectric conversion layer 101.

By such a construction, injection of an electric charge from both the electrodes 100 and 102 can be restrained, and the dark current can be effectively suppressed.

(Third Embodiment)

A construction example of a solid-state imaging device using the photoelectric conversion element having a structure shown in FIG. 11 is described below. In the following, description is made by referring to FIGS. 12 to 16. In each of these Figures, similarly to the above-described embodiments, both the hole-blocking layer and the electron-blocking layer have a multiple layer structure. However, in FIGS. 12 to 16, for drawing convenience, each blocking layer is not illustrated in particular as being divided into a plurality of layers.

Figure 12:
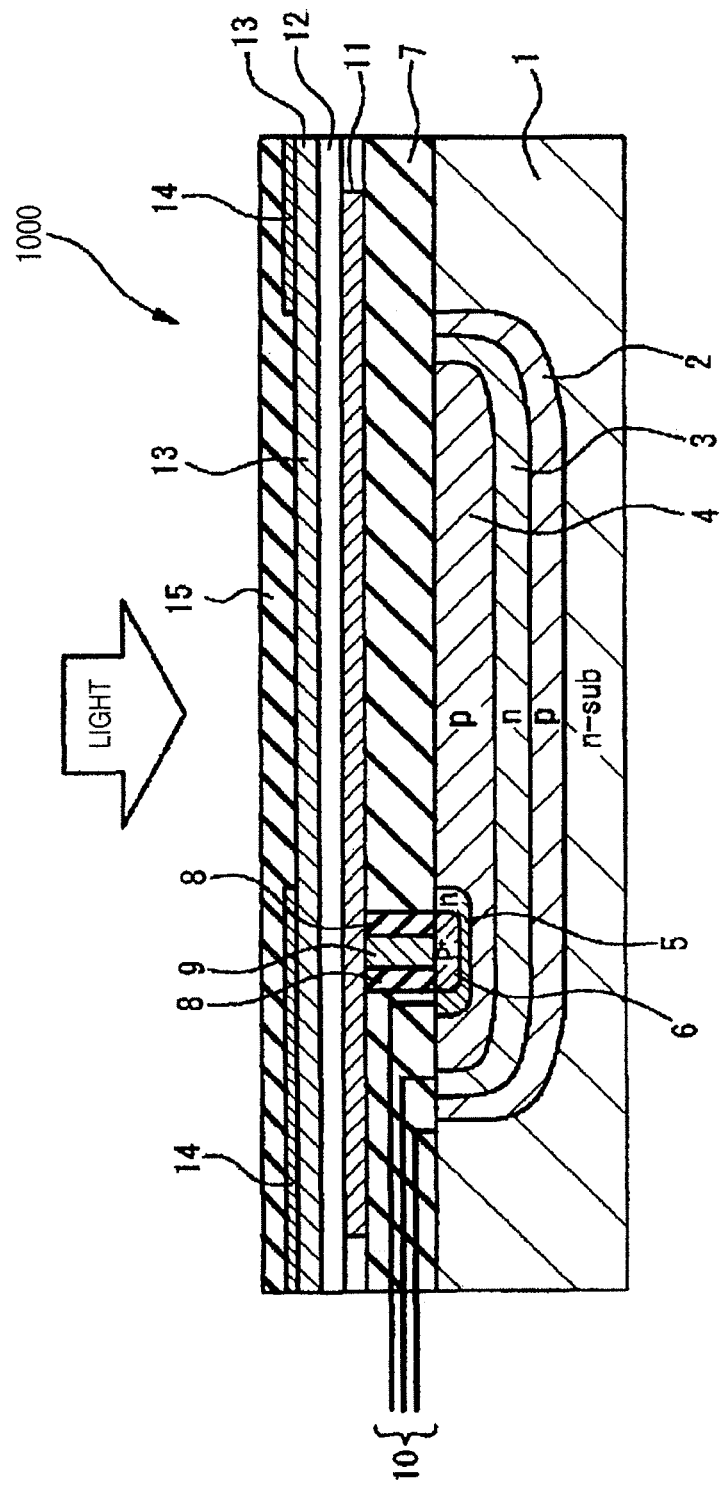
FIG. 12 is a schematic cross-sectional view of one pixel portion of a solid-state imaging device for explaining a third exemplary embodiment of the present invention.
Figure 13:
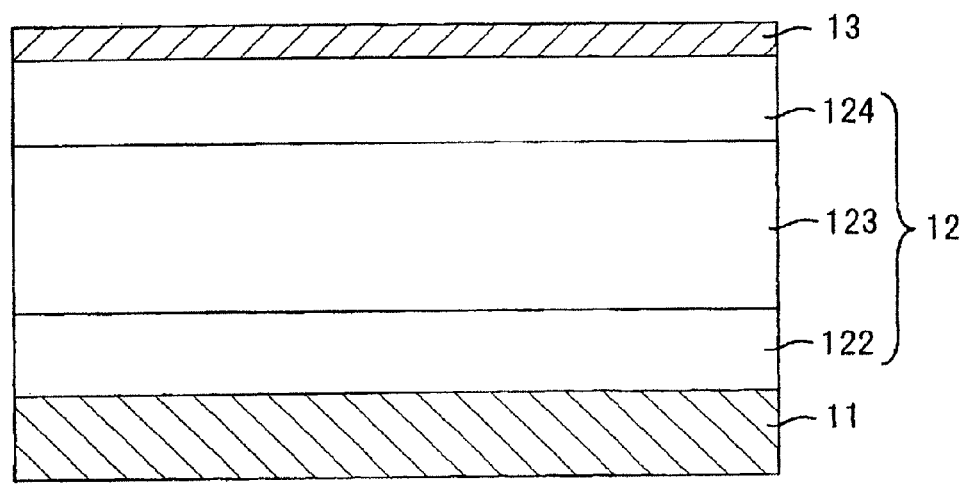
FIG. 13 is a schematic cross-sectional view of the intermediate layer shown in FIG. 12.

FIG. 12 is a schematic cross-sectional view of one pixel portion of a solid-state imaging device for explaining the third embodiment of the present invention. FIG. 13 is a schematic cross-sectional view of the intermediate layer shown in FIG. 12. In this solid-state imaging device, a large number of pixels, one of which is shown in FIG. 12, are disposed in an array manner in the same plane, and one-pixel data of the image data can be produced by the signal obtained from this one pixel.

One pixel of the solid-state imaging device shown in FIG. 12 is configured to contain an n-type silicon substrate 1, a transparent insulating layer 7 formed on the n-type silicon substrate 1 and a photoelectric conversion part including a first electrode layer 11 formed on the insulating layer 7, an intermediate layer 12 formed on the first electrode layer 11 and a second electrode layer 13 formed on the intermediate layer 12, where a light-shielding layer 14 having provided therein an opening is formed on the photoelectric conversion part and the light-receiving region of the intermediate layer 12 is limited by the light-shielding layer 14. Also, a transparent insulating layer 15 is formed on the light-shielding layer 14 and the second electrode layer 13. Incidentally, for the photoelectric conversion part formed on the insulating layer 7, the construction of the photoelectric conversion element described in the first or second embodiment can be employed.

As shown in FIG. 13, the intermediate layer 12 is configured such that a subbing cum electron-blocking layer 122, a photoelectric conversion layer 123 and a hole-blocking cum buffering layer 124 are stacked in this order on the first electrode layer 11. As described in the first or second embodiment, the electron-blocking layer 122 and the hole-blocking cum buffering layer 124 each is constructed by a plurality of layers.

The photoelectric conversion layer 123 is composed of a material having such properties as to generate electric charges including an electron and a hole in response to light incident from above the second electrode layer 13, render electron mobility smaller than hole mobility, and generate a larger number of electrons and holes in the vicinity of the second electrode layer 13 than in the vicinity of the first electrode layer 11. An organic material is representative of such a material for the photoelectric conversion layer. In the construction of FIG. 12, a material that absorbs green light and accordingly generates an electron and a hole is used for the photoelectric conversion layer 123. The photoelectric conversion layer 123 can be shared by all pixels and therefore, this layer may be a layer in one-sheet construction and need not be divided for each pixel.

The photoelectric conversion layer 123 can be preferably realized by the combination of materials of the present invention. When other organic materials are contained in the photoelectric conversion layer 123, the layer preferably contains at least either an organic p-type semiconductor or an organic n-type semiconductor. For each of the organic p-type semiconductor and the n-type semiconductor, any of a quinacridone derivative, a naphthalene derivative, an anthracene derivative, a phenanthrene derivative, a tetracene derivative, a pyrene derivative, a perylene derivative and a fluoranthene derivative may be preferably used in particular.

The organic p-type semiconductor (compound) is a donor organic semiconductor (compound) and indicates an organic compound having a property of readily donating an electron, mainly typified by a hole-transporting organic compound. More specifically, this is an organic compound having a smaller ionization potential when two organic materials are used in contact. Accordingly, the donor organic compound may be any organic compound as long as it is an organic compound having an electron donating property. Examples of the compound which can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (e.g., naphthalene derivative, anthracene derivative, phenanthrene derivative, tetracene derivative, pyrene derivative, perylene derivative, fluoranthene derivative), and a metal complex having a nitrogen-containing heterocyclic compound as a ligand. The donor organic semiconductor is not limited to these compounds and, as described above, any organic compound may be used as long as its ionization potential is smaller than that of the organic compound used as an n-type (acceptor) compound.

The organic n-type semiconductor (compound) is an acceptor organic semiconductor (compound) and indicates an organic compound having a property of readily accepting an electron, mainly typified by an electron-transporting organic compound. More specifically, this is an organic compound having a larger electron affinity when two organic compounds are used in contact. Accordingly, as for the acceptor organic compound, any organic compound can be used as long as it is an organic compound having an electron accepting property. Examples thereof include a fused aromatic carbocyclic compound (e.g., naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine), a polyarylene compound, a fluorene compound, a cyclopentadiene compound, a silyl compound, and a metal complex having a nitrogen-containing heterocyclic compound as a ligand. The acceptor organic semiconductor is not limited to these compounds and, as described above, any organic compound may be used as long as its electron affinity is larger than the organic compound used as the donor organic compound.

As for the p-type organic dye or n-type organic dye, any dye may be used, but preferred examples thereof include a cyanine dye, a styryl dye, a hemicyanine dye, a merocyanine dyes (including zero-methine merocyanine (simple merocyanine)), a trinuclear merocyanine dye, a tetranuclear merocyanine dye, a rhodacyanine dye, a complex cyanine dye, a complex merocyanine dye, an allopolar dye, an oxonol dye, a hemioxonol dye, a squarylium dye, a croconium dye, an azamethine dye, a coumarin dye, an arylidene dye, an anthraquinone dye, a triphenylmethane dye, an azo dye, an azomethine dye, a spiro compound, a metallocene dye, a fluorenone dye, a flugide dye, a perylene dye, a phenazine dye, a phenothiazine dye, a quinone dye, an indigo dye, a diphenylmethane dye, a polyene dye, an acridine dye, an acridinone dye, a diphenylamine dye, a quinacridone dye, a quinophthalone dye, a phenoxazine dye, a phthaloperylene dye, a porphyrin dye, a chlorophyll dye, a phthalocyanine dye, a metal complex dye, and a fused aromatic carboxylic dye (e.g., naphthalene derivative, anthracene derivative, phenanthrene derivative, tetracene derivative, pyrene derivative, perylene derivative, fluoranthene derivative).

The metal complex compound is described below. The metal complex compound is a metal complex having at least one ligand containing a nitrogen, oxygen or sulfur atom coordinated to a metal. The metal ion in the metal complex is not particularly limited but is preferably beryllium ion, magnesium ion, aluminum ion, gallium ion, zinc ion, indium ion or tin ion, more preferably beryllium ion, aluminum ion, gallium ion or zinc ion, still more preferably aluminum ion or zinc ion. As for the ligand contained in the metal complex, various ligands are known, but examples thereof include ligands disclosed in H. Yersin, *Photochemistry and Photophysics of Coordination Compounds*, Springer-Verlag (1987), and Akio Yamamoto, *Yuki Kinzoku Kagaku-Kiso to Oyo-* (*Organic Metal Chemistry-Foundation and Application-*), Shokabo (1982).

The ligand is preferably a nitrogen-containing heterocyclic ligand (preferably having a carbon number of 1 to 30, more preferably from 2 to 20, still more preferably from 3 to 15; which may be a monodentate ligand or a bidentate or greater ligand and is preferably a bidentate ligand, such as pyridine ligand, bipyridyl ligand, quinolinol ligand, hydroxyphenylazole ligand (e.g., hydroxyphenylbenzimidazole ligand, hydroxyphenylbenzoxazole ligand, hydroxyphenylimidazole ligand)), an alkoxy ligand (preferably having a carbon number of 1 to 30, more preferably from 1 to 20, still more preferably from 1 to 10, such as methoxy, ethoxy, butoxy and 2-ethylhexyloxy), an aryloxy ligand (preferably having a carbon number of 6 to 30, more preferably from 6 to 20, still more preferably from 6 to 12, such as phenyloxy, 1-naphthyloxy, 2-naphthyloxy, 2,4,6-trimethylphenyloxy and 4-biphenyloxy), a heteroaryloxy ligand (preferably having a carbon number of 1 to 30, more preferably from 1 to 20, still more preferably from 1 to 12, such as pyridyloxy, pyrazyloxy, pyrimidyloxy and quinolyloxy), an alkylthio ligand (preferably having a carbon number of 1 to 30, more preferably from 1 to 20, still more preferably from 1 to 12, such as methylthio and ethylthio), an arylthio ligand (preferably having a carbon number of 6 to 30, more preferably from 6 to 20, still more preferably from 6 to 12, such as phenylthio), a heterocyclic ring-substituted thio ligand (preferably having a carbon number of 1 to 30, more preferably from 1 to 20, still more preferably from 1 to 12, such as pyridylthio, 2-benzimizolylthio, 2-benzoxazolylthio and 2-benzothiazolylthio), or a siloxy ligand (preferably having a carbon number of 1 to 30, more preferably from 3 to 25, still more preferably from 6 to 20, such as triphenylsiloxy group, triethoxysiloxy group and triisopropylsiloxy group), more preferably a nitrogen-containing heterocyclic ligand, an aryloxy ligand, a heteroaryloxy ligand or a siloxy ligand, still more preferably a nitrogen-containing heterocyclic ligand, an aryloxy ligand or a siloxy ligand.

The intermediate layer 12 has a p-type semiconductor layer and an n-type semiconductor layer according to the combination of the present invention, and it is preferred that at least either the p-type semiconductor or the n-type semiconductor is an organic semiconductor and a photoelectric conversion layer having a bulk heterojunction structural layer containing the p-type semiconductor and the n-type conductor is provided therebetween. In this case, the bulk heterojunction structure contained in the intermediate layer 12 compensates for a shortcoming that the carrier diffusion length in the photoelectric conversion layer 123 is short, whereby the photoelectric conversion efficiency of the photoelectric conversion layer 123 can be enhanced. Incidentally, the bulk heterojunction structure is described in detail in JP-A-2005-303266 (Japanese Patent Application No. 2004-080639).

Also, the photoelectric conversion layer contained in the intermediate layer 12 preferably has a p-type semiconductor layer and an n-type semiconductor layer (preferably a mixed and dispersed (bulk heterojunction structure) layer), where at least either the p-type semiconductor or the n-type semiconductor contains an orientation-controlled organic compound, more preferably where both the p-type semiconductor and the n-type semiconductor contains an orientation-controlled (controllable) organic compound. As for this organic compound, those having a conjugated π electron are preferably used, and a π-electron plane aligned at an angle not perpendicular but closer to parallel with respect to the substrate (electrode substrate) is more preferred. The angle with respect to the substrate is preferably from 0 to 80°, more preferably from 0 to 60°, still more preferably from 0 to 40°, yet still more preferably from 0 to 20°, even yet still more preferably from 0 to 10°, and most preferably 0° (that is, parallel to the substrate). Such an orientation-controlled organic compound layer is sufficient if it is contained even as a part of the entire intermediate layer 12, but the ratio of the orientation-controlled portion to the entire intermediate layer 12 is preferably 10% or more, more preferably 30% or more, still more preferably 50% or more, yet still more preferably 70% or more, even yet still more preferably 90% or more, and most preferably 100%. In such a state, by controlling the orientation of the organic compound contained in the intermediate layer 12, a shortcoming that the carrier diffusion length is short in the photoelectric conversion layer is compensated for and the photoelectric conversion efficiency of the photoelectric conversion layer is enhanced.

In the case where the orientation of the organic compound is controlled, it is more preferred that the heterojunction plane (for example, the pn-junction plane) is not in parallel to the substrate. The heterojunction plane is preferably aligned not in parallel but at an angle closer to perpendicular to the substrate (electrode substrate). The angle with respect to the substrate is preferably from 10 to 90°, more preferably from 30 to 90°, still more preferably from 50 to 90°, yet still more preferably from 70 to 90°, even yet still more preferably from 80 to 90°, and most preferably 90° (that is, perpendicular to the substrate). Such an organic compound layer with the heterojunction plane being controlled is sufficient if it is contained even as a part of the entire intermediate layer 12. The ratio of the orientation-controlled portion to the entire intermediate layer 12 is preferably 10% or more, more preferably 30% or more, still more preferably 50% or more, yet still more preferably 70% or more, even yet still more preferably 90% or more, and most preferably 100%. In such a case, the area of the heterojunction plane in the intermediate layer 12 and in turn the amount of the carrier produced at the interface, such as electron, hole and electron-hole pair, can be increased and the photoelectric conversion efficiency can be enhanced. The photoelectric conversion efficiency can be enhanced particularly in the photoelectric conversion layer where the alignments of both the heterojunction plane and the π-electron plane of the organic compound are controlled. These conditions are described in detail in JP-A-2006-086493 (Japanese Patent Application No. 2004-079931). The thickness of the organic dye layer is preferably larger in view of light absorption, but considering the proportion not contributing to the electric charge separation, the thickness of the organic dye layer is preferably from 30 to 300 nm, more preferably from 50 to 250 nm, still more preferably from 80 to 200 nm.

The intermediate layer 12 containing such an organic compound is layer-formed by a dry layer-forming method or a wet layer-forming method. Specific examples of the dry layer-forming method include a physical vapor-growth method such as vacuum vapor deposition, sputtering, ion plating method and MBE, and a CVD method such as plasma polymerization. As for the wet layer-forming method, a cast method, a spin coating method, a dipping method, an LB method and the like may be used.

In the case of using a polymer compound as at least one of the p-type semiconductor (compound) and the n-type semiconductor (compound), the layer is preferably formed by a wet layer-forming method assured of easy production. In the case of using a dry layer-forming method such as vapor deposition, a polymer may decompose and therefore, can be hardly used, but an oligomer thereof may be preferably used instead. On the other hand, in the case of using a low molecular compound, a dry layer-forming method is preferably employed, and a vacuum vapor deposition method is particularly preferred. In the vacuum vapor deposition method, basic parameters are, for example, the method of heating the compound, such as resistance heating vapor deposition or electron beam heating vapor deposition, the shape of the vapor deposition source, such as crucible or boat, the vacuum degree, the vapor deposition temperature, the substrate temperature, and the vapor deposition rate. In order to enable uniform vapor deposition, the vapor deposition is preferably performed while rotating the substrate. The vacuum degree is preferably higher, and the vacuum vapor deposition is performed at $10^{-4}$ Torr or less, preferably $10^{-6}$ Torr or less, more preferably $10^{-8}$ Torr or less. All steps at the vapor deposition are preferably performed in vacuum, and the compound is fundamentally prevented from coming into direct contact with oxygen in the outside air or with water. The above-described conditions in the vacuum vapor deposition affect the crystallinity, amorphous property, density, denseness and the like of the organic layer and therefore, must be strictly controlled. The PI or PID control of the vapor deposition rate by using a quartz oscillator and a thickness monitor such as interferometer is preferably employed. In the case of simultaneously vapor-depositing two or more kinds of compounds, a co-vapor deposition method, a flash vapor deposition method or the like may be preferably used.

In the photoelectric conversion layer 123 composed of an organic material, when light is incident from above the second electrode 13 in the above-described construction, an electron and a hole, which are generated by light absorption, are generally generated in large number in the vicinity of the second electrode 13 and in not so large number in the vicinity of the first electrode 11. This is ascribable to a phenomenon that light at a wavelength near the absorption peak of the photoelectric conversion layer 123 is mostly absorbed in the vicinity of the second electrode 13 and the light absorption rate decreases with distance from the vicinity of the second electrode 13. Accordingly, unless an electron or a hole generated in the vicinity of the second electrode 13 is efficiently moved to the silicon substrate, the photoelectric conversion efficiency decreases, as a result, reduction in the sensitivity of the device is incurred. Also, the signal based on the wavelength of light strongly absorbed in the vicinity of the second electrode 13 decreases and this incurs broadening of the width of spectral sensitivity.

In the photoelectric conversion layer 123 composed of an organic material, the electron mobility is generally very smaller than the hole mobility. Furthermore, it is known that the electron mobility in the photoelectric conversion layer 123 composed of an organic material is susceptible to oxygen and when the photoelectric conversion layer 123 is exposed to air, the electron mobility further decreases. Accordingly, in the case of causing an electron to be moved to the silicon substrate 1, if an electron generated in the vicinity of the second electrode 13 travels a long distance in the photoelectric conversion layer 123, a part of electrons are not collected at the electrode due to deactivation or the like during the travel, as a result, the sensitivity decreases and the spectral sensitivity is broadened.

For preventing reduction in the sensitivity and broadening of the spectral sensitivity, it is effective to efficiently move an electron or a hole generated in the vicinity of the second electrode 13 to the silicon substrate 1. In order to realize this efficient movement, the manner of managing an electron or a hole generated in the photoelectric conversion layer 123 becomes important.

The solid-state imaging device 1000 contains a photoelectric conversion layer 123 having the above-described properties and therefore, as described above, a hole is utilized by collecting it in the first electrode layer 11 that is an electrode opposite the electrode on the light incident side, whereby the external quantum efficiency can be raised and enhancement of the sensitivity and sharpening of the spectral sensitivity can be achieved. Accordingly, in the solid-state imaging device 1000, a voltage is applied to the first electrode layer 11 and the second electrode layer 13 so that an electron generated in the photoelectric conversion layer 123 can be moved to the second electrode layer 13 and a hole generated in the photoelectric conversion layer 123 can be moved to the first electrode layer 11.

One function of the subbing cum electron-blocking layer 122 is to alleviate irregularities on the first electrode layer 11. In the case where irregularities are present on the first electrode layer 11 or a dust is attached to the first electrode layer 11, when a low molecular organic compound is vapor-deposited thereon to form a photoelectric conversion layer 123, the irregularity portion is liable to allow production of fine cracks in the photoelectric conversion layer 123, that is, portions where the photoelectric conversion layer 123 is formed only as a thin layer. At this time, when the second electrode layer 13 is further formed thereon, the second electrode layer 13 coverages the crack portion and comes into proximity with the first electrode layer 11 and occurrence of DC short or leak current is likely to increase. This tendency is prominent particularly when using TCO as the second electrode layer 13. Accordingly, the occurrence of such a trouble can be suppressed by previously providing a subbing layer cum electron-blocking layer 122 on the first electrode layer 11 to alleviate the irregularities.

As for the subbing layer cum electron-blocking layer 122, the matter of importance is to be a uniform and smooth layer. Particularly, in the case of obtaining a smooth layer, the preferred material is an organic polymer material such as polyaniline, polythiophene, polypyrrole, polycarbazole, PTPDES and PTPDEK, and the layer may also be formed by a spin coating method.

The electron-blocking layer 122 is provided for reducing a dark current ascribable to injection of an electron from the first electrode layer 11 and blocks the injection of an electron into the photoelectric conversion layer 123 from the first electrode layer 11.

The hole-blocking cum buffering layer 125 is provided for, as a hole-blocking layer, reducing a dark current ascribable to injection of a hole from the second electrode layer 13 and fulfills not only a function of blocking the injection of a hole into the photoelectric conversion layer 123 from the second electrode 13 but depending on the case, also a function of lessening a damage caused to the photoelectric conversion layer 123 during formation of the second electrode layer 13.

In the case of forming the second electrode layer 13 above the photoelectric conversion layer 123, a high energy particle present in the apparatus used for layer formation of the second electrode layer 13, such as, in the case of a sputtering method, sputter particle, secondary electron, Ar particle or oxygen anion, may collide against the photoelectric conversion layer 123, and this may cause deterioration of the photoelectric conversion layer 123 and in turn, degradation of the performance, such as increase in leak current or decrease in sensitivity. One preferred method for preventing this deterioration is to provide a buffering layer 125 on the photoelectric conversion layer 123.

Backing to FIG. 12, inside of the n-type silicon substrate 1, a p-type semiconductor region (hereinafter simply referred to as "p region") 4, an n-type semiconductor region (hereinafter simply referred to as "n region") 3 and a p region 2 are formed in order of increasing the depth. In the p region 4, a high-concentration p region (referred to as a p+ region) 6 is formed in the surface part of the portion light-shielded by the light-shielding layer 14, and the p+ region 6 is surrounded by an n region 5.

The depth of the pn junction face between the p region 4 and the n region 3 from the surface of the n-type silicon substrate 1 is set to a depth at which blue light is absorbed (about 0.2 μm). Therefore, the p region 4 and the n region 3 form a photodiode (B photodiode) where blue light is absorbed and a hole is accordingly generated and accumulated. The hole generated in the B photodiode is accumulated in the p region 4.

The depth of the pn junction face between the p region 2 and the n-type silicon substrate 1 from the surface of the n-type silicon substrate 1 is set to a depth at which red light is absorbed (about 2 μm). Therefore, the p region 2 and the n-type silicon substrate 1 form a photodiode (R photodiode) where red light is absorbed and a hole is accordingly generated and accumulated. The hole generated in the R photodiode is accumulated in the p region 2.

The p+ region 6 is electrically connected to the first electrode layer 11 via a connection part 9 formed in the opening bored through the insulating layer 7 and in this region, holes collected at the first electrode layer 11 are accumulated via the connection part 9. The connection part 9 is electrically insulated by an insulating layer 8 from portions except for the first electrode layer 11 and the p+ region 6.

The holes accumulated in the p region 2 are converted into signals according to the electric charge amount by an MOS circuit comprising a p-channel MOS transistor (not shown) formed inside of the n-type silicon substrate 1, the holes accumulated in the p region 4 are converted into signals according to the electric charge amount by an MOS circuit comprising a p-channel MOS transistor (not shown) formed inside of the n region 3, the electrons accumulated in the p+ region 6 are converted into signals according to the electric charge amount by an MOS circuit comprising a p-channel MOS transistor (not shown) formed inside of the n region 5, and these signals are output to the outside of the solid-state imaging device 1000. The MOS circuits above constitute the signal readout part specified in the scope of claim for patent. Each MOS circuit is connected to a signal readout pad (not shown) by a wiring 10. Incidentally, when an extraction electrode is provided in the p region 2 and p region 4 and a predetermined reset potential is applied, each region is depleted and the capacity of each pn junction part becomes an infinitely small value, whereby the capacity produced on the junction face can be made extremely small.

Such a construction enables, for example, photoelectrically converting G light by the photoelectric conversion layer 123 and photoelectrically converting B light and R light by the B photodiode and R photodiode, respectively, in the n-type silicon substrate 1. Also, since G light is first absorbed in the upper part, excellent color separation is obtained between B-G and between G-R. This is a greatly excellent point in comparison with a solid-state imaging device of the type where three PDs are stacked inside of the silicon substrate and all of BGR light are separated inside of the silicon substrate. In the following, the portion composed of an inorganic material, which is formed inside of the n-type silicon substrate 1 of the solid-state imaging device 1000 and in which photoelectric conversion is performed (B photodiode, R photodiode) is sometimes referred to as an inorganic layer.

Incidentally, an inorganic photoelectric conversion part composed of an inorganic material, in which light transmitted through the photoelectric conversion layer 123 is absorbed and an electric charge according to the light is generated and accumulated, may also be formed between the n-type silicon substrate 1 and the first electrode layer 11 (for example, between the insulating layer 7 and the n-type silicon substrate 1). In this case, an MOS circuit for reading out signals according to electric charges accumulated in a charge accumulation region of the inorganic photoelectric conversion part may be provided inside of the n-type silicon substrate 1 and a wiring 10 may be connected also to this MOS circuit.

The first electrode layer 11 fulfills a role of collecting holes moved thereto after generation in the photoelectric conversion layer 123. The first electrode layer 11 is divided for each pixel, whereby image data can be produced. In the construction shown in FIG. 12, photoelectric conversion is performed also in the n-type silicon substrate 1 and therefore, the first electrode layer 11 preferably has a visible light transmittance of 60% or more, more preferably 90% or more. In the case of a construction where a photoelectric conversion region is not present below the first electrode layer 11, the first electrode layer 11 may have low transparency. As for the material, any of ITO, IZO, $ZnO_2$, $SnO_2$, $TiO_2$, FTO, Al, Ag and Au may be most preferably used. Details of the first electrode layer 11 are described later.

The second electrode layer 13 has a function of ejecting an electron moved thereto after generation in the photoelectric conversion layer 123. The second electrode layer 13 can be used in common among all pixels. For this reason, in the solid-state imaging device 1000, the second electrode layer 13 is formed as a layer in one-sheet construction, which is shared in common among all pixels. For the second electrode layer 13, a material having high transparency to visible light needs to be used, because light must be incident into the photoelectric conversion layer 123. The second electrode layer 13 preferably has a visible light transmittance of 60% or more, more preferably 90% or more. As for the material, any of ITO, IZO, $ZnO_2$, $SnO_2$, $TiO_2$, FTO, Al, Ag and Au may be most preferably used. Details of the second electrode layer 13 are described later.

For the inorganic layer, a pn junction or pin junction of a compound semiconductor such as crystalline silicon, amorphous silicon and GaAs is generally used. In this case, color separation is performed according to the depth to which light intrudes into silicon, and therefore, the spectrum range detected by each of light-receiving segments stacked becomes broad. However, color separation is significantly improved by, as shown in FIG. 12, using the photoelectric conversion layer 123 as an upper layer, that is, allowing the light transmitted through the photoelectric conversion layer 123 to be detected in the depth direction of silicon. In particular, as shown in FIG. 12, when G light is detected in the photoelectric conversion layer 123, light transmitted through the photoelectric conversion layer 123 becomes B light and R light and separation of light in the depth direction of silicon needs to be made only between B light and R light, as a result, color separation is improved. Even in the case of detecting B light or R light in the photoelectric conversion layer 123, color separation can be markedly improved by appropriately selecting the depth of the pn junction face in silicon.

The construction of the inorganic layer is preferably npn or pnpn from the light incident side. In particular, pnpn junction is more preferred, because by providing a p layer on the surface and making high the surface potential, a hole and a dark current, which are generated in the vicinity of the surface, can be trapped and the dark current can be reduced.

Incidentally, FIG. 12 shows a construction where one layer of the photoelectric conversion part is stacked above the n-type silicon substrate 1, but there may also take a construction where a plurality of photoelectric conversion parts are stacked above the n-type silicon substrate 1. The construction where a plurality of photoelectric conversion parts are stacked is described in later embodiments. In the case of such a construction, light detected in the inorganic layer may be light of only one color, and preferred color separation can be achieved. Also, in the case of detecting lights of four colors by one pixel of the solid-state imaging device 1000, there may be considered, for example, a construction where one color is detected in one photoelectric conversion part and three colors are detected in the inorganic layer; a construction where two layers of the photoelectric conversion part are stacked to detect two colors and other two colors are detected in the inorganic layer; and a construction where three layers of the photoelectric conversion part are stacked to detect three colors and other one color is detected in the inorganic layer. Furthermore, the solid-state imaging device 1000 may also take a construction where only one color is detected by one pixel. This is a construction where in FIG. 1, the p region 2, the n region 3 and the p region 4 are eliminated.

The inorganic layer is described in more detail. The preferred construction of the inorganic layer includes a light-receiving device of photoconductive type, p-n junction type, Schottky junction type, PIN junction type or MSM (metal-semiconductor-metal) type, and a phototransistor type light-receiving device. In particular, it is preferred to use an inorganic layer where as shown in FIG. 12, a plurality of regions of first conductivity type and a plurality of regions of second conductivity type which is a conductivity type opposite the first conductivity type are alternately stacked inside of a single semiconductor substrate and the junction planes each between regions of first conductivity type and second conductivity type are formed at respective depths suitable for photoelectrically converting mainly lights in a plurality of different wavelength bands. The single semiconductor substrate is preferably single-crystal silicon, and color separation can be effected by utilizing the absorption wavelength property dependent on the depth direction of the silicon substrate.

The inorganic semiconductor may also be an InGaN-based, InAlN-based, InAlP-based or InGaAlP-based inorganic semiconductor. The InGaN-based inorganic semiconductor is an inorganic semiconductor adjusted to have a maximum absorption value in the blue wavelength range by appropriately changing the composition of In content. That is, the composition becomes $In_xGa_{1-x}N$ ($0 \leq x < 1$). Such a compound semiconductor is produced by using a metal organic chemical vapor deposition method (MOCVD method). The InAlN-based nitride semiconductor using Al which is the same Group 13 raw material as Ga may also be used as a short wavelength light-receiving part, similarly to the InGaN-based semiconductor, Furthermore, the InAlP or InGaAlP that lattice-matches with a GaAs substrate may also be used.

The inorganic semiconductor may be of a buried structure. The "buried structure" indicates a construction where both ends of a short wavelength light-receiving part are covered by a semiconductor different from the short wavelength light-receiving part. The semiconductor for covering both ends is preferably a semiconductor having a band gap wavelength shorter than or equal to the band gap wavelength of the short wavelength light-receiving part.

As for the material of the first electrode layer 11 and the second electrode layer 13, a metal, an alloy, a metal oxide, an electric conducting compound or a mixture thereof may be used. The metal material includes an arbitrary combination of elements selected from Li, Na, Mg, K, Ca, Rb, Sr, Cs, Ba, Fr, Ra, Sc, Ti, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, Ga, In, Tl, Si, Ge, Sn, Pb, P, As, Sb, Bi, Se, Te, Po, Br, I, At, B, C, N, F, O and S. Among these, preferred are Al, Pt, W, Au, Ag, Ta, Cu, Cr, Mo, Ti, Ni, Pd and Zn.

The first electrode layer 11 extracts and collects holes from a hole-transporting photoelectric conversion layer or hole transport layer contained in the intermediate layer 12 and therefore, the material is selected by taking into consideration the adherence to adjacent layers such as hole-transporting photoelectric conversion layer and hole transport layer, the electron affinity, the ionization potential, the stability and the like. The second electrode layer 13 extracts and ejects electrons from an electron-transporting photoelectric conversion layer or electron transport layer contained in the intermediate layer 12 and therefore, the material is selected by taking into consideration the adherence to adjacent layers such as electron-transporting photoelectric conversion layer and electron transport layer, the electron affinity, the ionization potential, the stability and the like. Specific examples thereof include an electrically conductive metal oxide such as tin oxide, zinc oxide, indium oxide and indium tin oxide (ITO), a metal such as gold, silver, chromium and nickel; a mixture or laminate of such a metal and such an electrically conductive metal oxide, an inorganic electrically conductive substance such as copper iodide and copper sulfide, an organic electrically conductive material such as polyaniline, polythiophene and polypyrrole, a silicon compound, and a laminate thereof with ITO. Among these, an electrically conductive metal oxide is preferred, and ITO and IZO are more preferred in view of productivity, high electrical conductivity, transparency and the like.

For the production of the electrode, various methods are used according to the material, but, for example, in the case of ITO, the layer is formed by a method such as electron beam method, sputtering method, resistance heating vapor deposition method, chemical reaction method (e.g., sol-gel method) or coating of a dispersion of indium tin oxide. In the case of ITO, an UV-ozone treatment, a plasma treatment or the like can be applied.

The conditions when forming an electrode layer that is transparent (transparent electrode layer) are described below. The silicon substrate temperature when forming the transparent electrode layer is preferably 500° C. or less, more preferably 300° C. or less, still more preferably 200° C. or less, yet still more preferably 150° C. or less. A gas may be introduced during the formation of the transparent electrode layer, and the gas species is basically not limited, but Ar, He, oxygen or nitrogen may be used. Also, a mixed gas of these gases may be used. In particular, in the case where the material is an oxide, an oxygen defect enters the layer in many cases and therefore, oxygen is preferably used.

The preferred range of the surface resistance of the transparent electrode layer varies depending on whether the layer is the first electrode layer 11 or the second electrode layer 13. In the case where the signal readout part is in a CMOS structure, the surface resistance of the transparent conductive layer is preferably 10,000 Ω/sq. or less, more preferably 1,000 Ω/sq. or less. In the case where the signal readout part is hypothetically in a CCD structure, the surface resistance is preferably 1,000 Ω/sq. or less, more preferably 100 Ω/sq. or less. In use as the second electrode layer 13, the surface resistance is preferably 1,000,000 Ω/sq. or less, more preferably 100,000 Ω/sq. or less.

The material of the transparent electrode layer is preferably any material of ITO, IZO, SnO$_2$, ATO (antimony-doped tin oxide), ZnO, AZO (Al-doped zinc oxide), GZO (gallium-doped zinc oxide), TiO$_2$ and FTO (fluorine-doped tin oxide). The light transmittance of the transparent electrode layer is preferably 60% or more, more preferably 80% or more, still more preferably 90% or more, yet still more preferably 95% or more, at the absorption peak wavelength of a photoelectric conversion layer contained in the photoelectric conversion part containing the transparent electrode layer.

In the case of stacking a plurality of intermediate layers 12, the first electrode layer 11 and the second electrode layer 13 each needs to transmit light at wavelengths other than light detected by respective photoelectric conversion layers from the photoelectric conversion layer positioned nearest to the light incident side to the photoelectric conversion layer positioned farthest from the light incident and therefore, it is preferred to use a material having a light transmittance of preferably 90%, more preferably at least 95% or more, for visible light.

The second electrode layer 13 is preferably produced in a plasma-free state. By producing the second electrode layer 13 in a plasma-free state, the effect of a plasma on the substrate can be reduced and good photoelectric conversion properties can be obtained. Here, the term "plasma-free state" means a state where a plasma is not generated during formation of the second electrode layer 13 or where the distance from the plasma generation source to the substrate is 2 cm or more, preferably 10 cm or more, more preferably 20 cm or more, and the plasma that reaches the substrate is reduced.

Examples of the apparatus where a plasma is not generated during formation of the second electrode layer 13 include an electron beam vapor deposition apparatus (EB vapor deposition apparatus) and a pulse laser vapor deposition apparatus. As for the EB vapor deposition apparatus and pulse laser vapor deposition apparatus, there may be used an apparatus described, for example, in Yutaka Sawada (supervisor), *Toumei Doden Maku no Shin Tenkai* (*New Development of Transparent Electrically Conductive Layer*), CMC (1999), Yutaka Sawada (supervisor), *Toumei Doden Maku no Shin Tenkai II* (*New Development II of Transparent Electrically Conductive Layer*), CMC (2002), *Toumei Doden Maku no Gijutsu* (*Technology of Transparent Electrically Conductive Layer*), JSPS, Ohmsha (1999), and references and the like recited therein. In the following, the method of performing the formation of transparent electrode layer by using an EB vapor deposition apparatus is referred to as an "EB vapor deposition method", and the method of performing the formation of transparent electrode layer by using a pulse laser vapor deposition apparatus is referred to as a "pulse laser vapor deposition method".

As for the apparatus capable of realizing a state where the distance from the plasma generation source to the substrate is 2 cm or more and the plasma that reaches the substrate is reduced (hereinafter referred to as a "plasma-free layer-forming apparatus"), for example, a counter target-type sputtering apparatus and an arc plasma vapor deposition method may be used. In this regard, there may be used an apparatus described, for example, in Yutaka Sawada (supervisor), *Toumei Doden Maku no Shin Tenkai* (*New Development of Transparent Electrically Conductive Layer*), CMC (1999), Yutaka Sawada (supervisor), *Toumei Doden Maku no Shin Tenkai II* (*New Development II of Transparent Electrically Conductive Layer*), CMC (2002), *Toumei Doden Maku no Gijutsu* (*Technology of Transparent Electrically Conductive Layer*), JSPS, Ohmsha (1999), and references and the like recited therein.

In the case where the second electrode layer 13 is a transparent electrically conductive layer such as TCO, occurrence of DC short or leak current sometimes increases. One of causes thereof is considered because fine cracks introduced into the photoelectric conversion layer 123 are coveraged by a dense layer such as TCO, and conduction with the first electrode layer 11 on the opposite side increases. Therefore, in the case of an electrode having relatively poor layer quality such as Al, the leak current less increases. The increase of leak current can be greatly suppressed by controlling the thickness of the second electrode layer 13 with respect to the thickness (that is, the crack depth) of the photoelectric conversion layer 123. The thickness of the second electrode layer 13 is preferably ⅕ or less, more preferably ⅒ or less, of the thickness of the photoelectric conversion layer 123.

Usually, when the thickness of the electrically conductive layer is made smaller than a certain range, an abrupt increase of the resistance value is brought about, but in the solid-state imaging device 1000 of this embodiment, the sheet resistance may be preferably from 100 to 10,000 Ω/sq. and the latitude as to in which range the layer thickness can be reduced is large. Also, as the thickness of the transparent electrically conductive thin layer is smaller, the quantity of light absorbed becomes small and the light transmittance generally increases. The increase of light transmittance brings about an increase of light absorption in the photoelectric conversion layer 123 and an increase of photoelectric conversion performance, and this is very preferred. Considering the suppression of leak current as well as the increase of resistance value of thin layer and increase of transmittance, which are associated with reduction in the layer thickness, the thickness of the transparent electrically conductive thin layer is preferably from 5 to 100 nm, more preferably from 5 to 20 nm.

The material of the transparent electrode layer is preferably a material which can be layer-formed by a plasma-free layer-forming apparatus, an EB vapor deposition apparatus or a pulsed laser vapor deposition apparatus, and suitable examples thereof include a metal, an alloy, a metal oxide, a metal nitride, a metal boride, an organic electrically conductive compound and a mixture thereof. Specific examples thereof include an electrically conductive metal oxide such as tin oxide, zinc oxide, indium oxide, indium zinc oxide (IZO), indium tin oxide (ITO) and indium tungsten oxide (IWO), a metal nitride such as titanium nitride, a metal such as gold, platinum, silver, chromium, nickel and aluminum, a mixture or laminate of such a metal and such an electrically conductive metal oxide, an inorganic electrically conductive substance such as copper iodide and copper sulfide, an organic electrically conductive material such as polyaniline, polythiophene and polypyrrole, and a laminate thereof with ITO. Furthermore, those described in detail, for example in Yutaka Sawada (supervisor), *Toumei Doden Maku no Shin Tenkai* (*New Development of Transparent Conductive Layer*), CMC (1999), Yutaka Sawada (supervisor), *Toumei Doden Maku no Shin Tenkai II* (*New Development II of Transparent Conductive Layer*), CMC (2002), and *Toumei Doden Maku no Gijutsu* (*Technology of Transparent Conductive Layer*), JSPS, Ohmsha (1999) may be also used.

(Fourth Embodiment)

In this embodiment, the inorganic layer having a construction shown in FIG. 12 described in the third embodiment is configured such that two photodiodes are not stacked inside of the n-type silicon substrate but two diodes are arrayed in the direction perpendicular to the incidence direction of incident light to detect light of two colors inside the n-type silicon substrate.

Figure 14:
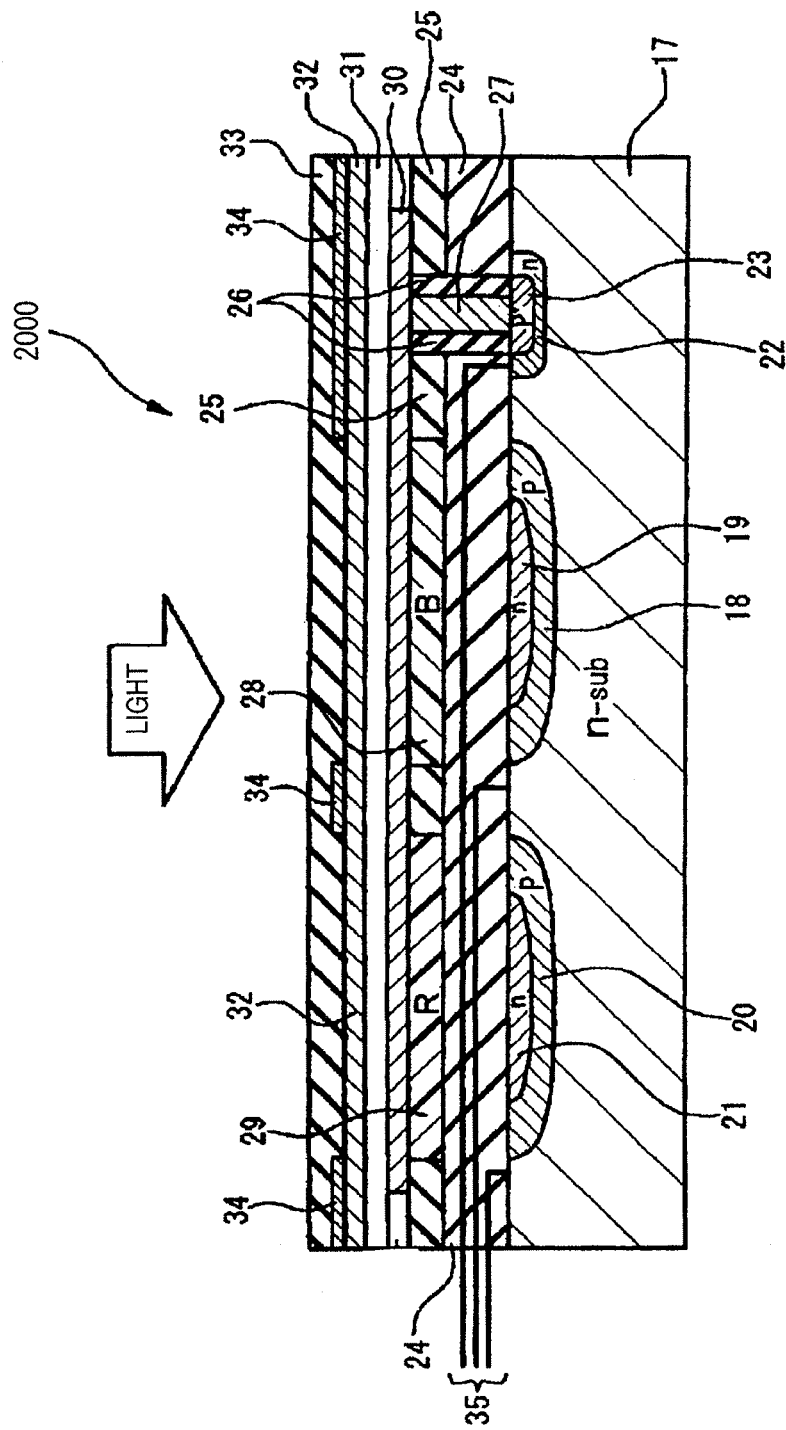
FIG. 14 is a schematic cross-sectional view of one pixel portion of a solid-state imaging device for explaining a fourth exemplary embodiment of the present invention.

FIG. 14 is a schematic cross-sectional view of one pixel portion of a solid-state imaging device for explaining the fourth embodiment of the invention.

One pixel of the solid-state imaging device 2000 shown in FIG. 14 is configured to contain an n-type silicon substrate 17 and a photoelectric conversion part including a first electrode layer 30 formed above the n-type silicon substrate 17, an intermediate layer 31 formed on the first electrode layer 30 and a second electrode layer 32 formed on the intermediate layer 31, where a light-shielding layer 34 having provided therein an opening is formed on the photoelectric conversion part and the light-receiving region of the intermediate layer 31 is limited by the light-shielding layer 34. Also, a transparent insulating layer 33 is formed on the light-shielding layer 34.

The first electrode layer 30, the intermediate layer 31 and the second electrode layer 32 have the same constructions as the first electrode layer 11, the intermediate layer 12 and the second electrode layer 13, respectively.

On the surface of the n-type silicon substrate 17 below the opening of the light-shielding layer 34, a photodiode including an n region 19 and a p region 18 and a photodiode including an n region 21 and a p region 20 are formed to be juxtaposed on the surface of the n-type silicon substrate 17. An arbitrary direction on the n-type silicon substrate 17 surface comes under the direction perpendicular to the incidence direction of incident light.

Above the photodiode including an n region 19 and a p region 18, a color filter 28 that transmits B light is formed via a transparent insulating layer 24, and the first electrode layer 30 is formed thereon. Above the photodiode including an n region 21 and a p region 20, a color filter 29 that transmits R light is formed via the transparent insulating layer 24, and the first electrode layer 30 is formed thereon. The peripheries of color filters 28 and 29 are covered with a transparent insulating layer 25.

The photodiode including an n region 19 and a p region 18 absorbs B light transmitted through the color filter 28, generates holes according to the light absorbed and accumulates the generated holes in the p region 18. The photodiode including an n region 21 and a p region 20 absorbs R light transmitted through the color filter 29, generates holes according to the light absorbed and accumulates the generated holes in the p region 20.

In the portion light-shielded by the light-shielding layer 34 on the p-type silicon substrate 17 surface, a p+ region 23 is formed, and the periphery of the p+ region 23 is surrounded by an n region 22.

The p+ region 23 is electrically connected to the first electrode layer 30 via a connection part 27 formed in the opening bored through the insulating layers 24 and 25 and in this region, holes collected at the first electrode layer 30 are accumulated via the connection part 27. The connection part 27 is electrically insulated by an insulating layer 26 from portions except for the first electrode layer 30 and the p+ region 23.

The holes accumulated in the p region 18 are converted into signals according to the electric charge amount by an MOS circuit comprising a p-channel MOS transistor (not shown) formed inside of the n-type silicon substrate 17, the holes accumulated in the p region 20 are converted into signals according to the electric charge amount by an MOS circuit comprising a p-channel MOS transistor (not shown) formed inside of the n-type silicon substrate 17, the holes accumulated in the p+ region 23 are converted into signals according to the electric charge amount by an MOS circuit comprising a p-channel MOS transistor (not shown) formed inside of the n region 22, and these signals are output to the outside of the solid-state imaging device 2000. The MOS circuits above constitute the signal readout part specified in the scope of claim for patent. Each MOS circuit is connected to a signal readout pad (not shown) by a wiring 35.

Incidentally, the signal readout part may be configured by CCD and an amplifier, instead of MOS circuits. More specifically, the signal readout part may be a signal readout part where holes accumulated in the p region 18, p region 20 and p+ region 23 are read into CCD formed inside of the n-type silicon substrate 17 and further transferred to an amplifier by the CCD, and signals according to the holes transferred are output from the amplifier.

In this way, the signal readout part includes CCD and CMOS structures, but in view of power consumption, high-speed readout, pixel addition, partial readout and the like, CMOS is preferred.

Incidentally, in FIG. 14, color separation between B light and R light is effected by color filters 28 and 29, but instead of providing color filters 28 and 29, the depth of the pn junction face between the p region 20 and the n region 21 and the depth of the pn junction face between the p region 18 and the n region 19 each may be adjusted to absorb R light and B light by respective photodiodes. In this case, an inorganic photoelectric conversion part composed of an inorganic material that absorbs light transmitted through the intermediate layer 31, generates electric charges according to the light absorbed and accumulates the electric charges may also be formed between the n-type silicon substrate 17 and the first electrode layer 30 (for example, between the insulating layer 24 and the n-type silicon substrate 17). If this is the case, an MOS circuit for reading out signals according to the electric charges accumulated in a charge accumulation region of the inorganic photoelectric conversion part may be provided inside of the n-type silicon substrate 17 and a wiring 35 may be connected also to this MOS circuit.

Also, there may take a construction where one photodiode is provided inside of the n-type silicone substrate 17 and a plurality of photoelectric conversion parts are stacked above the n-type silicon substrate 17; a construction where a plurality of photodiodes are provided inside of the n-type silicon substrate 17 and a plurality of photoelectric conversion parts are stacked above the n-type silicon substrate 17; or when a color image need not be formed, a construction where one photodiode is provided inside of the n-type silicon substrate 17 and only one photoelectric conversion part is stacked.

(Fifth Embodiment)

The solid-state imaging device of this embodiment has a construction where an inorganic layer having the construction shown in FIG. 12 described in the third embodiment is not provided but a plurality of (here, three) photoelectric conversion layers are stacked above the silicon substrate.

Figure 15:
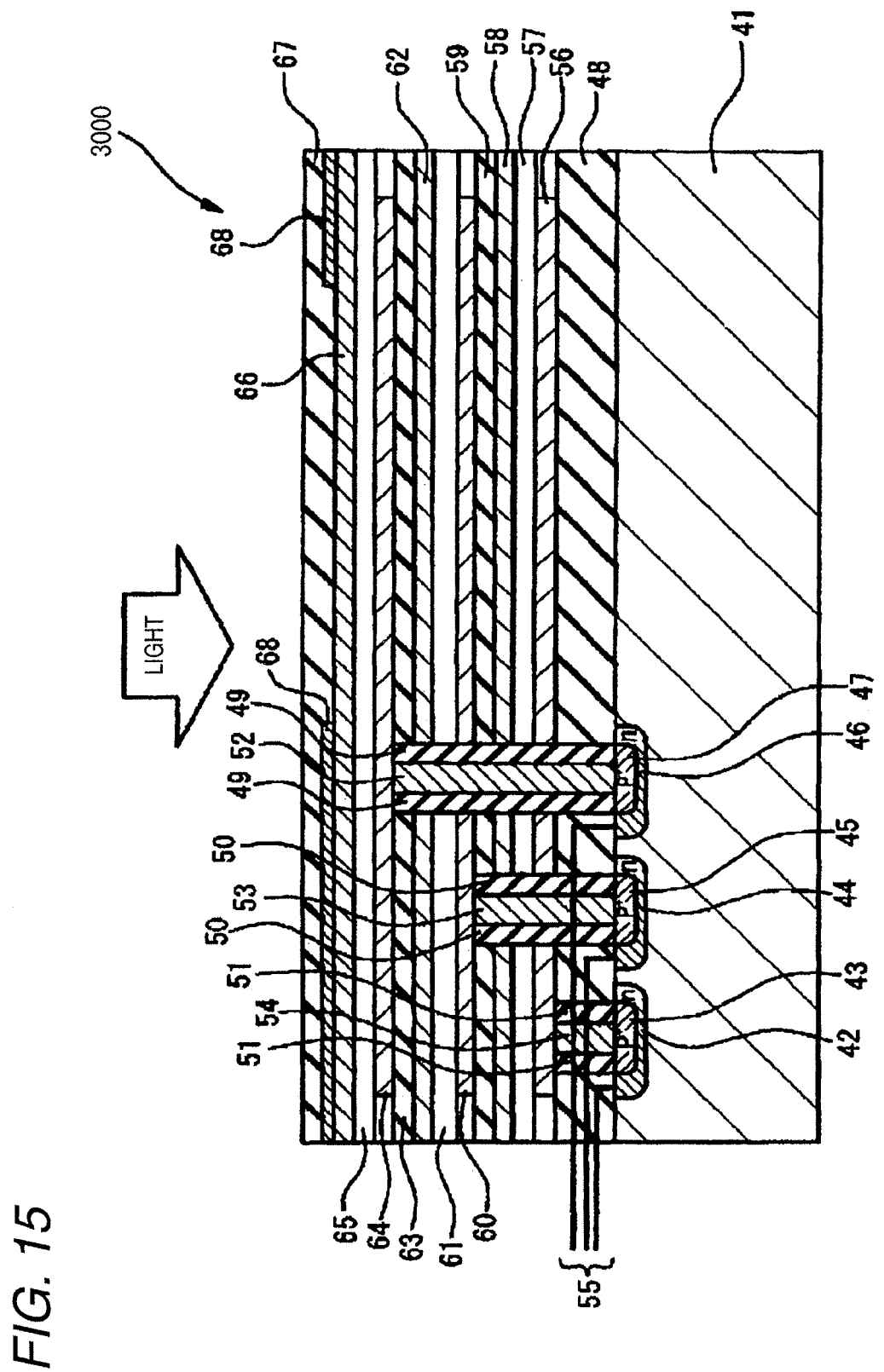
FIG. 15 is a schematic cross-sectional view of one pixel portion of a solid-state imaging device for explaining a fifth exemplary embodiment of the present invention.

FIG. 15 is a schematic cross-sectional view of one pixel portion of a solid-state imaging device for explaining the fifth embodiment of the present invention.

The solid-state imaging device 3000 shown in FIG. 15 has a construction where an R photoelectric conversion part containing a first electrode layer 56, an intermediate layer 57 formed on the first electrode layer 56 and a second electrode layer 58 formed on the intermediate layer 57, a B photoelectric conversion part containing a first electrode layer 60, an intermediate layer 61 formed on the first electrode layer 60 and a second electrode layer 62 formed on the intermediate layer 61, and a G photoelectric conversion part containing a first electrode layer 64, an intermediate layer 65 formed on the first electrode layer 64 and a second electrode layer 66 formed on the intermediate layer 65 are stacked in this order above the silicon substrate 41 in a state of the first electrode layer contained in each photoelectric conversion part being directed toward the silicon substrate 41 side.

A transparent insulating layer 48 is formed on the silicon substrate 41, the R photoelectric conversion part is formed thereon, a transparent insulating layer 59 is formed thereon, the B photoelectric conversion part is formed thereon, a transparent insulating layer 63 is formed thereon, the G photoelectric conversion part is formed thereon, a light-shielding layer 68 having provided therein an opening is formed thereon, and a transparent insulating layer 67 is formed thereon.

The first electrode layer 64, intermediate layer 65 and second electrode layer 66 contained in the G photoelectric conversion part have the same constructions as the first electrode layer 11, intermediate layer 12 and second electrode layer 13 shown in FIG. 12, respectively.

The first electrode layer 60, intermediate layer 61 and second electrode layer 62 contained in the B photoelectric conversion part have the same constructions as the first electrode layer 11, intermediate layer 12 and second electrode layer 13 shown in FIG. 12, respectively. However, for the photoelectric conversion layer contained in the intermediate layer 61, a material that absorbs blue light and generates an electron and a hole according to the light absorbed is used.

The first electrode layer 56, intermediate layer 57 and second electrode layer 58 contained in the R photoelectric conversion part have the same constructions as the first electrode layer 11, intermediate layer 12 and second electrode layer 13 shown in FIG. 12, respectively. However, for the photoelectric conversion layer contained in the intermediate layer 57, a material that absorbs red light and generates an electron and a hole according to the light absorbed is used.

For the electron-blocking layer and hole-blocking layer contained in each of the intermediate layers 61 and 57, an appropriate material and an appropriate construction are preferably selected so as not to create an energy barrier to the transport of a signal charge, in terms of the relationship between HOMO and LUMO energy levels of each photoelectric conversion layer and HOMO and LUMO energy levels of each blocking layer adjacent thereto.

In the portion light-shielded by the light-shielding layer 68 on the silicon substrate 41 surface, p+ regions 43, 45 and 47 are formed and the peripheries of these regions are surrounded by n regions 42, 44 and 46, respectively.

The p+ region 43 is electrically connected to the first electrode layer 56 via a connection part 54 formed in an opening bored through the insulating layer 48 and in this region, holes collected at the first electrode 56 are accumulated via the connection part 54. The connection part 54 is electrically insulated by an insulating layer 51 from portions except for the first electrode layer 56 and the p+ region 43.

The p+ region 45 is electrically connected to the first electrode layer 60 via a connection part 53 formed in an opening bored through the insulating layer 48, R photoelectric conversion part and insulating layer 59 and in this region, holes collected at the first electrode layer 60 are accumulated via the connection part 53. The connection part 53 is electrically insulated by an insulating layer 50 from portions except for the first electrode layer 60 and the p+ region 45.

The p+ region 47 is electrically connected to the first electrode layer 64 via a connection part 52 formed in an opening bored through the insulating layer 48, R photoelectric conversion part, insulating layer 59, B photoelectric conversion part and insulating layer 63 and in this region, holes collected at the first electrode layer 64 are accumulated via the connection part 52. The connection part 52 is electrically insulated by an insulating layer 49 from portions except for the first electrode layer 64 and the p+ region 47.

The holes accumulated in the p+ region 43 are converted into signals according to the electric charge amount by an MOS circuit comprising a p-channel MOS transistor (not shown) formed inside of the n region 42, the holes accumulated in the p+ region 45 are converted into signals according to the electric charge amount by an MOS circuit comprising a p-channel MOS transistor (not shown) formed inside of the n region 44, the holes accumulated in the p+ region 47 are converted into signals according to the electric charge amount by an MOS circuit comprising a p-channel MOS transistor (not shown) formed inside of the n region 46, and these signals are output to the outside of the solid-state imaging device 3000. The MOS circuits above constitute the signal readout part specified in the scope of claim for patent. Each MOS circuit is connected to a signal readout pad (not shown) by a wiring 55. Here, the signal readout part may be configured by CCD and an amplifier, instead of MOS circuits. More specifically, the signal readout part may be a signal readout part where holes accumulated in the p+ regions 43, 45 and 47 are read into CCD formed inside of the silicon substrate 41 and further transferred to an amplifier by the CCD, and signals according to the holes transferred are output from the amplifier.

Incidentally, an inorganic photoelectric conversion part composed of an inorganic material which receives light transmitted through the intermediate layers 57, 61 and 65, generates electric charges according to the light received and accumulates the electric charges may also be formed between the silicon substrate 41 and the first electrode layer 56 (for example, between the insulating layer 48 and the silicon substrate 41). In this case, an MOS circuit for reading out signals according to the electric charges accumulated in a charge accumulation region of the inorganic photoelectric conversion part may be provided inside of the silicon substrate 41 and a wiring 55 may be connected also to this MOS circuit.

Such a configuration described in the third and forth embodiments, where a plurality of photoelectric conversion layers are stacked on a silicon substrate, can be realized by the construction shown in FIG. 15.

In these descriptions, the photoelectric conversion layer that absorbs B light means a photoelectric conversion layer which can absorb at least light at a wavelength of 400 to 500 nm and in which the absorption rate at a peak wavelength in the wavelength region above is preferably 50% or more. The photoelectric conversion layer that absorbs G light means a photoelectric conversion layer which can absorb at least light at a wavelength of 500 to 600 nm and in which the absorption rate at a peak wavelength in the wavelength region above is preferably 50% or more. The photoelectric conversion layer that absorbs R light means a photoelectric conversion layer which can absorb at least light at a wavelength of 600 to 700 nm and in which the absorption rate at a peak wavelength in the wavelength region above is preferably 50% or more.

In the case of the construction of the third or fifth embodiment, there may be considered a pattern where colors are detected in the order such as BGR, BRG, GBR, GRB, RBG and RGB from the upper layer. Preferably, the uppermost layer is G. In the case of the construction of the fourth embodiment, the combination which can be employed is such a construction where the upper layer is an R layer and the lower layer is BG layers in the same plane; where the upper layer is a B layer and the lower layer is GR layers in the same plane; or where the upper layer is a G layer and the lower layer is BR layers in the same plane. A construction where the upper layer is a G layer and the lower layer is BR layers in the same plane is preferred.

(Sixth Embodiment)

Figure 16:
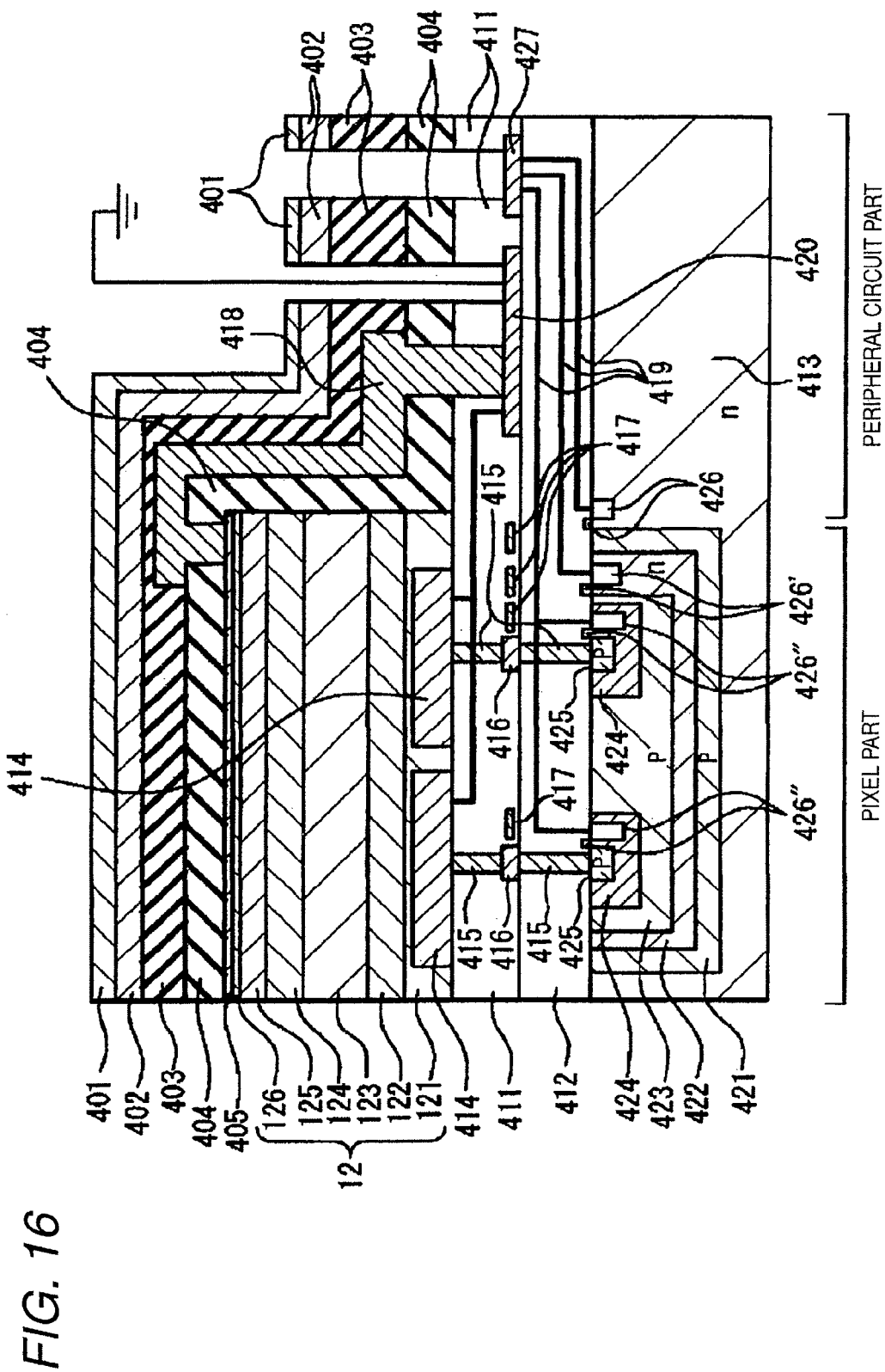
FIG. 16 is a schematic cross-sectional view of a solid-state imaging device for explaining a sixth exemplary embodiment of the present invention.

FIG. 16 is a schematic cross-sectional diagram of a solid-state imaging device for explaining the sixth embodiment of the present invention. In FIG. 16, a cross-section of two pixel portions in a pixel part that is a portion of detecting light and accumulating an electric charge, and a cross-section of a peripheral circuit part that is a portion where, for example, wiring connected to an electrode in the pixel part and bonding PAD connected to the wiring are formed, are shown together.

In the pixel part, a p region 421 is formed in the surface area of an n-type silicon substrate 413, an n region 422 is formed in the surface area of the p region 421, a p region 423 is formed in the surface area of the n region 422, and an n region 424 is formed in the surface area of the p region 423.

The p region 421 accumulates holes of a red (R) component photoelectrically converted by a pn junction with the n-type silicon substrate 413. A potential change in the p region 421 due to accumulation of holes of an R component is read out from an MOS transistor 426 formed in the n-type silicon substrate 413 into a signal readout PAD 427 via a metal wiring 419 connected to the MOS transistor 426.

The p region 423 accumulates holes of a blue (B) component photoelectrically converted by a pn junction with the n region 422. A potential change in the p region 423 due to accumulation of holes of a B component is read out from an MOS transistor 426' formed in the n region 422 into a signal readout PAD 427 via a metal wiring 419 connected to the MOS transistor 426'.

In the n region 424, a hole accumulation region 425 comprising a p region that accumulates holes of a green (G) component generated in the photoelectric conversion layer 123 stacked above the n-type silicon substrate 413 is formed. A potential change in the hole accumulation region 425 due to accumulation of holes of a G component is read out from an MOS transistor 426" formed in the n region 424 into a signal readout PAD 427 via a metal wiring 419 connected to the MOS transistor 426". Usually, the signal readout PAD 427 is provided for each of the transistors from which respective color components are read out.

Here, the p region, n region, transistor, metal wiring and others are schematically shown, but the construction and the like of each member are not limited thereto, and an optimal selection is appropriately made therefor. Separation between B light and R light is effected by the depth in the silicon substrate and therefore, for example, selection of the depth of pn junction or the like from the silicon substrate surface or the dope concentration of each impurity is important. A technique used in a normal CMOS image sensor may be applied to the CMOS circuit working out to a signal readout part. Specifically, a circuit construction of reducing the number of transistors in the pixel part, including a low-noise readout column amplifier and a CDS circuit, may be applied.

A transparent insulating layer 412 comprising silicon oxide, silicon nitride or the like as the main component is formed on the n-type silicon substrate 413, and a transparent insulating layer 411 comprising silicon oxide, silicon nitride or the like as the main component is formed on the insulating layer 412. The thickness of the insulating layer 412 is preferably smaller and is 5 μm or less, preferably 3 μm or less, more preferably 2 μm or less, still more preferably 1 μm or less.

Inside of each of insulating layers 411 and 412, a plug 415 comprising, for example, tungsten as the main component and electrically connecting between the first electrode layer 414 and the p region 425 as a hole accumulation region is formed, and the plugs 415 are relayed and connected by a pad 416 across the insulating layer 411 and the insulating layer 412. As for the pad 416, a pad comprising aluminum as the main component is preferably used. Inside of the insulating layer 412, the above-described metal wiring 419, gate electrodes for the transistors 426, 426' and 426", and others are also formed. It is preferred that a barrier layer including the metal wiring is provided. The plug 415 is provided for every one pixel.

Inside of the insulating layer 411, a light-shielding layer 417 is provided for preventing a noise attributable to generation of an electric charge by the pn junction between the n region 424 and the p region 425. As for the light-shielding layer 417, a layer comprising tungsten, aluminum or the like as the main component is used. Inside of the insulating layer 411, a bonding PAD 420 (PAD for externally supplying a power source) and a signal readout PAD 427 are formed, and a metal wiring (not shown) for electrically connecting between the bonding PAD 420 and the first electrode layer 414 described later is also formed.

On the plug 415 for each pixel inside of the insulating layer 411, a transparent first electrode layer 414 is formed. The first electrode layer 414 is divided for each pixel, and the size thereof determines the light-receiving area. To the first electrode layer 414, a bias is applied through the wiring from the bonding PAD 420. A construction where holes can be accumulated in the hole accumulation region 425 by applying a negative bias to the first electrode 414, with respect to a second electrode layer 405 which is described later, is preferred.

An intermediate layer 12 having the same structure as in FIG. 12 is formed on the first electrode layer 414, and a second electrode layer 405 is formed thereon.

On the second electrode layer 405, a protective layer 404 comprising silicon nitride or the like as the main component and having a function of protecting the intermediate layer 12 is formed. In the protective layer 404, an opening is formed at a position not overlapping with the first electrode layer 414 of the pixel part. Also, an opening is formed in a part of the insulating layer 411 and the protective layer 404 on the bonding PAD 420. A wiring 418 comprising aluminum or the like for electrically connecting between the second electrode layer 405 and the bonding PAD 420, which are exposed by those two openings, and giving a potential to the second electrode layer 405 is formed inside of the openings as well as on the protective layer 404. As for the material of the wiring 418, an aluminum-containing alloy such as Al—Si or Al—Cu alloy may also be used.

A protective layer 403 comprising silicon nitride or the like as the main component and protecting the wiring 418 is formed on the wiring 418, an infrared-cutting dielectric multilayer layer 402 is formed on the protective layer 403, and an antireflection layer 401 is formed on the infrared-cutting dielectric multilayer layer 402.

The first electrode layer 414 fulfills the same function as the first electrode layer 11 shown in FIG. 12. The second electrode layer 405 fulfills the same function as the second electrode layer 13 shown in FIG. 12.

By such a construction, three BGR color lights can be detected by one pixel to effect color imaging. In the construction of FIG. 16, R and B each is used as a common value in two pixels, and only the G value is separately used, but since the sensitivity of G is important in producing an image, a good color image can be produced even by such a construction.

The solid-state imaging device described above can be applied to an imaging device including a digital camera, a video camera, a facsimile, a scanner and a copier and can also be utilized as a light sensor such as biosensor and chemical sensor.

Examples of the material for the insulating layers described in these embodiments include $SiO_x$, $SiN_x$, BSG, PSG, BPSG, a metal oxide such as $Al_2O_3$, MgO, GeO, NiO, CaO, BaO, $Fe_2O_3$, $Y_2O_3$ and $TiO_2$, and a metal fluoride such as $MgF_2$, LiF, $AlF_3$ and $CaF_2$. Among these materials, $SiO_x$, $SiN_x$, BSG, PSG and BPSG are most preferred.

Incidentally, in the third to sixth embodiments, either a hole or an electron may be used for reading out signals from portions other than the photoelectric conversion layer. More specifically, as described above, there may take a construction where holes are accumulated in an inorganic photoelectric conversion part provided between a semiconductor substrate and a photoelectric conversion part stacked thereon or in a photodiode formed inside of the semiconductor substrate and signals according to the holes are read out by a signal readout part, or a construction where electrons are accumulated in an inorganic photoelectric conversion part or a photodiode formed inside of a semiconductor substrate and signals according to the electrons are read out by a signal readout part.

In the third to sixth embodiments, a construction shown in FIG. 13 is used as the photoelectric conversion part provided above the silicon substrate, but a construction shown in FIG. 1 and FIGS. 6 to 9 may also be used. According to the construction shown in FIG. 13, an electron and a hole can be blocked and therefore, the effect of suppressing a dark current is high. In the case where the electrode opposite the electrode on the light incident side is used as an electrode for electron extraction, there may take a construction where in FIG. 12, the connection part 9 is connected to the second electrode 13; where in FIG. 14, the connection part 27 is connected to the second electrode 13; or where in FIG. 15, the connection part 54 is connected to the second electrode 58, the connection part 53 is connected to the second electrode 62 and the connection part 52 is connected to the second electrode 66.

The solid-state imaging device described in this embodiment has a construction where a large number of pixels, one of which is shown in FIGS. 12 to 16, are disposed in an array manner in the same plane and since RGB color signals can be obtained by this one pixel, this one pixel can be regarded as a photoelectric conversion element that converts RGB lights into electric signals. Therefore, the solid-state imaging device described in this embodiment can be said to have a construction where a large number of photoelectric conversion elements shown in FIGS. 12 to 16 are disposed in an array manner in the same plane.

(Seventh Embodiment)

Figure 17:
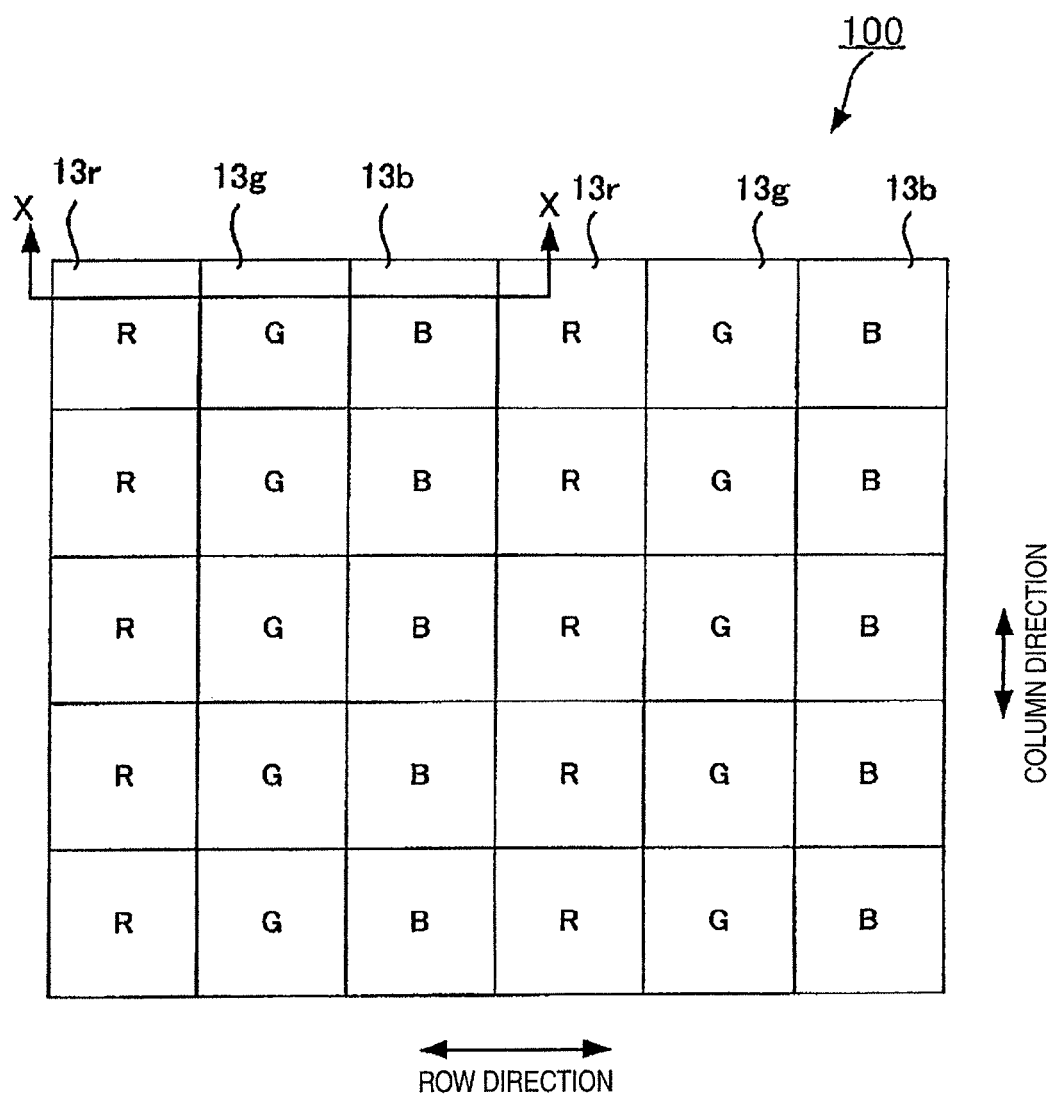
FIG. 17 is a partial schematic surface view of a solid-state imaging device for explaining an embodiment of the present invention.
Figure 18:
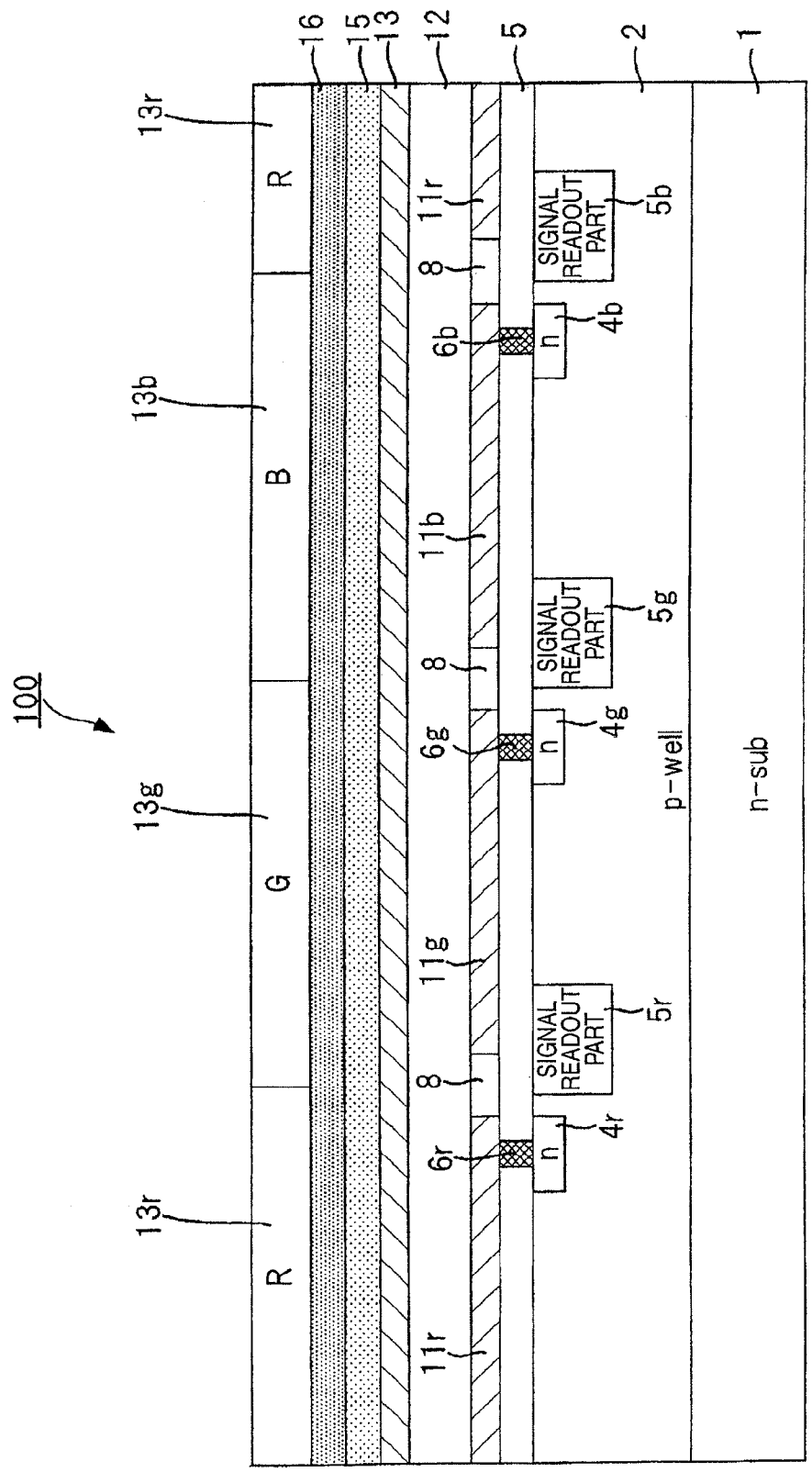
FIG. 18 is a schematic cross-sectional view cut along the A-A line of the imaging device shown in FIG. 17.

A seventh embodiment where a solid-state imaging device is realized by using a photoelectric conversion element having a construction shown in FIGS. 17 and 18 is described.

FIG. 17 is a partial surface schematic view of an imaging device for explaining the embodiment of the present invention, and FIG. 18 is a schematic cross-sectional view cut along the A-A line of the imaging device shown in FIG. 17. In FIG. 17, illustration of a microlens 14 is omitted.

A p-well layer 2 is formed on an n-type silicon substrate 1. In the following, the n-type silicon substrate 1 and the p-well layer 2 are collectively referred to as a semiconductor substrate. In the row direction and the column direction crossing with the row direction at right angles in the same plane above the semiconductor substrate, three kinds of color filters, that is, a color filter 13r mainly transmitting R light, a color filter 13g mainly transmitting G light, and a color filter 13b mainly transmitting B light, each is numerously arrayed.

As for the color filter 13r, a known material that transmits R light may be used. As for the color filter 13g, a known material that transmits G light may be used. As for the color filter 13b, a known material that transmits B light may be used.

As for the array of color filters 13r, 13g and 13b, a color filter array used in known single-plate solid-state imaging devices (e.g., Bayer array, longitudinal stripe, lateral stripe) may be employed.

A transparent electrode 11r is formed above an n region 4r, a transparent electrode 11g is formed above an n region 4g, and a transparent electrode 11b is formed above an n region 4b. The transparent electrodes 11r, 11g and 11b are divided to correspond to the color filters 13r, 13g and 13b, respectively. The transparent electrodes 11r, 11g and 11b each has the same function as the lower electrode 11 of FIG. 1.

A photoelectric conversion layer 12 in one-sheet construction shared in common among the color filters 13r, 13g and 13b is formed on the transparent electrodes 11r, 11g and 11b.

An upper electrode 13 in one-sheet construction shared in common among the color filters 13r, 13g and 13b is formed on the photoelectric conversion layer 12.

A photoelectric conversion element corresponding to the color filter 13r is formed by the transparent electrode 11r, the opposing upper electrode 13, and a part of the photoelectric conversion layer 12 sandwiched therebetween. This photoelectric conversion element is hereinafter referred to as an R photoelectric conversion element, because this element is formed on a semiconductor substrate.

A photoelectric conversion element corresponding to the color filter 13g is formed by the transparent electrode 11g, the upper electrode 13 opposing it, and a part of the photoelectric conversion layer 12 sandwiched therebetween. This photoelectric conversion element is hereinafter referred to as a G photoelectric conversion element.

A photoelectric conversion element corresponding to the color filter 13b is formed by the transparent electrode 11b, the upper electrode 13 opposing it, and a part of the photoelectric conversion layer 12 sandwiched therebetween. This photoelectric conversion element is hereinafter referred to as a B photoelectric conversion element.

In the n region inside of the p-well layer 2, a high-concentration n-type impurity region (hereinafter referred to as an "n+ region") 4r for accumulating an electric charge generated in the photoelectric conversion layer 12 of the on-substrate R photoelectric conversion element is formed. Incidentally, a light-shielding layer is preferably provided on the n+ region 4r for preventing light from entering the n+ region 4r.

In the n region inside of the p-well layer 2, an n+ region 4g for accumulating an electric charge generated in the photoelectric conversion layer 12 of the on-substrate G photoelectric conversion element is formed. Incidentally, a light-shielding layer is preferably provided on the n+ region 4g for preventing light from entering the n+ region 4g.

In the n region inside of the p-well layer 2, an n+ region 4b for accumulating an electric charge generated in the photoelectric conversion layer 12 of the on-substrate B photoelectric conversion element is formed. Incidentally, a light-shielding layer is preferably provided on the n+ region 4b for preventing light from entering the n+ region 4b.

A contact part 6r comprising a metal such as aluminum is formed on the n+ region 4r, the transparent electrode 11r is formed on the contact part 6r, and the n+ region 4r and the transparent electrode 11r are electrically connected by the contact part 6r. The contact part 6r is embedded in an insulating layer 5 transparent to visible light and infrared light.

A contact part 6g comprising a metal such as aluminum is formed on the n+ region 4g, the transparent electrode 11g is formed on the contact part 6g, and the n+ region 4g and the transparent electrode 11g are electrically connected by the contact part 6g. The contact part 6g is embedded in the insulating layer 5.

A contact part 6b comprising a metal such as aluminum is formed on the n+ region 4b, the transparent electrode 11b is formed on the contact part 6b, and the n+ region 4b and the transparent electrode 11b are electrically connected by the contact part 6b. The contact part 6b is embedded in the insulating layer 5.

Inside of the p-well layer 2, in the region other than those where the n+ regions 4r, 4g and 4b are formed, a signal readout part 5r for reading out signals according to electric charges generated in the R photoelectric conversion element and accumulated in the n+ region 4r, a signal readout part 5g for reading out signals according to electric charges generated in the G photoelectric conversion element and accumulated in the n+ region 4g, and a signal readout part Sb for reading out signals according to electric charges generated in the B photoelectric conversion element and accumulated in the n+ region 4b are formed. For each of the signal readout parts 5r, 5g and 5b, a known construction using a CCD or MOS circuit may be employed. Incidentally, a light-shielding layer is preferably provided on the signal readout parts 5r, 5g and 5b for preventing light from entering the signal readout parts 5r, 5g and 5b.

Figure 19:
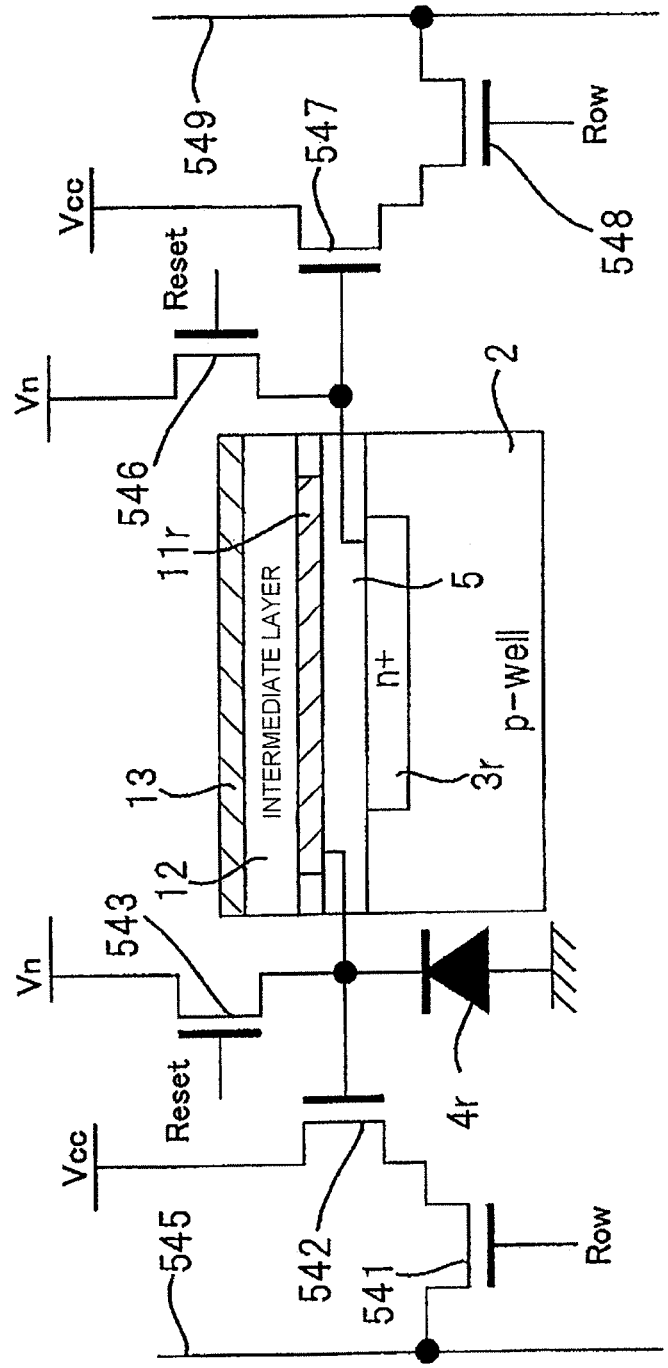
FIG. 19 is a view showing a specific construction example of the signal readout part shown in FIG. 18, wherein some of reference numerals and signs are set forth below.

FIG. 19 is a view showing a specific construction example of the signal readout part 5r shown in FIG. 18. In FIG. 19, the same constituents as those in FIGS. 17 and 18 are denoted by like numerical references. Incidentally, the signal readout parts 5r, 5g and 5b have the same construction and the description of the signal readout parts 5g and 5b is omitted.

The signal readout part 5r comprises a reset transistor 543 with a drain being connected to the n+ region 4r and a source being connected to a power source Vn, an output transistor 542 with a gate being connected to the drain of the reset transistor 543 and a source being connected to a power source Vcc, a row select transistor 541 with a source being connected to the drain of the output transistor 542 and a drain being connected to a signal output line 545, a reset transistor 546 with a drain being connected to the n region 3r and a source being connected to a power source Vn, an output transistor 547 with a gate being connected to the drain of the reset transistor 546 and a source being connected to a power source Vcc, and a row select transistor 548 with a source being connected to the drain of the output transistor 547 and a drain being connected to a signal output line 549.

When a bias voltage is applied between the transparent electrode 11r and the upper electrode 13, an electric charge is generated according to light incident into the photoelectric conversion layer 12 and the electric charge moves to the n+ region 4r through the transparent electrode 11r. Electric charges accumulated in the n+ region 4r are converted by the output transistor 542 into signals according to the electric charge amount. Here, when the row select transistor 541 is turned ON, the signals are output to the signal output line 545. After the output of signals, the electric charge inside of the n+ region 4r is reset by the reset transistor 543.

In this way, the signal readout part Sr can be constructed by a known MOS circuit comprising three transistors.

Backing to FIG. 18, protective layers 15 and 16 constituting a two-layer structure for protecting the photoelectric conversion elements on the substrate are formed on the photoelectric conversion layer 12, and color filters 13r, 13g and 13b are formed on the protective layer 16.

This imaging device 100 is produced by forming the photoelectric conversion layer 12 and then forming the color filters 13r, 13g and 13b, and the like, but the formation of color filters 13r, 13g and 13b involves a photolithography step or a baking step and in the case of using an organic material as the photoelectric conversion layer 12, when the photolithography step or baking step is performed in the state of the photoelectric conversion layer 12 being exposed, this causes deterioration in the properties of the photoelectric conversion layer 12. In the imaging device 100, the protective layers 15 and 16 are provided for preventing the properties of the photoelectric conversion layer 12 from deterioration ascribable to such a production process.

The protective layer 15 is preferably an inorganic layer comprising an inorganic material and being formed by an ALCVD method. The ALCVD method is an atomic layer CVD method and enables the formation of a dense inorganic layer, and the layer formed can work out to an effective protective layer of the photoelectric conversion layer 9. The ALCVD method is also known as an ALE method or an ALD method. The inorganic layer formed by the ALCVD method preferably comprises $Al_2O_3$, $SiO_2$, $TiO_2$, $ZrO_2$, MgO, $HfO_2$ or $Ta_2O_5$, more preferably $Al_2O_3$ or $SiO_2$, and most preferably $Al_2O_3$.

The protective layer 16 is formed on the protective layer 15 for more enhancing the performance of protecting the photoelectric conversion layer 12 and is preferably an organic layer comprising an organic polymer. The organic polymer is preferably parylene, more preferably parylene C. Incidentally, the protective layer 16 may be omitted, or the arrangement of the protective layer 15 and the protective layer 16 may be reversed. A high effect of protecting the photoelectric conversion layer 12 is obtained particularly by the construction shown in FIG. 18.

When a predetermined bias voltage is applied to the transparent electrode 11r and the upper electrode 13, the electric charge generated in the photoelectric conversion layer 12 constituting the on-substrate R photoelectric conversion element moves to the n+ region 4r through the transparent electrode 11r and the contact part 6r and is accumulated in the region. Signals according to electric charges accumulated in the n+ region 4r are read out by the signal readout part 5r and output outside of the imaging device 100.

Similarly, when a predetermined bias voltage is applied to the transparent electrode 11g and the upper electrode 13, the electric charge generated in the photoelectric conversion layer 12 constituting the on-substrate G photoelectric conversion element moves to the n+ region 4g through the transparent electrode 11g and the contact part 6g and is accumulated therein. Signals according to electric charges accumulated in the n+ region 4g are read out by the signal readout part 5g and output outside of the imaging device 100.

Also, similarly, when a predetermined bias voltage is applied to the transparent electrode 11b and the upper electrode 13, the electric charge generated in the photoelectric conversion layer 12 constituting the on-substrate B photoelectric conversion element moves to the n+ region 4b through the transparent electrode 11b and the contact part 6b and is accumulated therein. Signals according to electric charges accumulated in the n+ region 4b are read out by the signal readout part 5b and output outside of the imaging device 100.

In this way, the imaging device 100 can output, to the exterior, the signal of an R component according to the electric charge generated in the R photoelectric conversion element, the signal of a G component according to the electric charge generated in the G photoelectric conversion element, and the signal of a B component according to the electric charge generated in the B photoelectric conversion element, whereby a color image can be obtained. By this form, the photoelectric conversion part becomes thin, so that resolution can be enhanced and a false color can be reduced. Also, the opening ratio can be made large irrespective of the lower circuit and therefore, high sensitivity can be achieved. Furthermore, a microlens can be omitted and this is effective in reducing the number of components.

In this embodiment, the organic photoelectric conversion layer needs to have a maximum absorption wavelength in the green light region and an absorption region over the entire visible light, but this can be preferably realized by the materials specified above.

In the above, an embodiment using the photoelectric conversion element of the present invention as an imaging device is described, but the photoelectric conversion element of the present invention shows high photoelectric conversion efficiency and therefore, exhibits high performance also when used as a solar cell.

As for the preferred device construction in use as a solar cell, in addition to the constructions according to the present invention, a combination of the photoelectric conversion material described in the present invention with a construction described, for example, non-patent document (*Adv. Mater.*, 17, 66 (2005)) may be applied.

The present invention is described in greater detail below by referring to Examples, but the present invention is of course not limited to these Examples.

Example 1

In the configuration of FIG. 12, amorphous ITO of 30 nm was layer-formed on a CMOS substrate by sputtering, and a pixel electrode 11 was formed through patterning by photolithography such that one pixel was present on each photodiode (PD) on the CMOS substrate. Subsequently, a layer was formed by deposition of EB-3 in 100 nm by vacuum heating vapor deposition, and thereon, layer was formed by a co-deposition of Compound (1) and fullerene ($C_{60}$) in 100 nm and 300 nm, respectively, in terms of a single layer, by vacuum heating vapor deposition, to form a photoelectric conversion layer 12, and amorphous ITO was further layer-formed as an upper electrode to a thickness of 5 nm by sputtering to form a transparent electrode 13, whereby a solid-state imaging device was produced. On the upper electrode, $SiO_2$ is layer-formed as a protective layer by thermal deposition and then $Al_2O_3$ is layer-formed thereon by the ALCVD method. The vacuum vapor deposition of the photoelectric conversion layer 12 was performed at a vacuum degree of $4\times10^{-4}$ Pa or less for all layers.

Example 2

A solid-state imaging device was produced in the same manner except that in Example 1, Compound (1) of the photoelectric conversion layer 12 was changed to Compound (3).

Example 3

A solid-state imaging device was produced in the same manner except that in Example 1, Compound (1) of the photoelectric conversion layer 12 was changed to Compound (18).

Example 4

A solid-state imaging device was produced in the same manner except that in Example 1, Compound (1) of the photoelectric conversion layer 12 was changed to Compound (19).

Example 5

A solid-state imaging device was produced in the same manner except that in Example 1, Compound (1) of the photoelectric conversion layer 12 was changed to Compound (28).

Example 6

A solid-state imaging device was produced in the same manner except that in Example 1, Compound (1) of the photoelectric conversion layer 12 was changed to Compound (59).

Example 7

A solid-state imaging device was produced in the same manner except that in Example 1, Compound (1) of the photoelectric conversion layer 12 was changed to Compound (60).

Example 8

A solid-state imaging device was produced in the same manner except that in Example 1, Compound (1) of the photoelectric conversion layer 12 was changed to Compound (62).

Example 9

A solid-state imaging device was produced in the same manner except that in Example 1, Compound (1) of the photoelectric conversion layer 12 was changed to Compound (63).

Comparative Example 1

A solid-state imaging device was produced in the same manner except that in Example 1, the photoelectric conversion layer 12 was changed to a layer obtained by layer-forming Compound (1) alone to a thickness of 100 nm.

Comparative Example 2

A solid-state imaging device was produced in the same manner except that in Comparative Example 1, Compound (1) of the photoelectric conversion layer 12 was changed to Compound (3).

Comparative Example 3

A solid-state imaging device was produced in the same manner except that in Comparative Example 1, Compound (1) of the photoelectric conversion layer 12 was changed to Compound (18).

Comparative Example 4

A solid-state imaging device was produced in the same manner except that in Comparative Example 1, Compound (1) of the photoelectric conversion layer 12 was changed to Compound (19).

Comparative Example 5

A solid-state imaging device was produced in the same manner except that in Comparative Example 1, Compound (1) of the photoelectric conversion layer 12 was changed to Compound (28).

Comparative Example 6

A solid-state imaging device was produced in the same manner except that in Comparative Example 1, Compound (1) of the photoelectric conversion layer 12 was changed to Compound (59).

Comparative Example 7

A solid-state imaging device was produced in the same manner except that in Comparative Example 1, Compound (1) of the photoelectric conversion layer 12 was changed to Compound (60).

Comparative Example 8

A solid-state imaging device was produced in the same manner except that in Comparative Example 1, Compound (1) of the photoelectric conversion layer 12 was changed to Compound (62).

Comparative Example 9

A solid-state imaging device was produced in the same manner except that in Comparative Example 1, Compound (1) of the photoelectric conversion layer 12 was changed to Compound (63).

The heat resistance of each of the solid-state imaging devices was evaluated as below. That is, the solid-state imaging device were placed on a hot plate heated at 150° C. for 30 minutes and the dark current thereof was measured before and after the heating. The evaluation was performed under the criteria: "B" means that the dark current was increased as compared with that before the heating (i.e., at room temperature of 20° C.), and "A" means that the dark current was not changed as compared with that before the heating.

The external quantum efficiency at a wavelength of maximum sensitivity with a dark current of 400 pA/cm$^2$ and the relative response speed (rising time from 0 to 98% signal strength) of each of the photoelectric conversion elements produced in Examples 1 to 9 and Comparative Examples 1 to 9 are shown in Table A. Incidentally, in measuring the photoelectric conversion performance of each device, an appropriate voltage was applied.

TABLE A

|  | Compound Used for Light Absorption and Photoelectric Conversion | External Quantum Efficiency at Wavelength of Maximum Sensitivity with Dark Current of 400 pA/cm2 (relative value) | Rising Time from 0 to 98% Signal Strength (relative value) | Heat Resistance of Solid-State Imaging Device |
|---|---|---|---|---|
| Example 1 | Compound (1) and C$_{60}$ | 100 | 1 | A |
| Example 2 | Compound (3) and C$_{60}$ | 93 | 1 | A |
| Example 3 | Compound (18) and C$_{60}$ | 72 | 1 | A |
| Example 4 | Compound (19) and C$_{60}$ | 99 | 100 | A |
| Example 5 | Compound (28) and C$_{60}$ | 100 | 1 | A |
| Example 6 | Compound (59) and C$_{60}$ | 96 | 10 | A |
| Example 7 | Compound (60) and C$_{60}$ | 95 | 100 | A |
| Example 8 | Compound (62) and C$_{60}$ | 105 | 10 | A |
| Example 9 | Compound (63) and C$_{60}$ | 97 | 10 | A |
| Comparative Example 1 | Compound (1) | 27 | 1000 | B |
| Comparative Example 2 | Compound (3) | 22 | 1000 | B |
| Comparative Example 3 | Compound (18) | 3 | 1 | B |
| Comparative Example 4 | Compound (19) | 3 | 1000 | B |
| Comparative Example 5 | Compound (28) | 18 | 5000 | B |
| Comparative Example 6 | Compound (59) | 15 | 1000 | B |
| Comparative Example 7 | Compound (60) | 25 | 1000 | B |
| Comparative Example 8 | Compound (62) | 9 | 1000 | B |
| Comparative Example 9 | Compound (63) | 3 | 1000 | B |

As seen from Table A, according to an imaging device of the present invention, imaging can be performed at a high response speed and a high S/N, and the device has an advantage in heat resistance.

A photoelectric conversion element according to an exemplary embodiment of the invention can be applied as a solid-state imaging device to an imaging device such as a digital camera, a video camera, a facsimile, a scanner, and a copier. Further, it is usable as a photodetector such as a biosensor or a chemical sensor.

What is claimed is:

1. A photoelectric conversion element comprising:
an electrically conductive thin layer;
an organic photoelectric conversion layer; and
a transparent electrically conductive thin layer, in this order,
wherein:
the organic photoelectric conversion layer contains (i) a fullerene or a fullerene derivative and (ii) a compound having a nonplanar structure such that there are at least two planes in each of which a ring is formed and which do not lie in the same plane; and
the compound having a nonplanar structure is a molecule having a portion defined by two or more planar structures where the planar structures are bonded to form an SP2 orbital by making an angle except for 175° to 185°.

2. The photoelectric conversion element according to claim 1, wherein the compound having a nonplanar structure is a compound represented by formula (I):

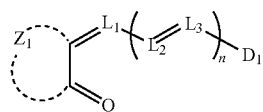

Formula (I)

wherein $Z_1$ represents an atomic group necessary for forming a 5- or 6-membered ring, $L_1$, $L_2$ and $L_3$ each independently represents an unsubstituted methine group or a substituted methine group, $D_1$ represents an atomic group which includes a ring that is not in the same plane as the 5- or 6-membered ring formed from atomic group $Z_1$, and n represents an integer of 0 or more.

3. The photoelectric conversion element according to claim 2, wherein $D_1$ in the formula (I) is represented by the following formula (II):

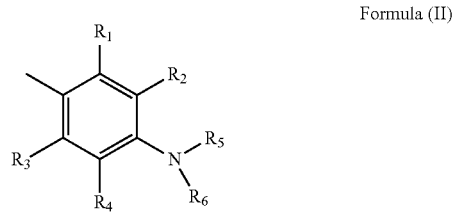

Formula (II)

wherein $R_1$ to $R_6$ each independently represents a hydrogen atom or a substituent, provided that $R_1$ and $R_2$, $R_3$ and $R_4$, $R_5$ and $R_6$, $R_2$ and $R_5$, or $R_4$ and $R_6$ may combine together to form a ring, and further provided that at least one of $R_5$ and $R_6$ is a ring-containing substituent, or $R_5$ and $R_6$ are combined with each other to form a ring.

* * * * *